United States Patent
Takahashi et al.

(10) Patent No.: US 11,799,430 B2
(45) Date of Patent: Oct. 24, 2023

(54) SEMICONDUCTOR DEVICE AND METHOD FOR OPERATING SEMICONDUCTOR DEVICE

(71) Applicant: SEMICONDUCTOR ENERGY LABORATORY CO., LTD., Atsugi (JP)

(72) Inventors: Kei Takahashi, Kanagawa (JP); Takeshi Aoki, Kanagawa (JP); Munehiro Kozuma, Kanagawa (JP); Takayuki Ikeda, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/635,268

(22) PCT Filed: Aug. 11, 2020

(86) PCT No.: PCT/IB2020/057528
§ 371 (c)(1),
(2) Date: Feb. 14, 2022

(87) PCT Pub. No.: WO2021/038349
PCT Pub. Date: Mar. 4, 2021

(65) Prior Publication Data
US 2022/0294402 A1    Sep. 15, 2022

(30) Foreign Application Priority Data

Aug. 23, 2019 (JP) .................. 2019-152676
Dec. 11, 2019 (JP) .................. 2019-223352
Jan. 17, 2020 (JP) .................. 2020-005724

(51) Int. Cl.
*H03F 3/45* (2006.01)
*H01L 27/12* (2006.01)
(Continued)

(52) U.S. Cl.
CPC ..... *H03F 3/45179* (2013.01); *H01L 27/1207* (2013.01); *H03K 5/2472* (2013.01); *H01L 27/1211* (2013.01); *H02J 7/0029* (2013.01)

(58) Field of Classification Search
CPC ............. H03F 3/45179; H03F 3/45475; H03F 2203/45362; H03F 2203/45512;
(Continued)

(56) References Cited

U.S. PATENT DOCUMENTS 6,653,890 B2    11/2003    Ono et al.
6,847,252 B1    1/2005    Ono et al.
(Continued)

FOREIGN PATENT DOCUMENTS

JP    08-125504 A    5/1996
JP    2003-142598 A    5/2003
(Continued)

OTHER PUBLICATIONS

International Search Report (Application No. PCT/IB2020/057528) dated Nov. 24, 2020.
Written Opinion (Application No. PCT/IB2020/057528) dated Nov. 24, 2020.

*Primary Examiner* — Jung Kim
(74) *Attorney, Agent, or Firm* — Fish & Richardson P.C.

(57) ABSTRACT

A novel comparison circuit, a novel amplifier circuit, a novel battery control circuit, a novel battery protection circuit, a power storage device, a semiconductor device, an electric device, and the like are provided. In a semiconductor device, one of a source and a drain of a first transistor is electrically connected to one of a source and a drain of a second transistor and one of a source and a drain of a third transistor; the other of the source and the drain of the third transistor is electrically connected to a first output terminal; and the other of the source and the drain of the second transistor is electrically connected to a second output terminal. The
(Continued)

semiconductor device has a function of outputting a comparison result of a signal supplied to a gate of the second transistor and a signal supplied to a gate of the third transistor, from the first output terminal and the second output terminal; and a function of changing the potential output from the first output terminal in accordance with the potential applied to a back gate of the first transistor.

5 Claims, 32 Drawing Sheets

(51) Int. Cl.
*H03K 5/24* (2006.01)
*H02J 7/00* (2006.01)

(58) Field of Classification Search
CPC ............ H03F 3/45188; H03F 3/45183; H01L 27/1207; H01L 27/1211; H01L 27/0688; H01L 29/78648; H01L 29/7869; H01L 29/78696; H01L 27/088; H03K 5/2472; H03K 5/08; H02J 7/0029
See application file for complete search history.

(56) References Cited

U.S. PATENT DOCUMENTS

| | | |
|---|---|---|
| 10,224,906 B2 | 3/2019 | Yamamoto |
| 10,236,875 B2 | 3/2019 | Kato et al. |
| 10,250,247 B2 | 4/2019 | Kato et al. |
| 10,693,448 B2 | 6/2020 | Kato et al. |
| 2003/0080802 A1 | 5/2003 | Ono et al. |
| 2011/0267726 A1 | 11/2011 | Ikeuchi et al. |
| 2017/0230041 A1 | 8/2017 | Kato et al. |
| 2019/0222209 A1* | 7/2019 | Kato .................. H03K 5/2481 |
| 2022/0102340 A1 | 3/2022 | Takahashi et al. |

FOREIGN PATENT DOCUMENTS

| | | |
|---|---|---|
| JP | 2006-352607 A | 12/2006 |
| JP | 2008-236737 A | 10/2008 |
| JP | 2009-071653 A | 4/2009 |
| JP | 2010-050590 A | 3/2010 |
| JP | 2017-192124 A | 10/2017 |
| KR | 2003-0038392 A | 5/2003 |
| WO | WO-2010/082239 | 7/2010 |

* cited by examiner

70

100

SEMICONDUCTOR DEVICE AND METHOD FOR OPERATING SEMICONDUCTOR DEVICE

CROSS REFERENCE TO RELATED APPLICATIONS

This application is a U.S. National Phase Application under 35 U.S.C. § 371 of International Application PCT/IB2020/057528, filed on Aug. 11, 2020, which is incorporated by reference and claims the benefit of foreign priority applications filed in Japan on Aug. 23, 2019, as Application No. 2019-152676, on Dec. 11, 2019, as Application No. 2019-223352, and on Jan. 17, 2020, as Application No. 2020-005724.

TECHNICAL FIELD

One embodiment of the present invention relates to a semiconductor device and a method for operating the semiconductor device. One embodiment of the present invention relates to a battery control circuit, a battery protection circuit, a power storage device, and an electric device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a display device, a light-emitting device, a power storage device, an imaging device, a memory device, a driving method thereof, and a manufacturing method thereof.

BACKGROUND ART

Power storage devices (also referred to as batteries or secondary batteries) have been utilized in a wide range of areas from small electric devices to automobiles. As the application range of batteries expands, the number of applications each with a multi-cell battery stack where a plurality of battery cells are connected in series increases.

The power storage device is provided with a circuit for detecting an abnormality at charging and discharging, such as overdischarging, overcharging, overcurrent, or a short circuit. In such a circuit performing protection and control of a battery, data of a voltage, a current, and the like is obtained in order to detect the abnormality at charging and discharging. Also in such a circuit, stop of charging and discharging, cell balance, and the like are controlled on the basis of the observed data.

Patent Document 1 discloses a protection IC that functions as a battery protection circuit. Patent Document 1 discloses a protection IC that detects abnormality in charging and discharging by comparing, using a plurality of comparators provided inside, a reference voltage and a voltage of a terminal to which a battery is connected.

In Patent Document 2, a comparator using a field-effect transistor is shown.

REFERENCE

Patent Document

[Patent Document 1] United States Patent Application Publication No. 2011-267726
[Patent Document 2] Japanese Published Patent Application No. 2009-71653

SUMMARY OF THE INVENTION

Problems to be Solved by the Invention

An object of one embodiment of the present invention is to provide a novel comparison circuit, a novel amplifier circuit, a novel battery control circuit, a novel battery protection circuit, a power storage device, a semiconductor device, an electric device, and the like. Another object of one embodiment of the present invention is to provide a comparison circuit, an amplifier circuit, a battery control circuit, a battery protection circuit, a power storage device, a semiconductor device, an electric device, and the like that have novel structures and can reduce the power consumption.

Note that the objects of one embodiment of the present invention are not limited to the objects listed above. The objects listed above do not preclude the existence of other objects. Note that the other objects are objects that are not described in this section and are described below. The objects that are not described in this section are derived from the description of the specification, the drawings, and the like and can be extracted as appropriate from the description by those skilled in the art. Note that one embodiment of the present invention is to solve at least one of the objects listed above and/or the other objects.

Means for Solving the Problems

One embodiment of the present invention is a method for operating a semiconductor device including a first output terminal, a second output terminal, a first transistor, a second transistor, and a third transistor; the first transistor includes a back gate; one of a source and a drain of the first transistor is electrically connected to one of a source and a drain of the second transistor and one of a source and a drain of the third transistor; the other of the source and the drain of the third transistor is electrically connected to the first output terminal; and the other of the source and the drain of the second transistor is electrically connected to the second output terminal. The semiconductor device has a function of outputting a comparison result of a signal supplied to a gate of the second transistor and a signal supplied to a gate of the third transistor, from the first output terminal and the second output terminal. The method includes a first step of applying a first potential to the back gate and a second step of applying a second potential to the back gate, and the potential output from the first output terminal in the first step is lower than the potential output from the first output terminal in the second step.

In the above structure, the first transistor preferably includes an oxide semiconductor in a channel formation region.

In the above structure, a current flowing between the source and the drain of the first transistor is preferably lower in the second step than in the first step.

In the above structure, the semiconductor device preferably includes a fourth transistor, a fifth transistor, and a capacitor; one of a source and a drain of the fourth transistor is preferably electrically connected to the first output terminal; one of a source and a drain of the fifth transistor is preferably electrically connected to a gate of the fourth transistor; and one electrode of the capacitor is preferably electrically connected to the gate of the fourth transistor, and the other electrode is electrically connected to the first output terminal. The fifth transistor is preferably in an off state in the first step and the second step.

In the above structure, a low potential signal is preferably supplied to the other of the source and the drain of the first transistor, and high potential signals are preferably supplied to the other of the source and the drain of the fourth transistor and the other of the source and the drain of the fifth transistor.

Another embodiment of the present invention is a semiconductor device including a first input terminal, a second input terminal, a first output terminal, a second output terminal, a first transistor, a second transistor, a third transistor, and a selection circuit. The first transistor includes a back gate. The selection circuit has functions of selecting one potential from two or more potentials and applying the potential to the back gate. A gate of the second transistor is electrically connected to the first input terminal. A gate of the third transistor is electrically connected to the second input terminal. The first transistor includes the back gate. One of a source and a drain of the first transistor is electrically connected to one of a source and a drain of the second transistor and one of a source and a drain of the third transistor. The other of the source and the drain of the third transistor is electrically connected to the first output terminal. The other of the source and the drain of the second transistor is electrically connected to the second output terminal. The first transistor includes an oxide semiconductor in a channel formation region. The semiconductor device has a function of outputting a comparison result of a signal supplied to the first input terminal and a signal supplied to the second input terminal, from the first output terminal and the second output terminal; and a function of lowering the potential output from the first output terminal by lowering a potential applied from the selection circuit to the back gate.

In the above structure, the semiconductor device preferably includes a fourth transistor, a fifth transistor, and a capacitor. One of a source and a drain of the fourth transistor is preferably electrically connected to the first output terminal; one of a source and a drain of the fifth transistor is preferably electrically connected to a gate of the fourth transistor. One electrode of the capacitor is preferably electrically connected to the gate of the fourth transistor, and the other electrode is preferably electrically connected to the first output terminal.

Another embodiment of the present invention is a power storage system including the semiconductor device, a memory device, and a secondary battery. A positive electrode of the secondary battery is electrically connected to the first input terminal. The memory device is electrically connected to the second input terminal. The memory device has a function of holding a signal supplied to the second input terminal. The power storage system has a function of controlling one or both of charging and discharging of the secondary battery in accordance with a comparison result of a signal supplied to the first input terminal and a signal supplied to the second input terminal.

Effect of the Invention

One embodiment of the present invention can provide a novel comparison circuit, a novel amplifier circuit, a novel battery control circuit, a novel battery protection circuit, a power storage device, a semiconductor device, an electric device, and the like. Another embodiment of the present invention can provide a comparison circuit, an amplifier circuit, a battery control circuit, a battery protection circuit, a power storage device, a semiconductor device, an electric device, and the like that have novel structures and can reduce the power consumption.

Note that the effects of one embodiment of the present invention are not limited to the effects listed above. The effects listed above do not preclude the existence of other effects. Note that the other effects are effects that are not described in this section and are described below. The effects that are not described in this section are derived from the descriptions of the specification, the drawings, and the like and can be extracted from these descriptions by those skilled in the art. Note that one embodiment of the present invention is to have at least one of the effects listed above and/or the other effects. Accordingly, depending on the case, one embodiment of the present invention does not have the effects listed above in some cases.

MODE FOR CARRYING OUT THE INVENTION

Figure 1A:
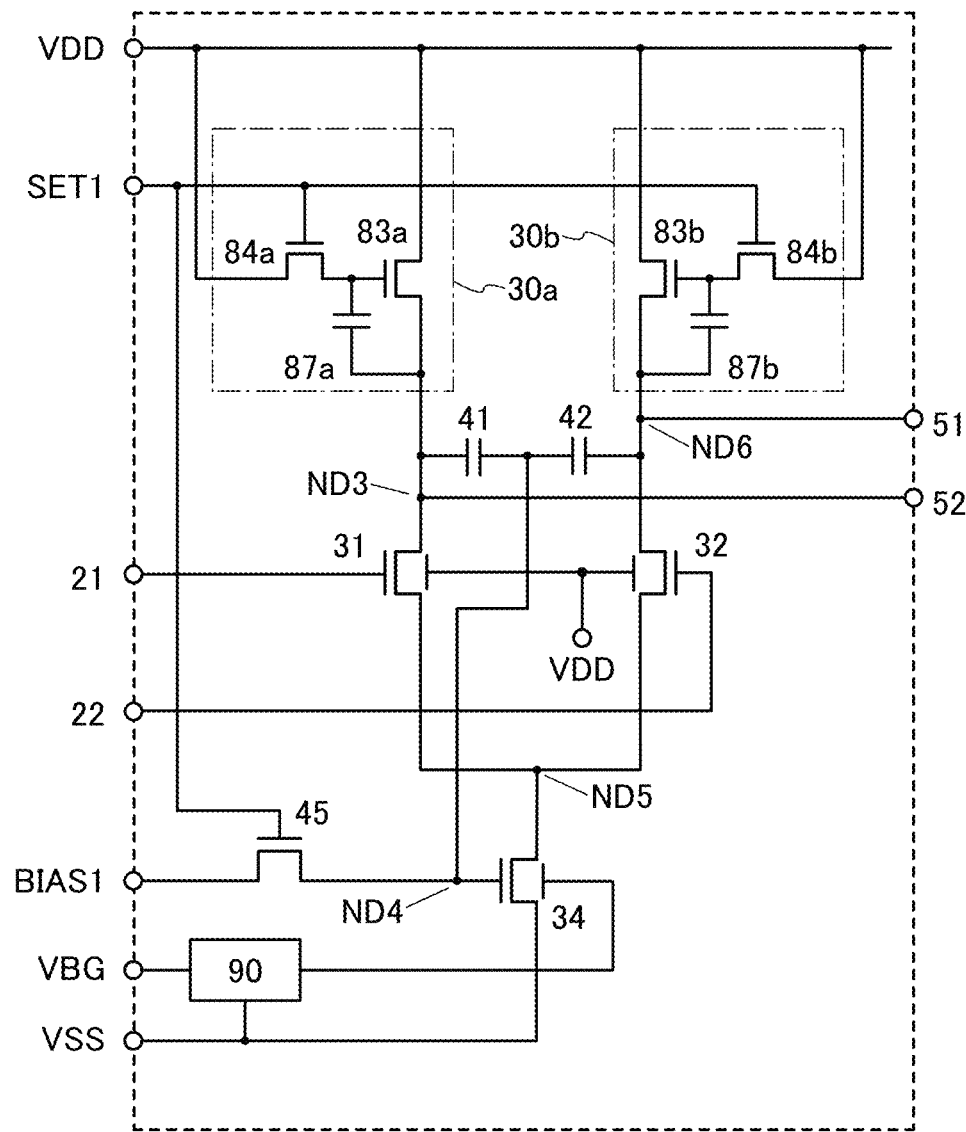
FIG. 1A and FIG. 1B show configuration examples of a circuit.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Thus, the present invention should not be construed as being limited to the following description of the embodiments.

Note that ordinal numbers such as "first", "second", and "third" in this specification and the like are used in order to avoid confusion among components. Thus, the terms do not limit the number of components. In addition, the terms do not limit the order of components. Furthermore, in this specification and the like, for example, a "first" component in one embodiment can be referred to as a "second" component in other embodiments or claims. Furthermore, in this specification and the like, for example, a "first" component in one embodiment can be omitted in other embodiments or claims.

Note that in the drawings, the same elements, elements having similar functions, elements formed of the same material, elements formed at the same time, or the like are sometimes denoted by the same reference numerals, and repeated description thereof is omitted in some cases.

In addition, the position, size, range, and the like of each component illustrated in the drawings and the like do not represent the actual position, size, range, and the like in some cases for easy understanding of the invention. Therefore, the disclosed invention is not necessarily limited to the position, size, range, or the like disclosed in drawings and the like. For example, in an actual manufacturing process, a resist mask or the like might be unintentionally reduced in size by treatment such as etching, which might not be reflected in the drawings for easy understanding.

Furthermore, in a top view (also referred to as a "plan view"), a perspective view, or the like, the description of some components might be omitted for easy understanding of the drawings.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, a "terminal" refers to a wiring or an electrode connected to a wiring in some cases, for example. Moreover, in this specification and the like, part of a "wiring" is referred to as a "terminal" in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

In addition, functions of a source and a drain are interchanged with each other depending on operation conditions and the like, for example, when a transistor of different polarity is employed or when the current direction is changed in a circuit operation; therefore, it is difficult to define which is the source or the drain. Thus, the terms "source" and "drain" can be interchangeably used in this specification.

In this specification and the like, the expression "electrically connected" includes the case where components are directly connected to each other and the case where components are connected through an "object having any electric function". There is no particular limitation on the "object having any electric function" as long as electric signals can be transmitted and received between components that are connected through the object. Thus, even when the expression "electrically connected" is used, there is a case where no physical connection portion is made and a wiring is just extended in an actual circuit.

Furthermore, in this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Moreover, "perpendicular" and "orthogonal" indicate a state where two straight lines are placed at an angle of greater than or equal to 80° and less than or equal to 100°, for example. Accordingly, the case where the angle is greater than or equal to 85° and less than or equal to 95° is also included.

In this specification and the like, the terms "identical", "same", "equal", "uniform", and the like used in describing calculation values and measurement values allow for a margin of error of ±20% unless otherwise specified.

Furthermore, in this specification, in the case where an etching treatment is performed after a resist mask is formed, the resist mask is removed after the etching treatment, unless otherwise specified.

In addition, a voltage refers to a potential difference between a certain potential and a reference potential (e.g., a ground potential or a source potential) in many cases. Therefore, the terms "voltage" and "potential" can be replaced with each other in many cases. In this specification and the like, the terms "voltage" and "potential" can be replaced with each other unless otherwise specified.

Note that even a "semiconductor" has characteristics of an "insulator" when conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" described in this specification can be replaced with each other in some cases.

Furthermore, a "semiconductor" has characteristics of a "conductor" when conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that in this specification and the like, an "on state" of a transistor refers to a state in which a source and a drain of the transistor are electrically short-circuited (also referred to as a "conduction state"). Furthermore, an "off state" of the transistor refers to a state in which the source and the drain of the transistor are electrically disconnected (also referred to as a "non-conduction state").

In addition, in this specification and the like, an "on-state current" sometimes refers to a current that flows between a source and a drain when a transistor is in an on state. Furthermore, an "off-state current" sometimes refers to a current that flows between a source and a drain when a transistor is in an off state.

In this specification and the like, a high potential signal refers to a power supply potential at a potential higher than a low potential signal. The low potential signal refers to a power supply potential at a potential lower than the high potential signal. A ground potential can be used as the high potential signal or the low potential signal. For example, in the case where a ground potential is used as the high potential signal, the low potential signal is a potential lower than the ground potential, and in the case where a ground potential is used as the low potential signal, the high potential signal is a potential higher than the ground potential. Furthermore, the high potential signal is referred to as a high power supply potential in some cases. Moreover, the low potential signal is referred to as a low power supply potential in some cases.

In addition, in this specification and the like, a gate refers to part or the whole of a gate electrode and a gate wiring. A gate wiring refers to a wiring for electrically connecting at least one gate electrode of a transistor to another electrode or another wiring.

Furthermore, in this specification and the like, a source refers to part or all of a source region, a source electrode, or a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

Moreover, in this specification and the like, a drain refers to part or all of a drain region, a drain electrode, or a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

Embodiment 1

In this embodiment, an example of a semiconductor device of one embodiment of the present invention is described. The semiconductor device of one embodiment of the present invention preferably includes amplifier circuits connected in multiple stages.

<Example 1 of Amplifier Circuit>

FIG. 1A illustrates an example of the amplifier circuit of one embodiment of the present invention.

An amplifier circuit 11 illustrated in FIG. 1A includes a transistor 31, a transistor 32, a transistor 34, a transistor 45, a capacitor 41, a capacitor 42, a circuit 30a, and a circuit 30b. The amplifier circuit 11 also includes a terminal VDD, a terminal VSS, a terminal BIAS1, a terminal VBG, a terminal SET1, a terminal 21, a terminal 22, a terminal 51, and a terminal 52. The circuit 30a and the circuit 30b has a function of a current source.

Each of the transistors included in the amplifier circuit illustrated in FIG. 1A preferably includes a back gate (second gate) in addition to a gate.

A low potential signal is preferably supplied to the terminal VSS. A ground potential can be used as the low potential signal. A high potential signal is preferably supplied to the terminal VDD.

The amplifier circuit 11 illustrated in FIG. 1A has a function of a comparison circuit. A first input signal is supplied to the terminal 21 and a second input signal is supplied to the terminal 22. The amplifier circuit 11 has a function of comparing input signals supplied to the terminal 21 and the terminal 22 and outputting a comparison result to the terminal 51 and the terminal 52.

The terminal 51 and the terminal 52 are, for example, electrically connected to a different circuit, and signals from the terminal 51 and the terminal 52 are supplied to the different circuit. In the case where a plurality of stages of the amplifier circuits 11 are connected, the terminal 51 and the terminal 52 are electrically connected to the amplifier circuit 11 in the next stage, for example. Alternatively, one of the terminal 51 and the terminal 52 may be in a floating state.

A gate of the transistor 31 is electrically connected the terminal 21. A gate of the transistor 32 is electrically connected to the terminal 22. A signal from the terminal 21 is supplied to the gate of the transistor 31 and a signal from the terminal 22 is supplied to the gate of the transistor 32.

A node ND5 is electrically connected to one of a source and a drain of the transistor 31 and one of a source and a drain of the transistor 32. The other of the source and the drain of the transistor 31 is electrically connected to a node ND3 and the terminal 52. The other of the source and the drain of the transistor 32 is electrically connected to the terminal 51 and a node ND6. One of a source and a drain of the transistor 34 is electrically connected to the terminal VSS, and the other is electrically connected to the node ND5.

One of a source and a drain of the transistor 45 is electrically connected to a gate of the transistor 34 and a node ND4, and the other is electrically connected to the terminal BIAS1. A potential is supplied from the terminal BIAS1 to the gate of the transistor 34 through the transistor 45. Note that in the case where a potential is applied through a transistor, a slight voltage drop might occur due to a resistance of the transistor.

One electrode of the capacitor 41 is electrically connected to the terminal 52 and the node ND3, and the other electrode is electrically connected to the gate of the transistor 34 and the node ND4. One electrode of the capacitor 42 is electrically connected to the terminal 51 and the node ND6, and the other electrode is electrically connected to the gate of the transistor 34 and the node ND4.

When a potential with which the transistor 45 is brought into an off state, for example, a low potential signal, is applied to the terminal SET1, the node ND4 is brought into a floating state. The capacitor 41 and the capacitor 42 have an effect of inhibiting a change of the node ND4 due to variations in characteristics of the transistor 31 and the transistor 32 to make the operating point of the amplifier circuit 11 stable.

The circuit 30a includes a transistor 83a, a transistor 84a, and a capacitor 87a. One of a source and a drain of the transistor 83a is electrically connected to the terminal VDD, and the other is electrically connected to the terminal 52 and the node ND3. One of a source and a drain of the transistor 84a is electrically connected to the terminal VDD, and the other is electrically connected to a gate of the transistor 83a. One electrode of the capacitor 87a is electrically connected to the gate of the transistor 83a, and the other is electrically connected to the terminal 52 and the node ND3.

The circuit 30b includes a transistor 83b, a transistor 84b, and a capacitor 87b. One of a source and a drain of the transistor 83b is electrically connected to the terminal VDD, and the other is electrically connected to the terminal 51 and the node ND6. One of a source and a drain of the transistor 84b is electrically connected to the terminal VDD, and the other is electrically connected to a gate of the transistor 83b. One electrode of the capacitor 87b is electrically connected to the gate of the transistor 83b, and the other is electrically connected to the terminal 51 and the node ND6.

The capacitance value of the capacitor 87a is, for example, greater than or equal to two times, or greater than or equal to five times the gate capacitance value of the transistor 83a. The capacitance value of the capacitor 87b is, for example, greater than or equal to two times, or greater than or equal to five times the gate capacitance value of the transistor 83b. Alternatively, the capacitance values of the capacitor 87a and the capacitor 87b are, for example, greater than or equal to 1 fF and less than 10 pF.

The capacitance values of the capacitor 41 and the capacitor 42 are, for example, less than or equal to 0.35 times, or less than or equal to 0.2 times that of the capacitor 87a. In the case where the capacitance values of the capacitor 41 and the capacitor 42 are too large, operating speed of the amplifier circuit 11 might be low since it takes more time to charge the capacitors when inhibiting the change of the node ND4 due to variations in characteristics of the transistor 31 and the transistor 32.

As a transistor included in the amplifier circuit of one embodiment of the present invention, either an n-channel transistor or a p-channel transistor may be used. FIG. 1A illustrates an example in which the transistors used in the amplifier circuit 11 are n-channel transistors.

In the amplifier circuit 11, instead of the circuit 30a illustrated in FIG. 1A, a configuration may be used in which a p-channel first transistor and a second transistor electrically connected to a gate of the first transistor are used, the terminal VDD is electrically connected to one of a source and a drain of the first transistor and the node ND3 is electrically connected to the other, and the terminal SET1 is electrically connected to a gate of the second transistor. Alternatively, instead of the circuit 30b, a configuration in which a p-channel third transistor and a fourth transistor electrically connected to a gate of the third transistor are used, the terminal VDD is electrically connected to one of a source and a drain of the third transistor and the node ND6 is electrically connected to the other, and the terminal SET1 is electrically connected to a gate of the fourth transistor may be used.

In the amplifier circuit of one embodiment of the present invention illustrated in FIG. 1A, the back gate potential of the transistor 34 is adjusted, whereby potentials output from the terminal 51 and the terminal 52 can be adjusted. Adjusting the back gate potential of the transistor 34 can operate the amplifier circuit in a wider potential range of a potential applied from the terminal VDD, for example. Specifically, for example, even when a potential applied to the terminal VDD is lower, a desired output value can be obtained from the output terminals of the amplifier circuit. An example of the method is described below.

The potentials of the node ND6 and the node ND3 are output from the terminal 51 and the terminal 52, respectively, of the amplifier circuit 11.

Figure 2A:
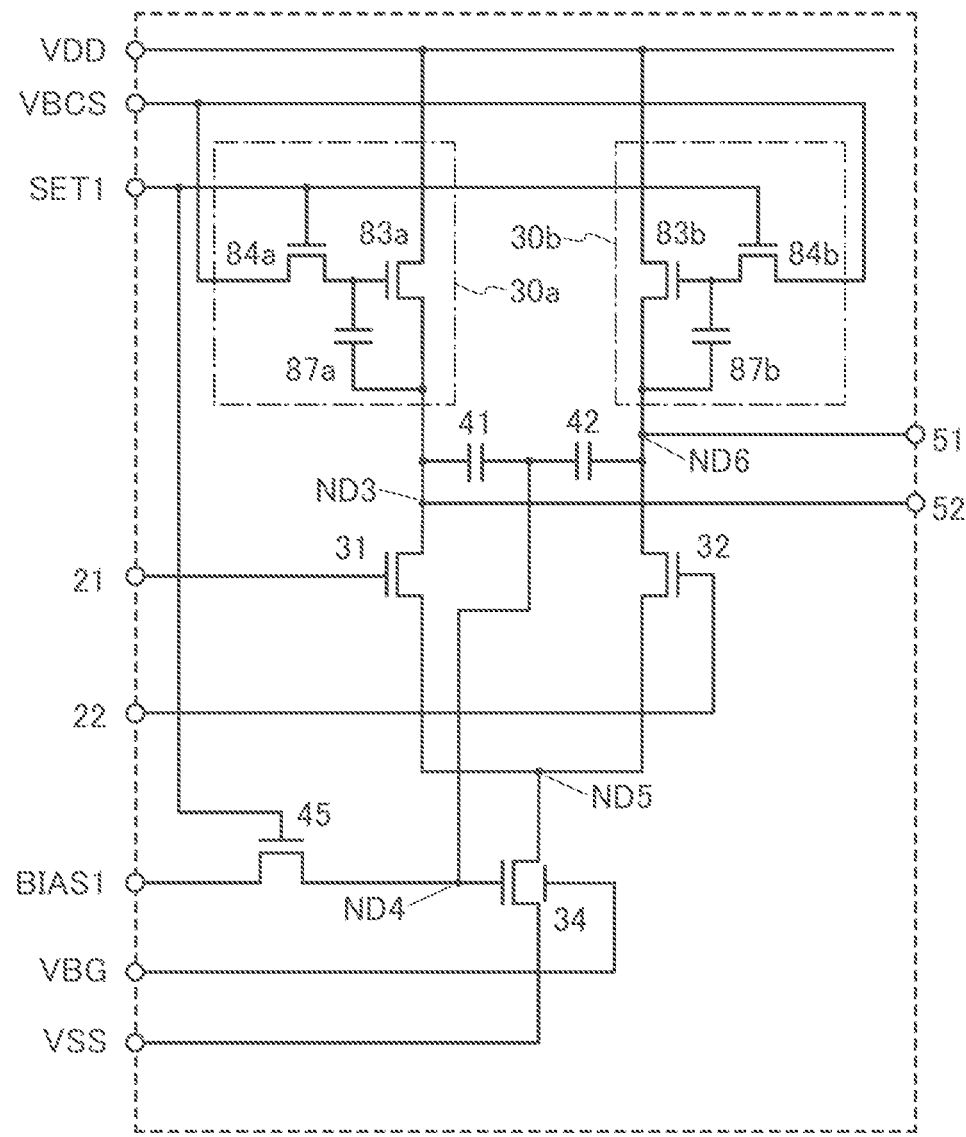
FIG. 2A is a configuration example of a circuit.

In FIG. 1A, the transistor 84a is in an on state, and the potential of the terminal VDD is applied to the gate of the transistor 83a. In order to increase the voltages of the node ND3 and the node ND6, for example, a voltage applied to the gate of the transistor 83a and a voltage applied to the gate of the transistor 83b increase. As illustrated in FIG. 2A, a terminal VBCS that is a different terminal from the terminal VDD is provided, and a potential higher than that of the terminal VDD can be applied from the terminal VBCS to the gate of the transistor 83a, for example. In FIG. 1A, the terminal VDD is electrically connected to one of the source and the drain of the transistor 84a and one of the source and the drain of the transistor 84b, whereas the terminal VBCS is electrically connected to them in FIG. 2A.

However, in FIG. 2A, the number of terminals of the amplifier circuit 11 increases since the terminal VBCS is provided in addition to the terminal VDD. In addition to a power source that generates a potential applied to the terminal VDD, a power source that generates a potential applied to the terminal VBCS might be further needed.

In the amplifier circuit of one embodiment of the present invention, the amplifier circuit 11 can be operated without increasing the number of terminals. In the amplifier circuit 11 illustrated in FIG. 1A, the transistor 34 includes a back gate. Controlling a potential applied to the back gate of the transistor 34 can operate the amplifier circuit in a wider potential range of a potential of the terminal VDD without increasing the number of terminals, power sources, or the like.

When a potential is applied to a back gate of a transistor, the threshold value of the transistor can be changed, for example. By controlling the threshold value of the transistor 34, potentials output from the terminal 51 and the terminal 52 can be changed as described later in detail in a description of the operation with reference to FIG. 2B and the like.

A back gate (second gate) of a transistor is preferably positioned on a side opposite to a gate (first gate) of the transistor with a semiconductor layer therebetween. In addition, in the transistor, for example, the (first) gate, a gate insulating film, a semiconductor layer, a second gate insulating film, and the back gate are stacked in this order from the top or from the bottom.

A potential different from that for the first gate can be applied to the back gate of the transistor 34. Alternatively, the back gate and the (first) gate of the transistor 34 may be made to have electrical continuity.

As the transistor 34, a transistor including an oxide semiconductor in its channel formation region (hereinafter, an OS transistor) can be used.

An OS transistor can be formed using a thin film, and thus can be stacked over a thin film provided over a substrate, or over a silicon transistor provided on a silicon substrate. The OS transistor having a structure including a backgate can be easily formed. For example, by a thin film forming method described in a later embodiment, a transistor including a back gate can be formed in the following manner: a back gate is formed using a conductor, a gate insulating film is formed over the back gate, and then an oxide semiconductor is formed over the gate insulating film.

In the silicon transistor provided on a silicon substrate, characteristics of the transistor can be controlled by changing the substrate potential. By contrast, in the case of controlling the characteristics of an OS transistor by applying a potential to a back gate of the transistor, the characteristics can be changed more significantly with a lower amount of change, which is preferable.

In the amplifier circuit 11 illustrated in FIG. 1A, a selection circuit 90 is electrically connected to the back gate of the transistor 34. The selection circuit 90 has a function of selecting and outputting one signal from two or more signals.

In FIG. 1A, the selection circuit 90 is electrically connected to the terminal VBG and the terminal VSS. The selection circuit 90 has a function of selecting one of a signal supplied from the terminal VBG and a signal supplied from the terminal VSS, and supplying the selected signal to the back gate of the transistor 34. For example, based on a signal received from a control circuit or the like, the selection circuit 90 determines which one of the terminal VBG and the terminal VSS is to be selected and outputs the selected signal from the selection circuit 90. The control circuit is provided outside the amplifier circuit 11, for example.

By setting the potential of the terminal VBG equals to that of the terminal VDD, an input terminal may be shared to reduce the number of terminals in the amplifier circuit 11.

As the transistors included in the amplifier circuit 11 other than the transistor 34, OS transistors may be used or Si transistors may be used.

It is preferable to use OS transistors as the transistor 45, the transistor 84a, and the transistor 84b.

After the application of the potential to the gate of the transistor 34, the applied potential can be held by bring the transistor 45 into an off state. The supply of a signal from the terminal BIAS1 to the gate of the transistor 34 can be stopped, and the power consumption can be reduced. At this time, using an OS transistor having a feature of an extremely low off-state current as the transistor 45 can hold the applied potential for a long time, preferably 1 minute or longer, further preferably 1 hour or longer, still further preferably 10 hours or longer. Similarly, using an OS transistor as each of the transistor 84a and the transistor 84b can hold the potentials applied to the gate of the transistor 83a and the gate of the transistor 83b for a long time.

The transistors included in the amplifier circuit 11 may each have a back gate. For example, the transistor 45, the transistor 84a, the transistor 84b, the transistor 83a, and the transistor 83b may each be provided with a back gate. To the back gate of each transistor, for example, a constant potential signal, a fluctuating potential signal, or the like are supplied. Alternatively, the back gate of each transistor may be electrically connected to one of the source and the drain thereof.

The transistor 31 and the transistor 32 preferably include back gates. The transistor 31 and the transistor 32 may each be an OS transistor including a back gate.

In the amplifier circuit 11 illustrated in FIG. 1A, the back gate of the transistor 31 and the back gate of the transistor 32 are electrically connected to the terminal VDD. For example, supply of potentials higher than those from the sources of the transistor 31 and the transistor 32 to the back gates thereof can shift the threshold values of the transistor 31 and the transistor 32 in the negative direction. The shift of the threshold values of the transistors in the negative direction enables detection of a lower-level input signal. The lower-level input signal refers to, for example, a signal with low intensity.

Figure 1B:
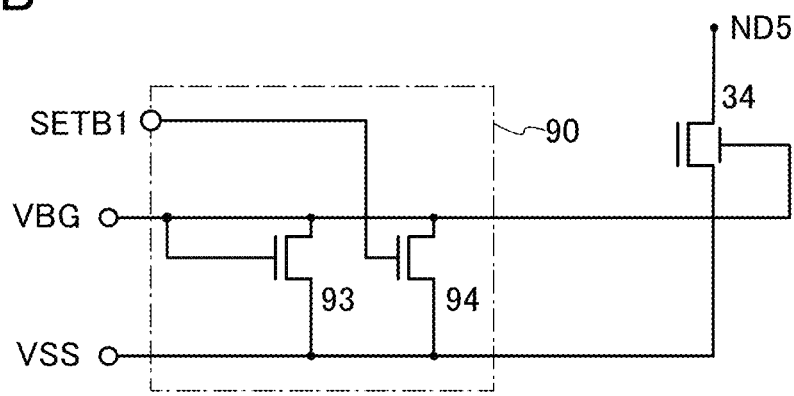

FIG. 1B illustrates a specific example of the selection circuit 90 and a connection example of the selection circuit 90 and the transistor 34.

The selection circuit 90 illustrated in FIG. 1B includes a transistor 93, a transistor 94, and a terminal SETB1. A gate and one of a source and a drain of the transistor 93 are electrically connected to the terminal VBG. The other of the source and the drain of the transistor 93 is electrically connected to the terminal VSS. One of a source and a drain of the transistor 94 is electrically connected to the terminal VBG and the back gate of the transistor 34. The other of the source and the drain of the transistor 94 is electrically connected to the terminal VSS. A gate of the transistor 94 is electrically connected to the terminal SETB1.

When a potential with which the transistor 94 is brought into an on state, e.g., a high potential signal here, is applied from the terminal SETB1 to the gate of the transistor 94, the transistor 94 is brought into a conduction state and the potential of the terminal VSS is applied to the back gate of the transistor 34.

When a potential with which the transistor 94 is brought into an off state, e.g., a low potential signal here, is applied from the terminal SETB1 to the gate of the transistor 94, a potential is applied from the terminal VBG to the back gate of the transistor 34.

That is, the selection circuit 90 illustrated in FIG. 1B has a function of selecting and outputting the potential of the terminal VSS or the potential of the terminal VBG by changing the potential applied to the terminal SETB1.

<Operation Example 1 of Amplifier Circuit>

Next, an operation example of the amplifier circuit 11 is described with reference to a timing chart shown in FIG. 2B.

At Time t0, a potential with which the transistor 84a, the transistor 84b, and the transistor 45 are brought into an on state, e.g., a high potential signal here, is applied to the terminal SET1. The transistor 84a is brought into an on state, so that the potential of the terminal VDD is applied to the gate of the transistor 83a; the transistor 84b is brought into an on state, so that the potential of the terminal VDD is applied to the gate of the transistor 83b; and the transistor 45 is brought into an on state, so that the potential of the terminal BIAS1 is applied to the gate of the transistor 34.

At Time t0, a potential with which the transistor 94 is brought into an off state, e.g., a low potential signal here, is applied to the terminal SETB1. The potential of the terminal VBG is output from the selection circuit 90 and applied to the back gate of the transistor 34. Here, the potential of the terminal VBG is higher than the potential of the terminal VSS, for example.

At Time t1, a potential with which the transistor 84*a*, the transistor 84*b*, and the transistor 45 are brought into an off state, e.g., a low potential signal here, is applied to the terminal SET1. The gate of the transistor 83*a* and the gate of the transistor 83*b* hold the applied potential and are brought into a state of floating from the terminal VDD. In addition, the gate of the transistor 34 holds the applied potential and is brought into a state of floating from the terminal BIAS1.

At Time t2, a potential with which the transistor 94 is brought into an on state, e.g., a high potential signal here, is applied to the terminal SETB1. The potential of the terminal VSS is output from the selection circuit 90 and applied to the back gate of the transistor 34. The potential applied to the back gate decreases, and the threshold value of the transistor 34 is shifted in the positive direction. Since the transistor 34 is an n-channel transistor, a current flowing between the source and the drain of the transistor 34 decreases in response to the shift of the threshold value, and the potentials of the node ND3 and the node ND6 increase.

Since the gate of the transistor 83*a* is in a state of floating from the terminal VDD, the potential of the gate of the transistor 83*a* also increases due to capacitive coupling with the capacitor 87*a* in response to the increase in the potential of the node ND3. Since the gate potential increases while a current flowing through the transistor 83*a* is constant, a potential difference between the source and the drain further decreases and the potential of the node ND3 further increases.

Similarly, the potential of the node ND6 further increases.

<Example 2 of Amplifier Circuit>

Figure 3:
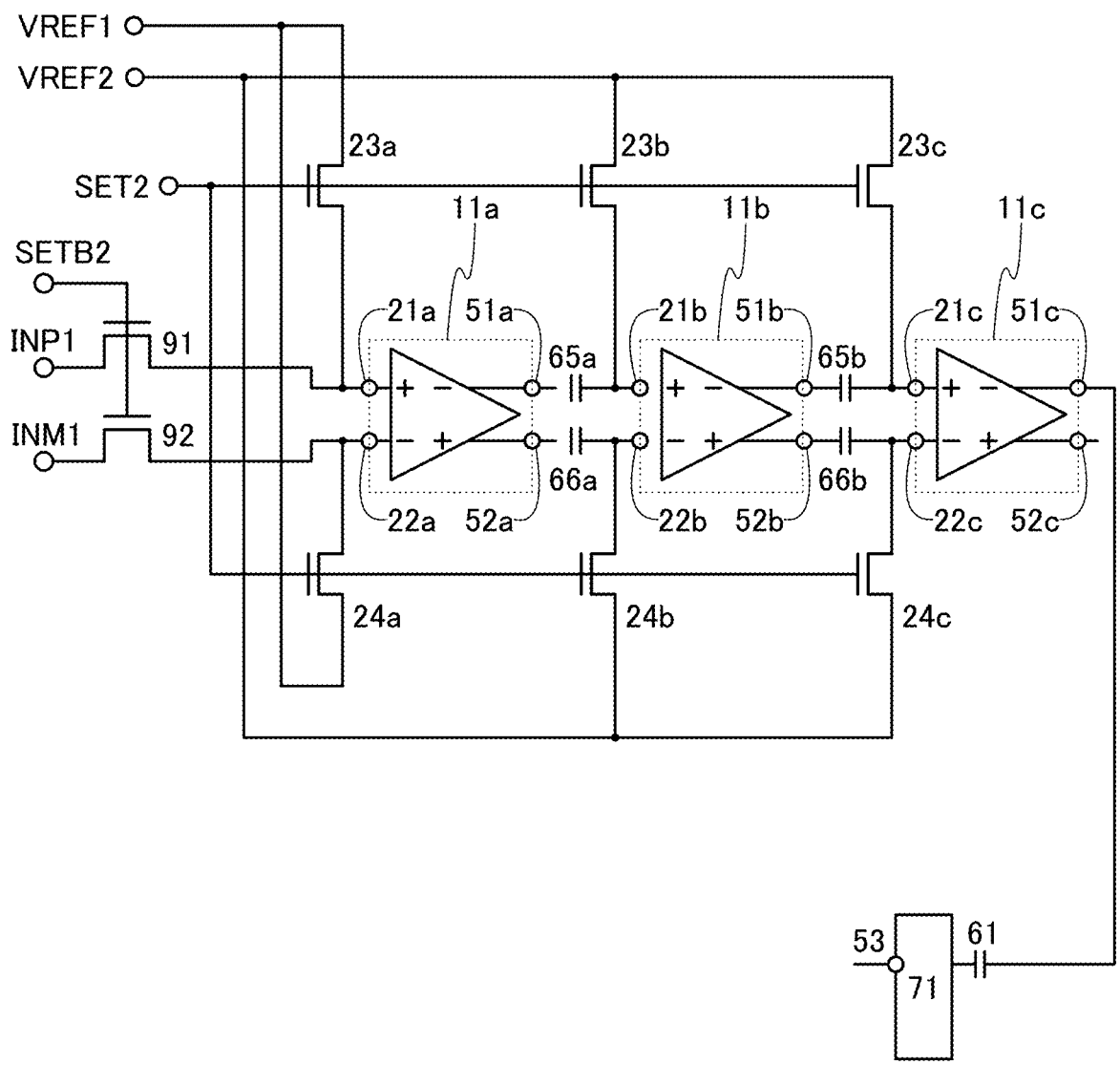
FIG. 3 is a configuration example of a circuit.

FIG. 3 illustrates an amplifier circuit 80 that is an amplifier circuit of one embodiment of the present invention. In the amplifier circuit 80 illustrated in FIG. 3, a plurality of stages of the amplifier circuits 11 are connected. Although FIG. 3 illustrates an example in which 3 stages of the amplifier circuits 11 are connected, greater than or equal to 5 stages and less than or equal to 20 stages, or greater than or equal to 7 stages and less than or equal to 14 stages of the amplifier circuits 11 may be connected, for example.

The amplifier circuit 80 illustrated in FIG. 3 includes 3 stages of the amplifier circuits 11, capacitors 65*a*, 65*b*, 66*a*, and 66*b*, a transistor 91, a transistor 92, a capacitor 61, an amplifier circuit 71, a transistor 23*a*, a transistor 23*b*, a transistor 23*c*, a transistor 24*a*, a transistor 24*b*, a transistor 24*c*, a terminal SET2, a terminal SETB2, a terminal INP1, a terminal INM1, a terminal VREF1, and a terminal VREF2. Here, among the 3 stages of the amplifier circuits 11, the amplifier circuit 11 in the first stage is referred to as the amplifier circuit 11*a*, the amplifier circuit 11 in the second stage is referred to as the amplifier circuit 11*b*, and the amplifier circuit 11 in the last stage is referred to as the amplifier circuit 11*c*. The terminal 21, the terminal 22, the terminal 51, and the terminal 52 that are included in the amplifier circuit 11*a*, are referred to as a terminal 21*a*, a terminal 22*a*, a terminal 51*a*, and a terminal 52*a*, respectively. The terminal 21, the terminal 22, the terminal 51, and the terminal 52 that are included in the amplifier circuit 11*b*, are referred to as a terminal 21*b*, a terminal 22*b*, a terminal 51*b*, a terminal 52*b*, respectively. The terminal 21, the terminal 22, the terminal 51, and the terminal 52 that are included in the amplifier circuit 11*c*, are referred to as a terminal 21*c*, a terminal 22*c*, a terminal 51*c*, and a terminal 52*c*, respectively.

The terminal 51*a* and the terminal 52*a* are electrically connected to one electrode of the capacitor 65*a* and one electrode of the capacitor 66*a*, respectively. The other electrode of the capacitor 65*a* and the other electrode of the capacitor 66*a* are electrically connected to the terminal 21*b* and the terminal 22*b*, respectively.

The terminal 51*b* and the terminal 52*b* are electrically connected to one electrode of the capacitor 65*b* and one electrode of the capacitor 66*b*, respectively. The other electrode of the capacitor 65*b* and the other electrode of the capacitor 66*b* are electrically connected to the terminal 21*c* and the terminal 22*c*, respectively.

One of a source and a drain of the transistor 91 is electrically connected to the terminal 21*a*, and one of a source and a drain of the transistor 92 is electrically connected to the terminal 22*a*. The other of the source and the drain of the transistor 91 and the other of the source and the drain of the transistor 92 are electrically connected to the terminal INP1 and the terminal INM1, respectively. A gate of the transistor 91 and a gate of the transistor 92 are electrically connected to the terminal SETB2.

One electrode of the capacitor 61 is electrically connected to the terminal 51*c* and the terminal 52*c* is in a floating state. The other electrode of the capacitor 61 is electrically connected to the amplifier circuit 71. The capacitor 61 and the amplifier circuit 71 are described later.

One of a source and a drain of the transistor 23*a* is electrically connected to the terminal 21*a* and the other is electrically connected to the terminal VREF1. One of a source and a drain of the transistor 23*b* is electrically connected to the terminal 21*b* and the other is electrically connected to the terminal VREF2. One of a source and a drain of the transistor 23*c* is electrically connected to the terminal 21*c* and the other is electrically connected to the terminal VREF2.

One of a source and a drain of the transistor 24*a* is electrically connected to the terminal 22*a* and the other is electrically connected to the terminal VREF1. One of a source and a drain of the transistor 24*b* is electrically connected to the terminal 22*b* and the other is electrically connected to the terminal VREF2. One of a source and a drain of the transistor 24*c* is electrically connected to the terminal 22*c* and the other is electrically connected to the terminal VREF2.

Gates of the transistors 23*a*, 23*b*, 23*c*, 24*a*, 24*b*, and 24*c* are electrically connected to the terminal SET2.

Next, the amplifier circuit 11*c*, the capacitor 61, and the amplifier circuit 71 are described with reference to FIG. 4.

The terminal 51*c* is electrically connected to the one electrode of the capacitor 61. A node ND1 is electrically connected to the terminal 51 and the one electrode of the capacitor 61.

A terminal IN2, a terminal 53, the terminal SET1, the terminal VDD, the terminal VSS, and the terminal BIAS1 are electrically connected to the amplifier circuit 71. The terminal IN2 is electrically connected to the other electrode of the capacitor.

Figure 4A:
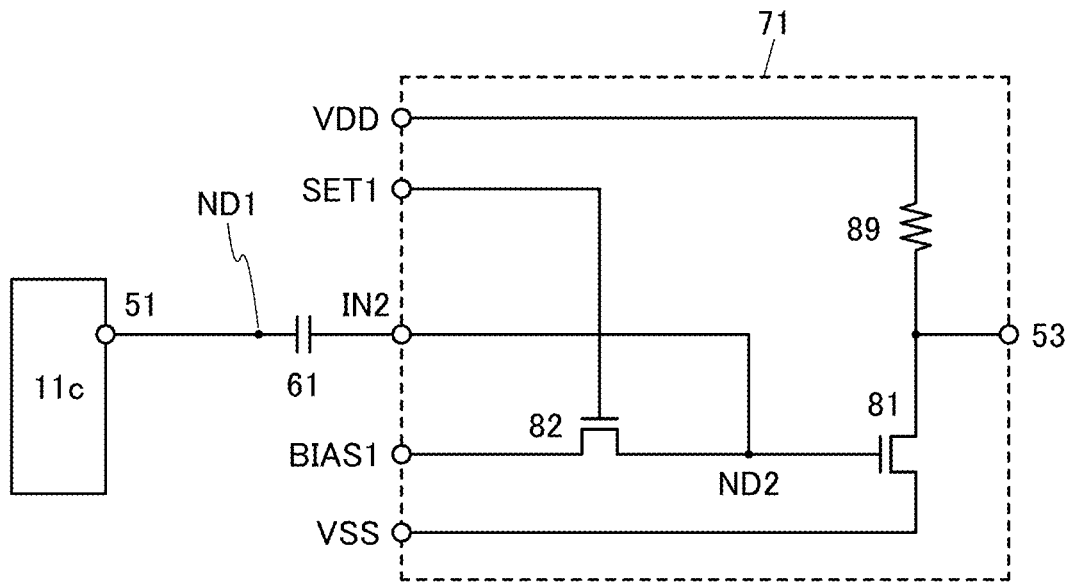
FIG. 4A to FIG. 4C are configuration examples of a circuit.

The amplifier circuit 71 illustrated in FIG. 4A includes a transistor 81, a transistor 82, and a resistor 89. One of a source and a drain of the transistor 81 is electrically connected to the terminal VSS, and the other is electrically connected to the terminal 53 and one electrode of the resistor

89. The other of the resistor 89 is electrically connected to the terminal VDD. One of a source and a drain of the transistor 82 is electrically connected to a gate of the transistor 81 and the terminal IN2, and the other is electrically connected to the terminal BIAS1. The terminal SET1 is electrically connected to a gate of the transistor 82.

A potential that is obtained by resistance division of a voltage between the terminal VDD and the terminal VSS performed in accordance with the resistance values of the resistor 89 and the transistor 81 is output from the terminal 53.

A node ND2 is electrically connected to the terminal IN2, the gate of the transistor 81, and the one of the source and the drain of the transistor 82. When a signal with which the transistor 82 is brought into an on state is supplied from the terminal SET1 to the gate of the transistor 82, a signal from the terminal BIAS1 is supplied to the node ND2 through the transistor 82.

Applying a favorable potential to the node ND2 connected to the gate of the transistor 81 can set an operating point (also referred to as a center point of operation in some cases) of the amplifier circuit 71 to a favorable potential, leading to a further increase in gain of the amplifier circuit 71. Furthermore, the output range of the amplifier circuit 71 can be further expanded.

When an OS transistor is used as the transistor 82, its off-state current can be extremely low. Bringing the transistor 82 into an off state enables the node ND2 that has been supplied with a favorable potential to be brought into a floating state. That is, after the application of the potential to the node ND2, the transistor 82 is brought into an off state so that the applied potential is held; accordingly, the potential can be programed to the node ND2.

With the node ND2 in a floating state, the potential of the node ND2 is held even when the supply of a signal from the terminal BIAS1 is stopped. At this time, for example, an operating point that is favorable for the amplifier circuit 71 is held in the node ND2. Since the supply of a signal to the terminal BIAS1 can be stopped after the operating point is held in the node ND2, the power consumption of the amplifier circuit 71 can be reduced.

Since the node ND2 is in a floating state, due to capacitive coupling with the capacitor 61, the potential of the node ND2 is changed by the amount corresponding to a change in the potential of the node ND1 with the held favorable operating point as a center. Thus, the amplifier circuit 71 can be operated at the favorable operating point.

In the semiconductor device of one embodiment of the present invention, a potential that is adjusted in accordance with the characteristics of the amplifier circuit 71 can be applied from the terminal BIAS1 and can be programed to the node ND2. In the case where a favorable operating point is changed depending on the characteristics of a transistor of the amplifier circuit 71, for example, the potential to be programed can be adjusted to a favorable operating point in accordance with the characteristics of the transistor.

Here, a case where the amplifier circuit 71 does not include the capacitor 61 and the transistor 82 is considered. In such a case, for example, a signal from the terminal 51 is supplied to the gate of the transistor 81, and the operating point of the amplifier circuit 71 becomes an output potential from the terminal 51 in a state where the amplifier circuit 11 is initialized. By contrast, since the amplifier circuit of one embodiment of the present invention includes the capacitor 61 and the transistor 82, the operating point of the amplifier circuit 71 can be set to a desired value.

The capacitance values of the capacitors 61, 65*a*, 65*b*, 66*a*, and 66*b* are greater than or equal to two times, or greater than or equal to five times that of the gate of the transistor 81, for example. Moreover, the capacitance values of the capacitors 61, 65*a*, 65*b*, 66*a*, and 66*b* are greater than or equal to 1 fF and less than 10 pF, for example.

Figure 4B:
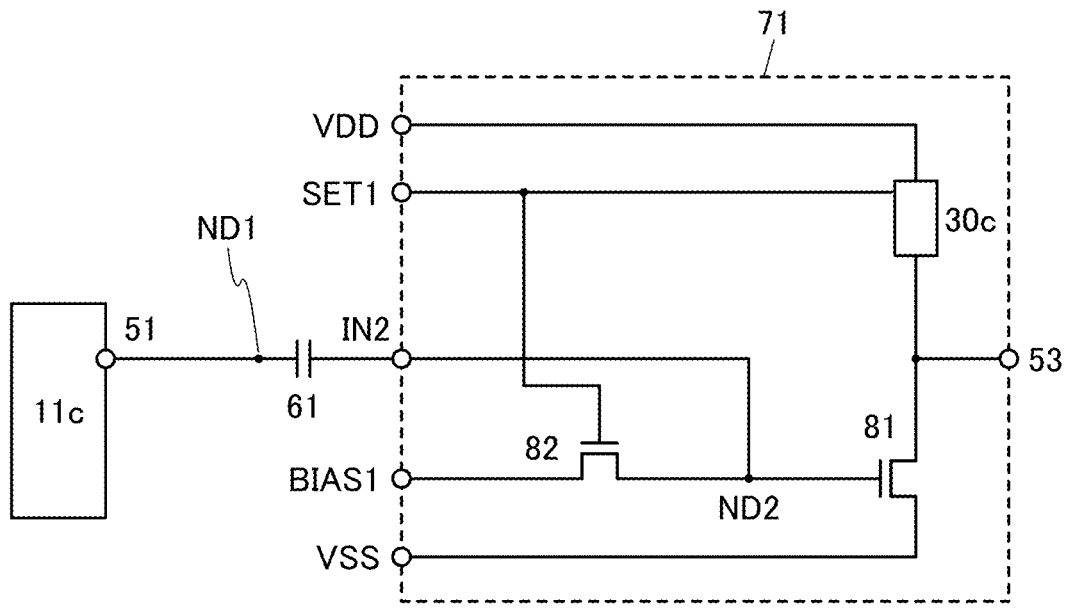

The amplifier circuit 71 illustrated in FIG. 4B is different from that illustrated in FIG. 4A in including the circuit 30*c* instead of the resistor 89. The circuit 30*c* has a function of a current source.

Figure 4C:
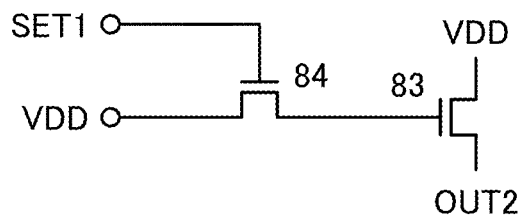

An example of the circuit 30*c* is described with reference to FIG. 4C. The circuit 30*c* includes a transistor 83 and a transistor 84. In the circuit 30*c*, one of a source and a drain of the transistor 83 is electrically connected to the terminal VDD and the other is electrically connected to the terminal 53. One of a source and a drain of the transistor 84 is electrically connected to the gate of the transistor 83 and the other is electrically connected to the terminal VDD. A gate of the transistor 84 is electrically connected to the terminal SET1.

The transistors included in the amplifier circuit 71 illustrated in FIG. 4A and FIG. 4B may, but do not necessarily, have back gates.

The transistors included in the amplifier circuit 71 may each include a back gate. When potentials are applied to the back gates of the transistors, the threshold voltages of the transistors can be controlled.

In the case where the transistor 82 includes a back gate, the back gate can be electrically connected to the terminal VBG. In the case where the transistor 81 includes a back gate, the back gate can be electrically connected to the terminal VSS.

<Operation Example 2 of Amplifier Circuit>

An operation example of the amplifier circuit 71 illustrated in FIG. 4B is described with reference to FIG. 2B.

At Time t0, a signal is supplied from the terminal SET1 to the gate of the transistor 82, so that the transistor 82 is brought into an on state. Accordingly, a signal is supplied from the terminal BIAS1 to the node ND2 through the transistor 82, whereby the potential of the node ND2 becomes the potential V2. A signal is output from the terminal 51, and the potential of the node ND1 becomes the potential V1.

At Time t1, a signal is supplied from the terminal SET1 to the gate of the transistor 82, so that the transistor 82 is brought into an off state. In the case where an OS transistor is used as the transistor 82, its off-state current is extremely low, and thus the node ND2 is brought into a floating state. At Time t2, the node ND2 is kept in a floating state.

In the case where the potential of the node ND1 is constant, the potential of the node ND2 is also kept substantially constant.

In the case where the potential of the node ND1 changes, due to the capacitive coupling with the capacitor 61, the potential of the node ND2 is changed by the amount corresponding to the change in the potential of the node ND1.

The amplifier circuit 71 can be operated with the potential V2 as the operating point. To set the potential V2 to a favorable value, a favorable signal is supplied from the terminal BIAS1. The potential V2 is adjusted so that the operation region of the transistor 81 becomes favorable, for example. The transistor 81 is operated in a saturation region, for example.

Alternatively, the potential V2 is preferably intermediate between a potential applied to the terminal VDD and a potential applied to the terminal VSS.

Setting the potential V2 to a favorable value enables a further increase in the gain of the amplifier circuit 71. Furthermore, the output range of the amplifier circuit 71 can be further expanded.

<Operation Example 3 of Amplifier Circuit>

Figure 5:
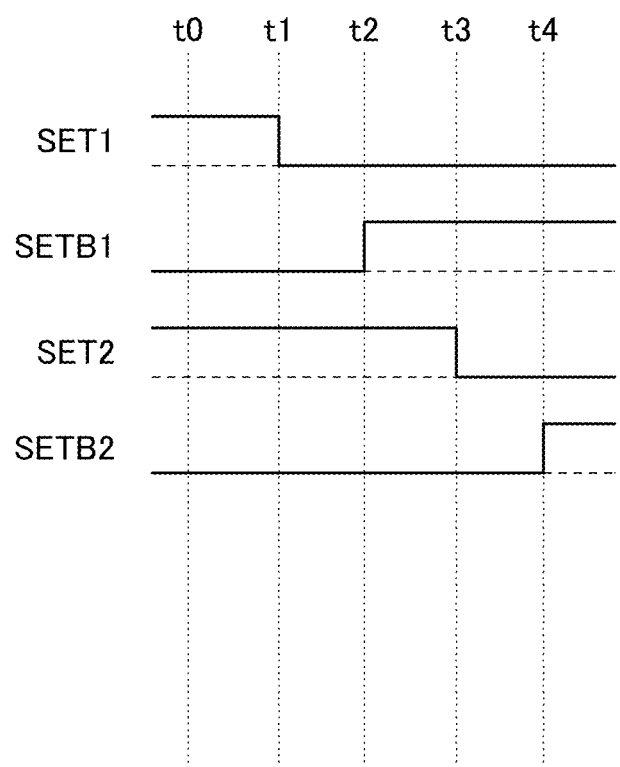
FIG. 5 is a timing chart showing an operation of the circuit.

An operation example of the amplifier circuit 80 illustrated in FIG. 3 is described with reference to a timing chart shown in FIG. 5.

At Time t0, a high potential signal is supplied to the terminal SET2, so that the transistors 23a, 23b, and 23c are brought into an on state. The potential of the terminal VREF1 is applied to the terminal 21a and the terminal 22a as a potential for initialization. The potential of the terminal VREF2 is applied to the terminal 21 and the terminal 22 of each of the amplifier circuits 11b and 11c as a potential for initialization. As the potential for initialization in an amplifier circuit including the input terminals (the terminal 21 and the terminal 22) that are electrically connected to the terminal VREF1 or the terminal VREF2, an approximate value, for example, an intermediate value or the neighborhood thereof in the input potential may be applied, for example. Alternatively, for example, a reference signal such as a ground potential or a low potential signal may be supplied.

Figure 2B:
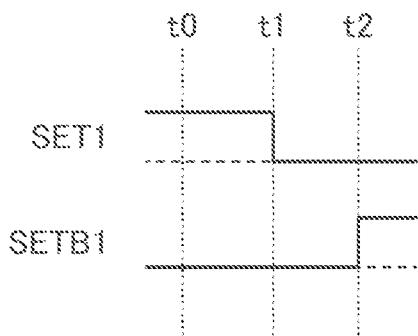
FIG. 2B is a timing chart showing an operation of the circuit.

At Time t0, a high potential signal is supplied to the terminal SET1, and as described in the description of FIG. 2B, desired potentials are applied to the gates of the transistors 83a, 83b, and 34 and the back gate of the transistor 34 in each of the amplifier circuits 11a, 11b, and 11c. In addition, in the amplifier circuit 71, a high potential signal is supplied from the terminal SET1 to the gate of the transistor 82, so that the transistor 82 is brought into an on state, and the potential of the terminal BIAS1 is applied to the gate of the transistor 81. Furthermore, a high potential signal is supplied from the terminal SET1 to the gate of the transistor 84, so that the transistor 84 is brought into an on state, and the potential of the terminal VDD is applied to the gate of the transistor 83.

At Time t1, a low potential signal is supplied to the terminal SET1, and as described in the description of FIG. 2B, the desired potentials applied to the gates of the transistors 83a, 83b, and 34 and the back gate of the transistor 34 are held in each of the amplifier circuits 11a, 11b, and 11c. In addition, in the amplifier circuit 71, the desired potentials applied to the gate of the transistor 81 and the gate of the transistor 83 are held.

At Time t2, a high potential signal is supplied to the terminal SETB1, and as described in the description of FIG. 2B, a potential applied to the back gate of the transistor 34 decreases in each of the amplifier circuits 11a, 11b, and 11c, and the potentials of the node ND3 and the node ND6 increase.

At Time t3, a low potential signal is supplied to the terminal SET2, so that the transistors 23a, 23b, 23c, 24a, 24b, and 24c are brought into an off state. The potentials applied to the terminal 21 and the terminal 22 are held in the amplifier circuit 11a, and the amplifier circuit 11a is brought into a state of floating from the terminal VREF1. The potentials applied to the terminal 21 and the terminal 22 are held in the amplifier circuits 11b and 11c, and the amplifier circuits 11b and 11c are brought into a state of floating from the terminal VREF2. In the terminal 21 and the terminal 22 of the amplifier circuits 11a, 11b, and 11c, initialized potentials are held.

At Time t4, a high potential signal is supplied to the terminal SETB2, so that the transistor 91 and the transistor 92 are brought into an on state, a signal is supplied from the terminal INP1 to the terminal 21 of the amplifier circuit 11a, and a signal is supplied from the terminal INM1 to the terminal 22. The potential of the terminal 51 and the potential of the terminal 52 of the amplifier circuit 11a change in accordance with the signals supplied to the terminal 21 and the terminal 22. Specifically, for example, a value obtained by amplifying a difference between the signals of the terminal 21 and the terminal 22 is output as a difference between the terminal 51 and the terminal 52.

When the potential of the terminal 51 of the amplifier circuit 11a changes, the potential of the terminal 21 of the amplifier circuit 11b also changes to substantially the same extent as the potential of the terminal 51 due to capacitive coupling of the capacitor 65a. When the potential of the terminal 52 of the amplifier circuit 11a changes, the potential of the terminal 22 of the amplifier circuit 11b also changes to substantially the same extent as the potential of the terminal 52 due to capacitive coupling of the capacitor 66a. Here, potentials can be applied to the terminal 21 and the terminal 22 of the amplifier circuit 11b using the initialized potential as a reference. Similarly, potentials can be applied to the terminal 21 and the terminal 22 of the amplifier circuit 11c using the initialized potential as a reference.

Figure 17A:
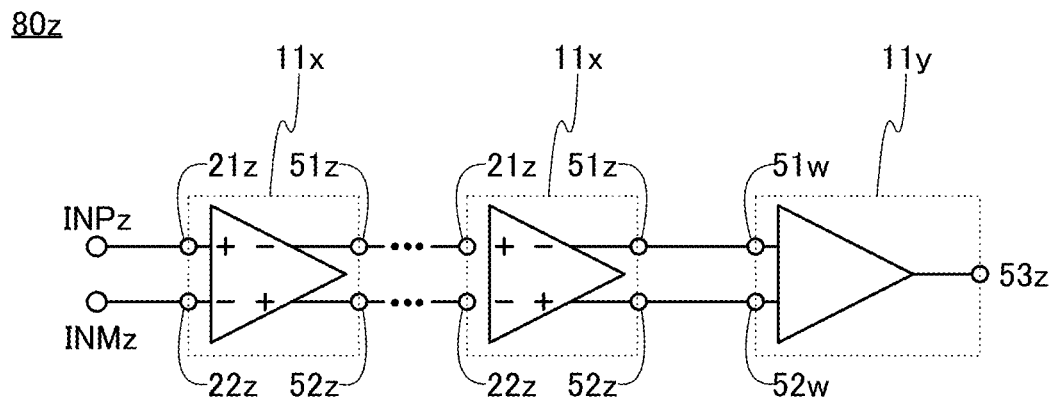
FIG. 17A and FIG. 17B are diagrams illustrating configuration examples of circuits.

The amplifier circuit 80 illustrated in FIG. 3 has a configuration in which an initialization potential is applied via the terminal VREF1 or the terminal VREF2. FIG. 17A illustrates an amplifier circuit having a configuration in which an initialization potential is not applied.

Figure 17B:
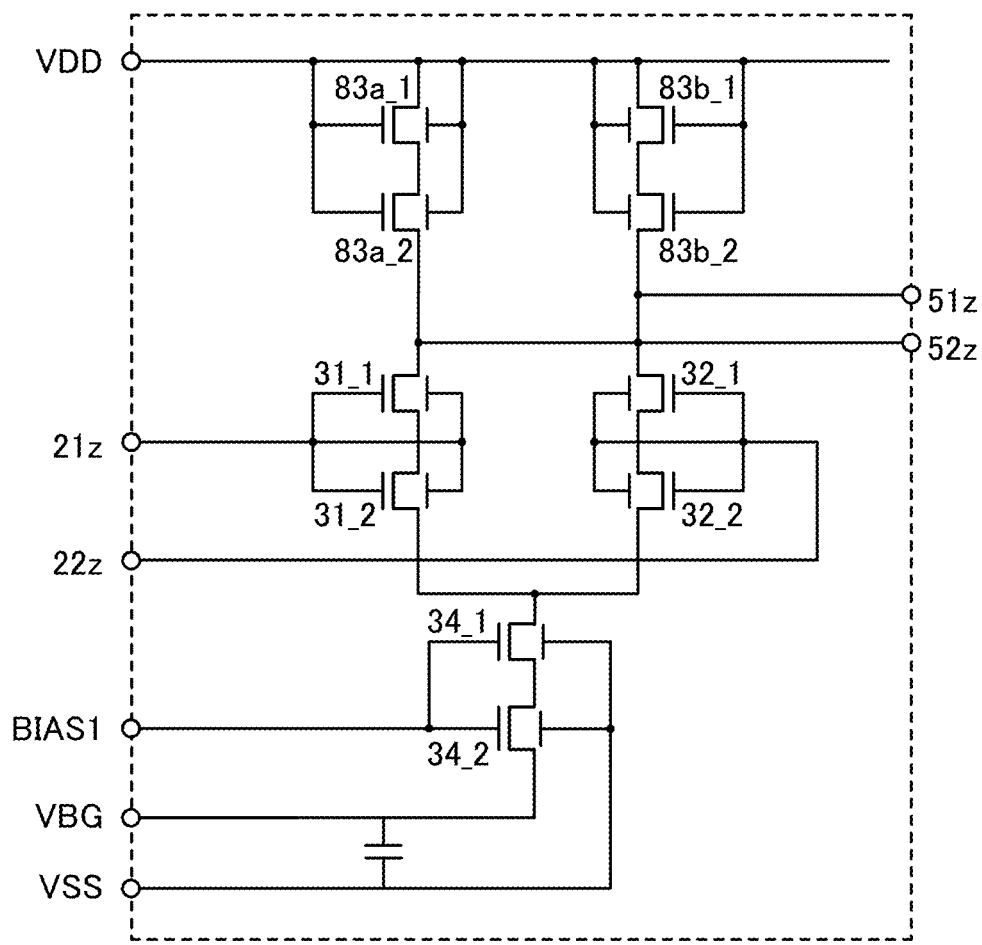
Figure 18:
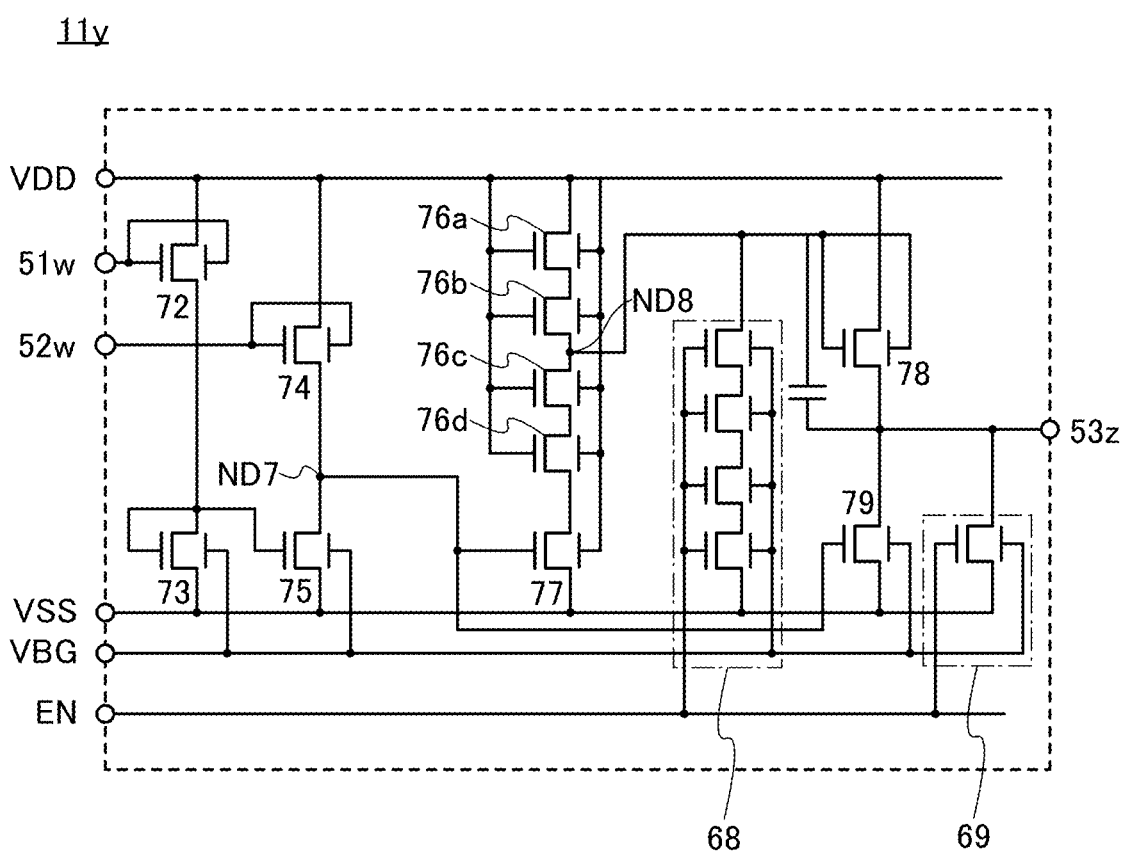
FIG. 18 is a diagram illustrating a configuration example of a circuit.

An amplifier circuit 80z illustrated in FIG. 17A has a configuration in which an amplifier circuit 11x having a configuration illustrated in FIG. 17B is repeated for a plurality of stages, and then an amplifier circuit 11y having a configuration illustrated in FIG. 18 is repeated for one or a plurality of stages.

In the amplifier circuit 80z, an input terminal INPz is electrically connected to an input terminal 21z of the amplifier circuit 11x in the first stage, and an input terminal INMz is electrically connected to an input terminal 22z of the amplifier circuit 11x in the first stage. An output terminal 51z of the amplifier circuit in the first stage is electrically connected to the input terminal 21z of the amplifier circuit in the next stage, and an output terminal 52z of the amplifier circuit in the first stage is electrically connected to the input terminal 22z of the amplifier circuit in the next stage. An input terminal 51w of the amplifier circuit 11y is electrically connected to the output terminal 51z in the last stage of the plurality of stages of the amplifier circuits 11x, and an input terminal 52w is electrically connected to the output terminal 52z in the last stage of the plurality of stages of the amplifier circuits 11x.

The amplifier circuit 11x illustrated in FIG. 17B uses two transistors (a transistor 31_1 and a transistor 31_2) connected in series instead of the transistor 31, two transistors (a transistor 32_1 and a transistor 32_2) connected in series instead of the transistor 32, and two transistors (a transistor 34_1 and a transistor 34_2) connected in series instead of the transistor 34. In addition, two transistors (a transistor 83a1 and a transistor 83a_2) connected in series are used instead of the transistor 83a of the amplifier circuit 11 illustrated in FIG. 2A, and two transistors (a transistor 83b_1 and a transistor 83b_2) connected in series are used instead of the transistor 83b.

Gates of the transistor 31_1 and the transistor 31_2 are electrically connected to the input terminal 21z, and gates of the transistor 32_1 and the transistor 32_2 are electrically connected to the input terminal 22z.

The potential of the terminal BIAS1 is applied to the gate of the transistor 34 through the transistor 45 in FIG. 2A;

however, gates of the transistor 34_1 and the transistor 34_2 are electrically connected to the terminal BIAS1 without through the transistor 45 in FIG. 17B. Thus, in FIG. 17B, the potential of the terminal BIAS1 is applied to the gates of the transistor 34_1 and the transistor 34_2 without through the transistor 45

The potential of the terminal VBCS is applied to the gate of the transistor 83a (the transistor 83b) through the transistor 84a (the transistor 84b) in FIG. 2(A); however, the terminal VDD is electrically connected to gates of the transistor 83a_1, the transistor 83a_2, the transistor 83b_1, and the transistor 83b_2 in FIG. 17(B).

The amplifier circuit 11y, the amplifier circuit 11y illustrated in FIG. 18 includes a circuit 68, a circuit 69, the input terminal 51w, the input terminal 52w, an output terminal 53z, transistors 72 to 75, transistors 76a to 76d, and transistors 77 to 79.

The amplifier circuit 11y has a function of supplying a signal corresponding to a difference between the input terminal 51w and the input terminal 52w to a node ND7, and a function of outputting a voltage shifted from the voltage of the signal of the node ND7 from the output terminal 53z.

The circuit 68 has a function of establishing and breaking electrical continuity between the potential of a node ND8 and the terminal VSS in accordance with the potential of a terminal EN. The circuit 68 is configured with a plurality of transistors connected in series between the node ND8 and the terminal VSS, and gates of the transistors are electrically connected to the terminal EN and back gates thereof are electrically connected to the terminal VBG.

The circuit 69 has a function of resetting the potential of the output terminal 53z to a potential from the terminal VSS when a desired signal is supplied to the terminal EN.

A gate and a back gate of the transistor 72 are electrically connected to the input terminal 51w. A gate and a back gate of the transistor 74 are electrically connected to the input terminal 52w. One of a source and a drain of the transistor 72 is electrically connected to the terminal VDD, and the other is electrically connected to a gate of the transistor 73 and a gate of the transistor 75. One of a source and a drain of the transistor 74 is electrically connected to the terminal VDD and the other is electrically connected to the node ND7. One of a source and a drain of the transistor 73 is electrically connected to the gate of the transistor 75 and the other is electrically connected to the terminal VSS. One of a source and a drain of the transistor 75 is electrically connected to the node ND7 and the other is electrically connected to the terminal VSS.

The potential of the node ND7 is applied to a gate of the transistor 77 and a gate of the transistor 79.

The amplifier circuit 11y includes four transistors (sequentially, the transistors 76a, 76b, 76c, and 76d) connected in series. One end of the four transistors connect in series is electrically connected to the terminal VDD and the other end is electrically connected to one of a source and a drain of the transistor 77. The other of the source and the drain of the transistor 77 is electrically connected to the terminal VSS. Gates and back gates of the transistors 76a, 76b, 76c, and the transistor 76d are electrically connected to the terminal VDD. The node ND8 is a node in which a source or a drain of the transistor 76b and a source or a drain of the transistor 76c are electrically connected to each other.

The potential of the node ND8 is applied to a gate and a back gate of a transistor 78.

One of a source and a drain of the transistor 78 is electrically connected to the terminal VDD and the other is electrically connected to the output terminal 53z. One of a source and a drain of the transistor 79 is electrically connected to the output terminal 53z and the other is electrically connected to the terminal VSS.

Back gates of the transistors 73, 75, 76a, 76b, 76c, 76d, 77, and 79 are electrically connected to the terminal VDD.

<Example of Semiconductor Device>

Figure 6A:
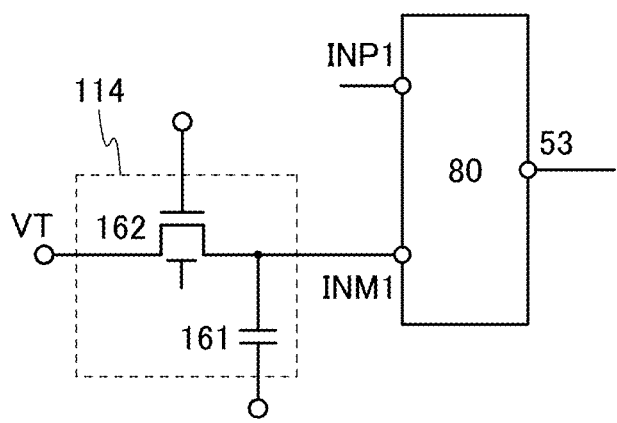
FIG. 6A and FIG. 6B are configuration examples of a circuits.

FIG. 6A illustrates an example of the semiconductor device of one embodiment of the present invention in which the amplifier circuit of one embodiment of the present invention is used for a comparison circuit (also referred to as a comparator) and a memory element is connected to one of the input terminals of the comparison circuit. A semiconductor device 70 illustrated in FIG. 6A includes a memory element 114 and the amplifier circuit 80.

The amplifier circuit 80 functions as a comparison circuit including two terminals, which are the terminal INP1 and the terminal INM1 that function as input terminals, and the terminal 53 that functions as an output terminal. In accordance with the comparison result between the signals input to the terminal INP1 and the terminal INM1, a signal is output from the terminal 53. It is preferable that one of the terminal INP1 and the terminal INM1 function as a non-inverting input terminal and the other function as an inverting input terminal.

An example in which the amplifier circuit 80 is used as the comparison circuit is described. A reference signal is supplied to one of the non-inverting input terminal and the inverting input terminal, and a signal to be compared with the reference signal is supplied to the other. FIG. 6A illustrates an example in which the reference signal is supplied to the terminal 22.

Here, the reference signal is preferably held in the memory element. Holding the reference signal in the memory element enables cutting of the connection with a signal supply circuit after the reference signal is supplied from the signal supply circuit. Accordingly, for example, power supply can be stopped in the whole or part of the signal supply circuit.

For the memory element, the configuration of the memory element 114 illustrated in FIG. 6A can be used. The memory element 114 illustrated in FIG. 6A includes a capacitor 161 and a transistor 162. One of a source and a drain of the transistor 162 is electrically connected to the terminal INM1, and the reference signal is supplied to the other (a terminal VT in FIG. 6). One electrode of the capacitor 161 is electrically connected to the terminal 22, and a second reference signal, for example, is supplied to the other. Here, as the second reference signal, a ground potential, a low potential signal, a high potential signal, a potential of a positive electrode or a negative electrode of a secondary battery, a value that is obtained by resistance division of a potential between a positive electrode and a negative electrode of a secondary battery, or the like may be used.

An OS transistor is preferably used as the transistor 162. Note that the transistor 162 includes a back gate in FIG. 6A; however, the transistor 162 may have a structure not including a back gate.

An operation example for holding the reference signal in the memory element 114 is shown. First, the transistor 162 is brought into an on state, a signal is supplied to the terminal VT, and a potential corresponding to the signal is applied to the terminal INM1 through the transistor 162. Then, the transistor 162 is brought into an off state. When the OS transistor is used as the transistor 162, the off-state current of the transistor 162 can be extremely low. Thus, the potential applied to the terminal 22 can be held.

Figure 6B:
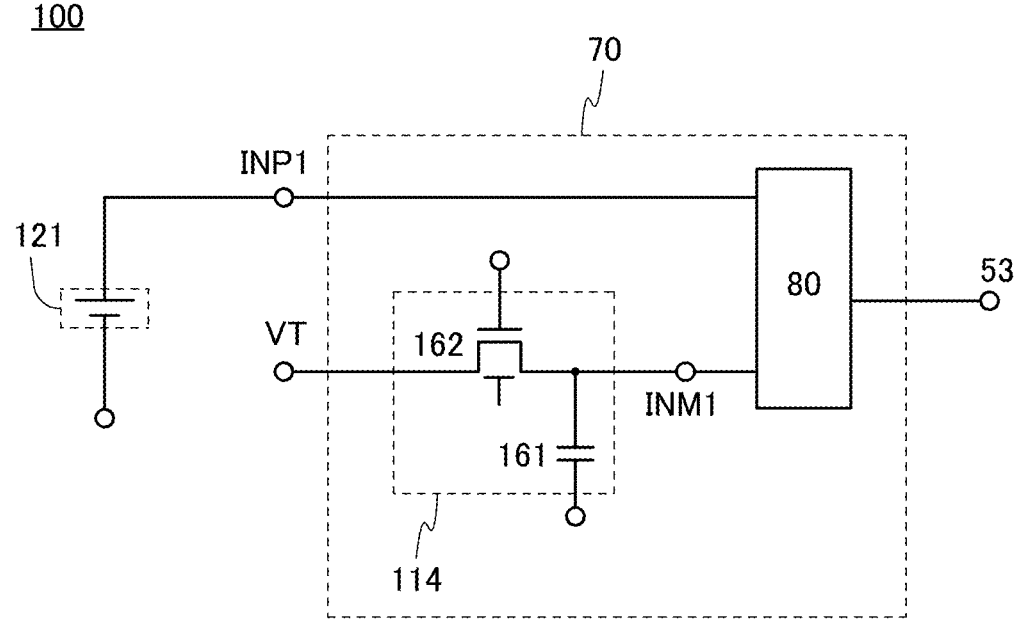

FIG. 6B illustrates an example in which the semiconductor device of one embodiment of the present invention is used for a power storage system. A power storage system 100 includes the semiconductor device 70 and a secondary battery 121. A positive electrode of the secondary battery 121 is electrically connected to the terminal 21 of the amplifier circuit 80. For example, the upper limit or the lower limit of the voltage region in a range favorable for the positive electrode is held in the terminal 22. A power storage device such as a secondary battery or a capacitor can be used as the secondary battery 121. For example, a lithium-ion secondary battery can be used as the secondary battery 121. The secondary battery is not limited to a lithium-ion secondary battery and as a positive electrode material of the secondary battery, a material containing an element A, an element X, and oxygen can be used, for example. The element A is one or more selected from the Group 1 elements and the Group 2 elements. As the Group 1 element, for example, an alkali metal such as lithium, sodium, or potassium can be used. As the Group 2 element, for example, calcium, beryllium, magnesium, or the like can be used. As the element X, for example, one or more selected from metal elements, silicon, and phosphorus can be used. Moreover, the element X is one or more selected from cobalt, nickel, manganese, iron, and vanadium. Typical examples include lithium-cobalt composite oxide $LiCoO_2$ and lithium iron phosphate $LiFePO_4$.

Figure 19:
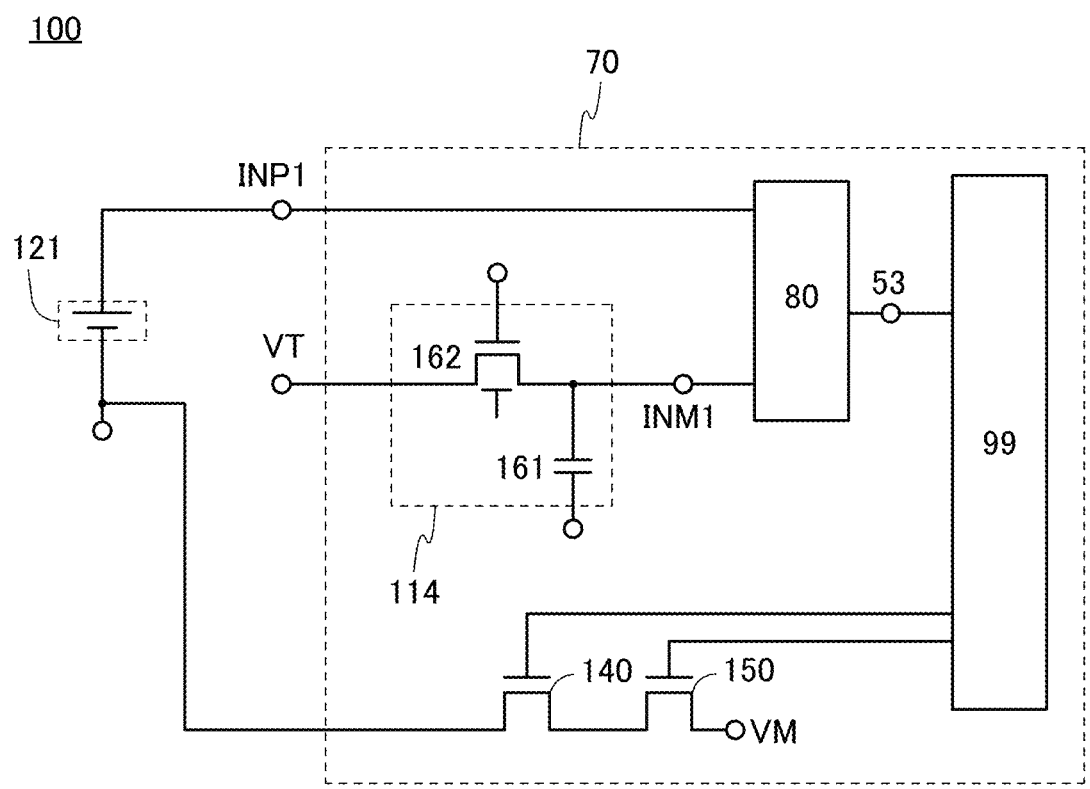
FIG. 19 is a diagram illustrating a configuration example of a circuit.

FIG. 19 illustrates an example in which the semiconductor device 70 connected to the secondary battery in the power storage system 100 includes a control circuit 99, a transistor 140, and a transistor 150 in addition to the amplifier circuit 80 and the memory element 114.

Although FIG. 6B and FIG. 19 illustrate an example in which the terminal INP1 is connected to the positive electrode of the secondary battery 121, the terminal INM1 may be electrically connected to the positive electrode of the secondary battery 121 and the terminal INP1 may be connected to the memory element 114.

In the case where the upper limit of the voltage region is held in the terminal 22, a signal from the terminal 53 is inverted when the potential of the terminal INP1 becomes higher than the potential of the terminal INM1. With such a function, for example, overcharge can be controlled. In addition, for example, in each of a plurality of secondary batteries connected in series, cell balance can be controlled when one amplifier circuit is electrically connected to a positive electrode of one secondary battery. Moreover, in the case where the lower limit of the voltage region is held in the terminal 22, for example, overdischarge can be controlled. Furthermore, in the case where a potential corresponding to the current value of a secondary battery is held in the terminal 53, for example, overcurrent can be controlled. The inversion of a signal refers to, for example, a change of a high potential signal to a low potential signal or a change of a low potential signal to a high potential signal. Owing to the inversion of the signal, in a circuit to which the output from the terminal 53 is supplied, the secondary battery 121 is controlled in accordance with the supplied signal.

As illustrated in FIG. 19, the semiconductor device 70 preferably includes the transistor 140 and the transistor 150, and the on/off of the transistor 140 and the transistor 150 can be controlled by the control circuit 99. In FIG. 19, one of a source and a drain of the transistor 140 is electrically connected to a negative electrode of the secondary battery 121, the other is electrically connected to one of a source and a drain of the transistor 150, and the other of the source and the drain of the transistor 150 is electrically connected to a terminal VM. The semiconductor device 70 illustrated in FIG. 19 includes the control circuit 99, and a signal from the terminal 53 functioning as the output terminal of the amplifier circuit 80 is supplied to the control circuit 99. Using a signal supplied from the terminal 53, the control circuit 99 controls a charging condition and a discharging condition of the secondary battery. Moreover, when determining that a current needs to be stopped using the transistor 140 and the transistor 150, the control circuit 99 can protect the secondary battery 121 by supplying a signal to a gate of the transistor 140 and a gate of the transistor 150 and stopping a charging current or a discharging current of the secondary battery. Note that the transistor 140 and the transistor 150 each preferably include a parasitic diode. An example of the parasitic diode is described later. Alternatively, a diode may be connected in parallel to the transistor 140 and the transistor 150.

Figure 24A:
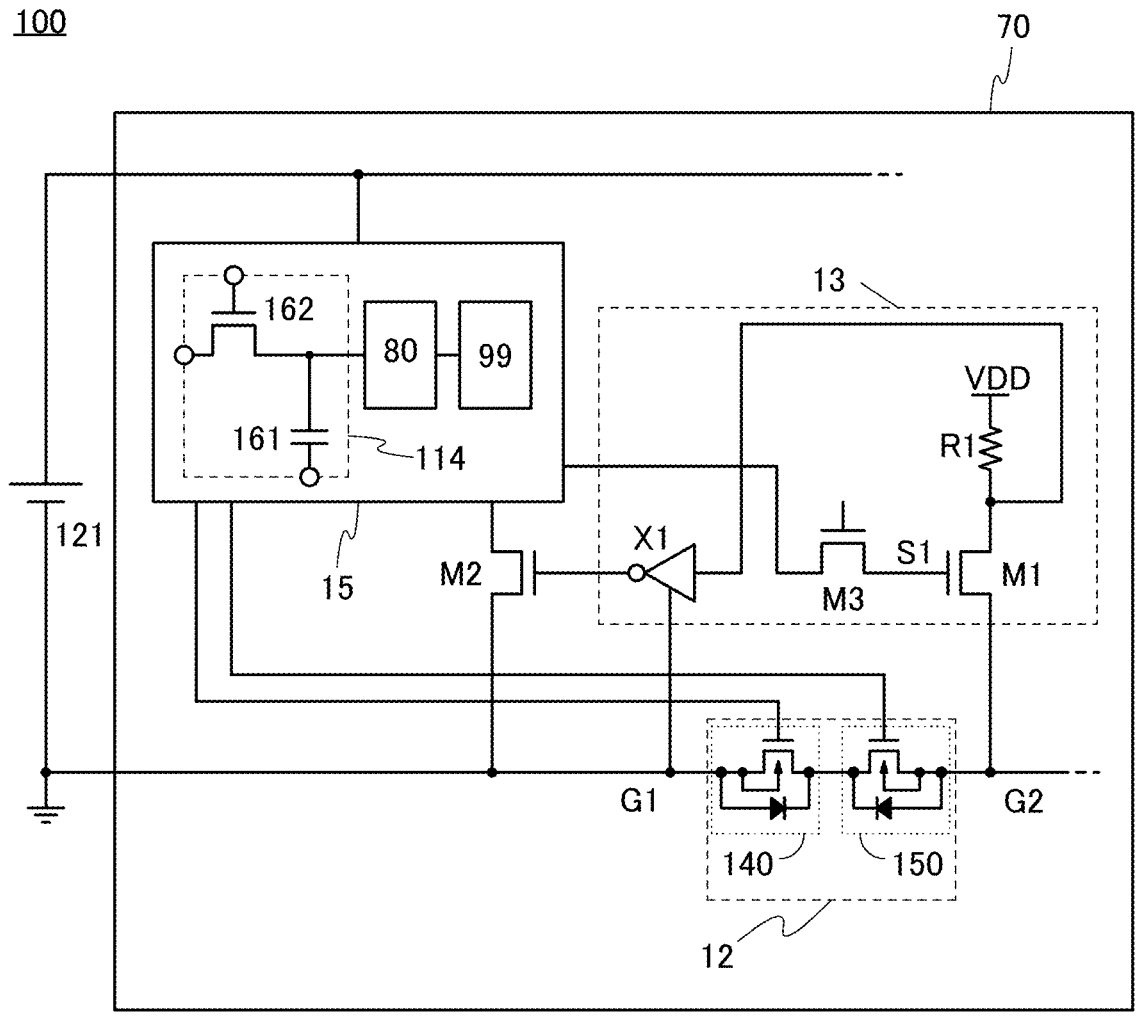
FIG. 24A is a diagram illustrating a configuration example of a power storage system.

FIG. 24A illustrates an example in which the power storage system 100 of one embodiment of the present invention includes a charging detection circuit 13. In FIG. 24A, the charging detection circuit 13 includes a transistor M1, a transistor M3, a pull-up resistor R1, and an inverter X1. A circuit 15 includes the memory element 114, the amplifier circuit 80, and the control circuit 99. As the power source potential applied to the circuit 15, a power supply potential of a battery is supplied through the transistor M2. The power storage system 100 illustrated in FIG. 24A includes a disconnecting switch 12. The disconnecting switch 12 includes the transistor 140 and the transistor 150. The transistor 140 and the transistor 150 each include a parasitic diode.

The circuit 15 preferably includes, in addition to the configuration illustrated in FIG. 24A, any one or more of a delay detection logic circuit, an oscillator circuit, a circuit for a residual capacity meter, a micro-short detection circuit, a micro short-circuit prediction circuit, and the like.

The transistor M3 has an extremely low off-leakage current characteristics used to achieve the potential retention of S1. FIG. 24A shows an example where each transistor does not include a back gate; however, the structure is not particularly limited thereto and each transistor may include a back gate.

When the power storage system 100 is turned on, Si is High (VDD); therefore, the input potential of the inverter X1 becomes Low, and the gate potential of the transistor M2 (the output potential of the inverter X1) becomes High. In other words, since the transistor is turned on, the circuit 15 is brought into a state where VSS is supplied.

On the other hand, when the power storage system 100 is turned off, S1 is Low (VSS); therefore, the input potential of the inverter X1 becomes High, and the gate potential of the transistor M2 (the output potential of the inverter X1) becomes Low. In other words, since the transistor M2 is in an off state, the circuit 15 is brought into a state where VSS is not supplied (power gating state). Thus, by using a switch with extremely low off-leakage current characteristics (e.g., an OS transistor) for the transistor M2, the off-leakage current of the circuit 15 can be reduced. In particular, an oxide semiconductor formed of indium, gallium, and zinc is preferably used for the semiconductor layer of the OS transistor.

When the battery is in an overdischarged state where a low off-leakage current is especially need, the gate-source voltage Vgs of the transistor M1 which is the potential difference between S1 and G2 gets closer to 0 V since the potential of G2 increases to VDD, whereby the transistor M1 is turned off. At this time, the input potential of the inverter X1 becomes High by the pull-up resistor R1, and the gate potential of the transistor M2 (the output potential of the inverter X1) becomes Low. In other words, since the transistor M2 is brought into an off state, the circuit 15 is brought into a state where a voltage VSS is not supplied (power gating state). Thus, by using a switch with extremely low off-leakage current characteristics (e.g., an OS transistor) for the transistor M2, the off-leakage current of the circuit 15 can be reduced. Then, when the charging is started, the potential of G2 is returned to VSS and the system returns to a circuit state equivalent to that in an on state, in which the circuit 15 is supplied with VSS.

A gate control signal of the transistor M3 aims to retain a node of Si. A potential for S1 is supplied from the circuit 15; however, when the circuit 15 is in an off state, the supply source of the output signal does not exist, whereby the potential becomes an undefined value. When Si functions as a memory, charging detection can function normally even when the circuit 15 is in an off state.

The current supply capability of the transistor M1 and the pull-up resistor R1 determines the input potential of the inverter X1; therefore, compared to the pull-up resistor R1, the transistor M1 needs to have a sufficiently high on-state current and a sufficiently low off-state current. The pull-up resistor R1 may include a pull-up transistor using a transistor. When the pull-up resistor is achieved with the same connection structure as the transistors M1 and M3, the amount of pull-up current can be adjusted depending on a value of a writing potential.

The output logic of a signal supplied from the circuit 15 to the transistor M3 is set so that the ON/OFF control of the transistor M2 can be performed in accordance with the results of detection of the secondary battery by the circuit 15.

The semiconductor device 70 may include a coulomb counter that detects a charging current and a discharging current of the secondary battery 121 and calculates the amount of charge by integrating those currents. The coulomb counter preferably functions as a residual capacity meter. The SOC of the secondary battery can be estimated with the coulomb counter.

Figure 24B:
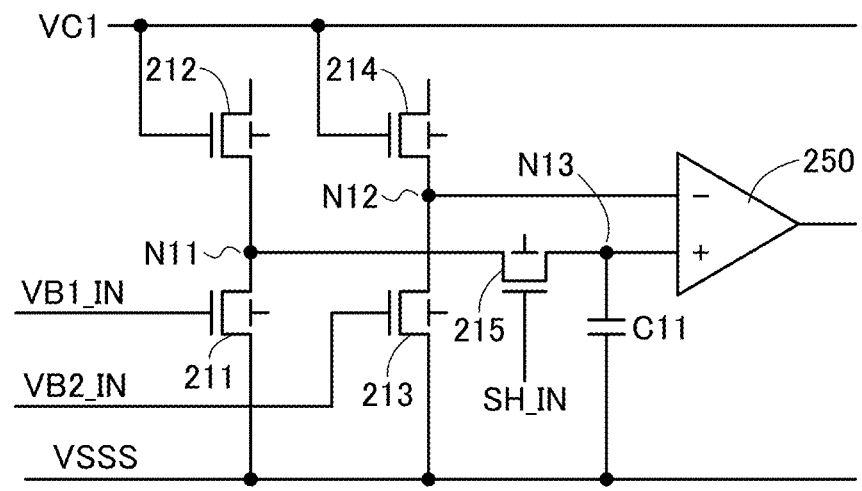
FIG. 24B is a diagram illustrating a configuration example of a micro-short detection circuit.

FIG. 24B illustrates a configuration example of a micro-short detection circuit. The micro-short detection circuit illustrated in FIG. 24B includes a transistor 211 to a transistor 215, a capacitor C11, and a comparator 250. For the comparator 250, the configuration of the amplifier circuit 80 or the like can be used. Note that in the drawings described in this specification and the like, the flow of main signals is indicated by an arrow or a line, and a power supply line and the like are omitted in some cases. A hysteresis comparator may be used as the comparator 250. The micro-short detection circuit illustrated in FIG. 24B may perform detection on a plurality of battery cells connected in series or perform detection on one battery cell at a time.

The micro-short detection circuit illustrated in FIG. 24B includes a terminal VC1, a wiring VB1_IN supplied with a predetermined potential VB1, a wiring VB2_IN supplied with a predetermined potential VB2, and a wiring SH_IN supplied with a sampling signal.

Here, the predetermined potential VB1 is a potential higher than the predetermined potential VB2, and the predetermined potential VB2 is a potential higher than the potential of a terminal VSSS.

The transistor 211 to the transistor 215 are n-channel transistors. Although an example in which the micro-short detection circuit is formed using n-channel transistors is described in this specification and the like, p-channel transistors may alternatively be used. It will be easily understood by those skilled in the art that n-channel transistors in a circuit diagram configured using the n-channel transistors can be replaced with p-channel transistors; thus, the description is omitted.

One of a source and a drain of the transistor 211 may be electrically connected to the terminal VSSS; the other of the source and the drain of the transistor 211 may be electrically connected to one of a source and a drain of a transistor 212 and one of a source and a drain of the transistor 215; a gate of the transistor 211 may be electrically connected to the wiring VB1_IN; and the other of the source and the drain of the transistor 212 and a gate of the transistor 212 may be electrically connected to the terminal VC1.

One of a source and a drain of a transistor 213 may be electrically connected to the terminal VSSS; the other of the source and the drain of the transistor 213 may be electrically connected to one of a source and a drain of the transistor 214 and an inverting input terminal of the comparator 250; a gate of the transistor 213 may be electrically connected to the wiring VB2_IN; and the other of the source and the drain of the transistor 214 and a gate of the transistor 214 may be electrically connected to the terminal VC1.

The other of the source and the drain of the transistor 215 is electrically connected to one terminal of the capacitor C11 and a non-inverting input terminal of the comparator 250; a gate of the transistor 215 is electrically connected to the wiring SH_IN; and the other terminal of the capacitor C11 is electrically connected to the terminal VSSS. Note that the other terminal of the capacitor C11 may be electrically connected to a wiring other than the terminal VSSS as long as the wiring is supplied with a predetermined potential.

Here, a connection portion where the other of the source and the drain of the transistor 211, the one of the source and the drain of the transistor 212, and the one of the source and the drain of the transistor 215 are electrically connected to each other is referred to as a node N11; a connection portion where the other of the source and the drain of the transistor 213, the one of the source and the drain of the transistor 214, and the inverting input terminal of the comparator 250 are electrically connected to each other is referred to as a node N12; and a connection portion where the other of the source and the drain of the transistor 215, the other terminal of the capacitor C11, and the non-inverting input terminal of the comparator 250 are electrically connected to each other is referred to as a node N13.

The transistor 211 and the transistor 212 form a first source follower, and the transistor 213 and the transistor 214 form a second source follower. That is, the gate of the transistor 211 corresponds to an input of the first source follower, and an output of the first source follower is supplied to the node N11. The gate of the transistor 213 corresponds to an input of the second source follower, and an output of the second source follower is supplied to the node N12.

When charging is started in an assembled battery, the sampling signal supplied to the wiring SH_INs becomes high level at predetermined intervals. As the potential VB1, a potential higher than the potential VB2 is supplied. The potential of the node N11 and the potential of the node N12 increase along with charging.

When the positive electrode potential decreases instantaneously because of occurrence of a micro-short circuit, the potentials of the node N11 and the node N12 decrease instantaneously. Meanwhile, when the sampling signal supplied to the wiring SH_IN is at low level, the potential of the node N13 is not affected by the potential of the node N11, and the potential of the node N12 becomes lower than the potential of the node N13. Then, the output of the comparator 250 is inverted, and a micro-short circuit is detected.

To increase the accuracy of detecting a micro-short circuit, a micro-short circuit may be detected or predicted in such a manner that the voltage of a secondary battery is converted into digital data by an analog-to-digital converter circuit, and arithmetic operation is performed on the basis of the digital data by a processor unit or the like to analyze a charge waveform or a discharge waveform. For example, a micro-short circuit is detected or predicted using a change of a voltage difference between time steps in the charge waveform or the discharge waveform. A change of a voltage difference is obtained by calculating voltage differences and calculating a difference with the previous step.

A neural network may be used to increase the accuracy of detecting a micro-short circuit.

A neural network is a method, which is neural network processing performed in a neural network portion (e.g., including a CPU (Central Processing Unit), a GPU (Graphics Processing Unit), an APU (Accelerated Processing Unit), a memory, and the like). Note that an APU refers to a chip integrating a CPU and a GPU into one.

In a secondary battery mounted on a device, discharge, which is likely to depend on a way of using the device by the user, occurs at random; whereas charge can be said to be more easily predicted than discharge because the charging condition is fixed. Using a rather large number of charge curves as data for learning, an accurate value can be predicted with a neural network. When a charge curve is obtained, initial SOC(0), FCC, $R_0$, $R_d$, and $C_d$ can be obtained using a neural network. For arithmetic operation of a neural network, a microprocessor or the like can be used, for example.

Specifically, a variety of obtained data are evaluated and learned using machine learning or artificial intelligence to analyze the expected degree of degradation of a secondary battery, and when there is an abnormality, charging of the secondary battery is stopped or the current density of constant-current charging is adjusted.

The adjustment of the current density of constant-current charging may be performed by controlling the on-state currents of the transistor 140 and the transistor 150.

For example, in an electric vehicle, learning data can be obtained while the electric vehicle is running, and the degradation state of a secondary battery can be known. Note that a neural network is used to estimate the degradation state of the secondary battery. The neural network can be composed of a neural network including a plurality of hidden layers, that is, a deep neural network. Note that learning in a deep neural network is referred to as deep learning in some cases.

For the machine learning, first, a feature value is extracted from learning data. A relative change amount that changes with time is extracted as a feature value, and a neural network is made to learn based on the extracted feature value. For the learning means, the neural network can be made to learn based on learning patterns that are different between each time division. A coupling weight applied to the neural network can be updated according to a leaning result based on the leaning data.

As a method of estimating the charging state of a secondary battery by using a neural network, a regression model such as a Kalman filter, for example, can be used for calculation processing.

A Kalman filter is a kind of infinite impulse response filter. In addition, multiple regression analysis is multivariate analysis and uses a plurality of independent variables in regression analysis. Examples of an arithmetic method that can be used for a multiple regression analysis include a least-squares method. The regression analysis requires a large number of observation values of time series, whereas the Kalman filter has an advantage of being able to obtain an optimal correction coefficient successively as long as a certain amount of data is accumulated. Moreover, the Kalman filter can also be applied to transient time series.

As a method of estimating the internal resistance and the state of charge (SOC) of a secondary battery, a non-linear Kalman filter (specifically an unscented Kalman filter (also referred to as UKF)) can be used. In addition, an extended Kalman filter (also referred to as EKF) can also be used. The SOC refers to a charging state (also referred to as state of charge), and is an index indicating that the fully charged state is 100% and the completely discharged state is 0%.

Initial parameters obtained by an optimization algorithm are collected in every n (n is an integer, e.g., 50) cycles, and neural network processing is performed using these data groups as teacher data; thus, the SOC can be estimated with high accuracy.

The learning system includes a teacher creation device and a learning device. The teacher data generation device generates teacher data that the learning device uses for learning. The teacher data includes data whose recognition target is the same as that in processing target data and evaluation of a label corresponding to the data. The teacher data generation device includes an input data acquisition portion, an evaluation acquisition portion, and a teacher data generation portion. The input data acquisition portion may obtain input data from data stored in a memory device or obtain input data for learning via the Internet. The input data is data used for learning, which includes a current value and a voltage value of a secondary battery. Teacher data is not necessarily measured data; data close to actual measurement may be created by varying initial parameters to increase the diversity, and neural network processing may be performed using a predetermined property database as teacher data to estimate the state of charge (SOC). Alternatively, data close to actual measurement can be created on the basis of charge and discharge characteristics of one battery, and neural network processing can be performed using a predetermined property database as teacher data to efficiently estimate the SOC of batteries of the same kind.

In the case where degradation of a secondary battery proceeds, an SOC error might occur when FCC, the initial parameter, changes greatly; hence, initial parameters used for arithmetic operation to estimate the SOC may be updated. The initial parameters to be updated are calculated by an optimization algorithm using data on charge and discharge characteristics that are measured in advance. By calculation processing with a regression model using updated initial parameters, for example, a Kalman filter, the SOC can be estimated with high accuracy even after degradation. In this specification, calculation processing using a Kalman filter is also expressed as Kalman filter processing.

The timing of updating the initial parameters can be at random; to estimate the SOC with high accuracy, the frequency of updates is preferably high and successive updates at regular intervals are preferable. Note that when the temperature of a secondary battery is high and its SOC is high, degradation of the secondary battery is likely to progress in some cases. In such a case, it is preferable to inhibit degradation of the secondary battery by discharging the secondary battery to lower the SOC.

The power storage system 100 may have functions of measuring the temperature of the secondary battery 121 and controlling charge and discharge of the battery cell in accordance with the measured temperature. For example, the resistance of a secondary battery may increase at low temperatures; thus, the charge current density and discharge current density are reduced in some cases. The resistance of a secondary battery may decrease at high temperatures; hence, the discharge current density is increased in some cases. When the increase in charge current at high temperatures causes a concern for deterioration of secondary battery characteristics, the charge current is controlled to be a current with which deterioration is inhibited, for example. Data on the charging condition, the discharging condition, and the like is preferably stored in a memory circuit or the like included in the semiconductor device 70 of one embodiment of the present invention. The temperature of the semiconductor device 70 or the secondary battery 121 is sometimes increased by charging. In such a case, charging is preferably controlled in accordance with the measured temperature. For example, the charge current is decreased along with the temperature increase.

For example, an element whose voltage changes in accordance with temperature is electrically connected to the terminal INP1 and a voltage corresponding to a reference temperature is stored in the terminal VT, so that the semiconductor device 70 can function as a temperature sensor. Here, the voltage corresponding to the temperature may be a value obtained by converting a current into a voltage.

<OS Transistor>

An OS transistor includes an oxide semiconductor in a channel formation region. As the oxide semiconductor, a metal oxide containing at least indium or zinc is preferably used. In particular, a metal oxide containing indium and zinc is preferably used. Moreover, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, the element M, and zinc is considered. The element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, and magnesium. Note that two or more of the above elements may be used in combination as the element M.

The structure and method described in this embodiment can be used by being combined as appropriate with the structures and methods described in the other embodiments.

Embodiment 2

In this embodiment, a structure example of an OS transistor that can be used in the semiconductor device described in the above embodiment is described. Note that an OS transistor is a thin film transistor and can be provided to be stacked; therefore, in this embodiment, a structure example of a semiconductor device in which an OS transistor is provided above a Si transistor formed on a single crystal silicon substrate is described.

<Structure Example of Semiconductor Device>

Figure 7:
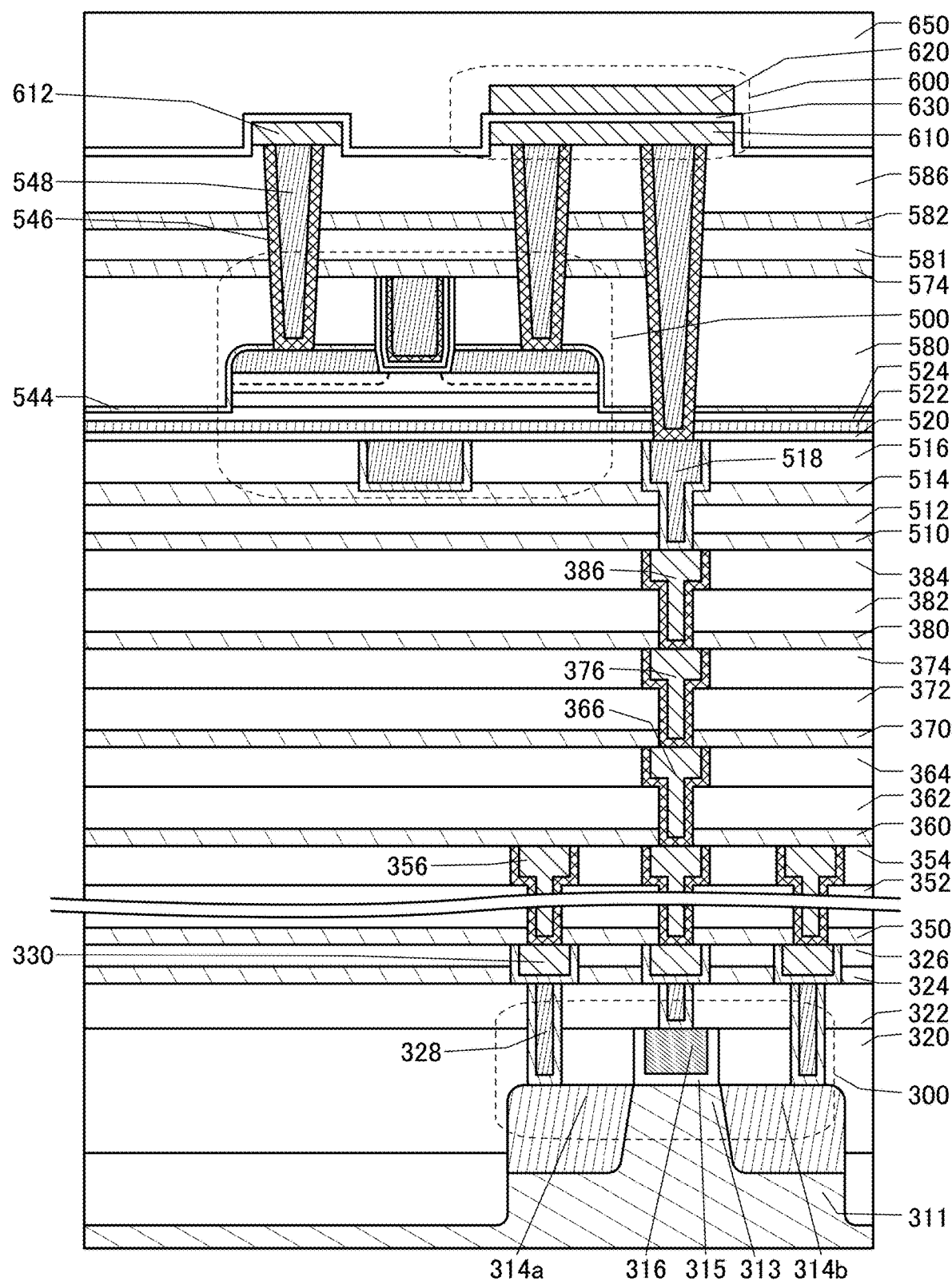
FIG. 7 is a cross-sectional view illustrating a structure example of a semiconductor device.
Figure 8A:
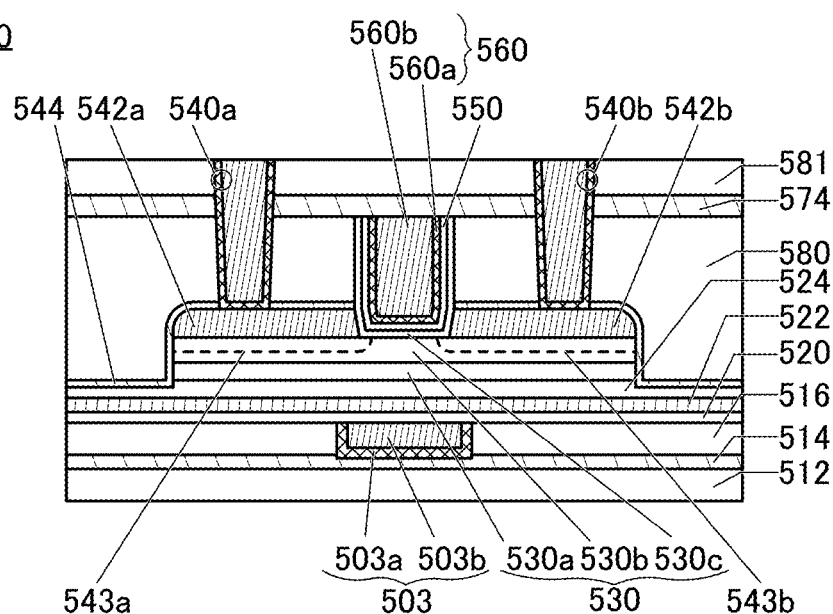
FIG. 8A to FIG. 8C are cross-sectional views illustrating structure examples of transistors.
Figure 8B:
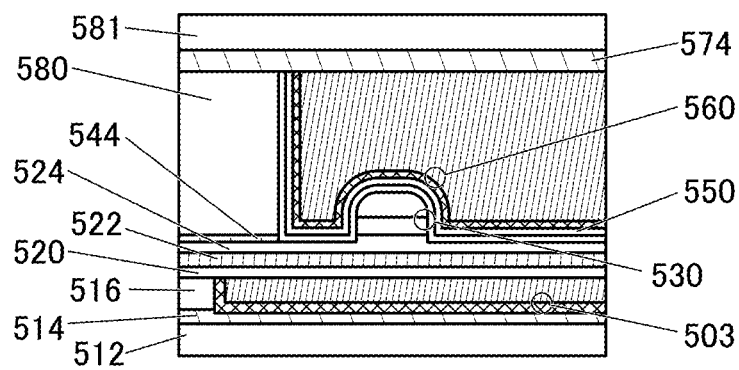
Figure 8C:
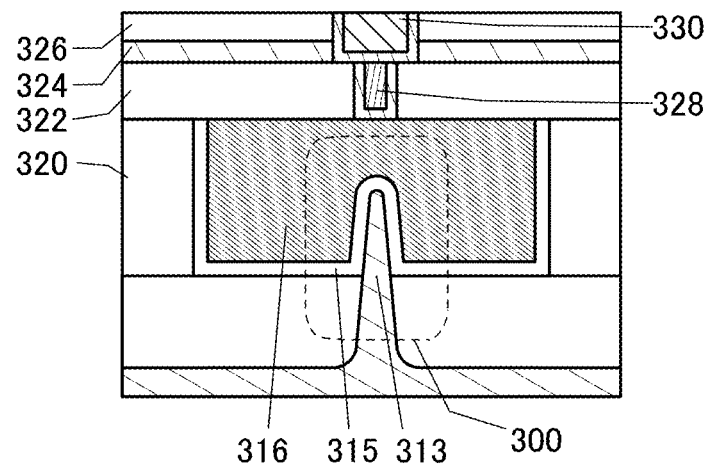

A semiconductor device illustrated in FIG. 7 includes a transistor 300, a transistor 500, and a capacitor 600. FIG. 8A is a cross-sectional view of the transistor 500 in the channel length direction, FIG. 8B is a cross-sectional view of the transistor 500 in the channel width direction, and FIG. 8C is a cross-sectional view of the transistor 300 in the channel width direction.

The transistor 500 is a transistor including a metal oxide in its channel formation region (an OS transistor). The transistor 500 has an extremely low off-state current.

The semiconductor device described in this embodiment includes the transistor 300, the transistor 500, and the capacitor 600 as illustrated in FIG. 7. The transistor 500 is provided above the transistor 300, and the capacitor 600 is provided above the transistor 300 and the transistor 500.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region.

As illustrated in FIG. 8C, in the transistor 300, a top surface and a side surface in the channel width direction of the semiconductor region 313 are covered with the conductor 316 with the insulator 315 therebetween. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), InP (indium phosphide), SiC (silicon carbide), ZnSe (zinc selenide), GaN (gallium nitride), $GaO_x$ (gallium oxide; x is a real number greater than 0), or the like. A structure may be employed in which silicon whose effective mass is controlled by applying stress to the crystal lattice and changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that since the work function of a conductor depends on a material of the conductor, Vth of the transistor can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 300 illustrated in FIG. 7 is just an example and the structure is not limited thereto; an appropriate transistor can be used in accordance with a circuit configuration or a driving method.

An insulator 320, an insulator 322, an insulator 324, and an insulator 326 are stacked in this order to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for planarizing a level difference caused by the transistor 300 or the like provided below the insulator 322. For example, a top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low relative permittivity is used for an interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. A plurality of conductors having a function of plugs or wirings are collectively denoted by the same reference numeral in some cases. Furthermore, in this specification and the like, a wiring and a plug connected to the wiring may be a single component. That is, there are cases where part of a conductor functions as a wiring and another part of the conductor functions as a plug.

As a material for each of plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

A wiring layer may be provided over the insulator 326 and the conductor 330. For example, in FIG. 7, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening of the insulator 350 having a barrier property against hydrogen. With this structure, the transistor 300 and the transistor 500 can be separated by a barrier layer, so that the diffusion of hydrogen from the transistor 300 into the transistor 500 can be inhibited.

Note that as the conductor having a barrier property against hydrogen, tantalum nitride can be used, for example. The use of a stack including tantalum nitride and tungsten having high conductivity can inhibit the diffusion of hydrogen from the transistor 300 while the conductivity of a wiring is kept. In that case, the tantalum nitride layer having a barrier property against hydrogen is preferably in contact with the insulator 350 having a barrier property against hydrogen.

A wiring layer may be provided over the insulator 354 and the conductor 356. For example, in FIG. 7, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening of the insulator 360 having a barrier property against hydrogen. With this structure, the transistor 300 and the transistor 500 can be separated by a barrier layer, so that the diffusion of hydrogen from the transistor 300 into the transistor 500 can be inhibited.

A wiring layer may be provided over the insulator 364 and the conductor 366. For example, in FIG. 7, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening of the insulator 370 having a barrier property against hydrogen. With this structure, the transistor 300 and the transistor 500 can be separated by a barrier layer, so that the diffusion of hydrogen from the transistor 300 into the transistor 500 can be inhibited.

A wiring layer may be provided over the insulator 374 and the conductor 376. For example, in FIG. 7, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening of the insulator 380 having a barrier property against hydrogen. With this structure, the transistor 300 and the transistor 500 can be separated by a barrier layer, so that the diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen or hydrogen is preferably used for any of the insulator 510, the insulator 512, the insulator 514, and the insulator 516.

For example, the insulator 510 and the insulator 514 are preferably formed using a film having a barrier property that prevents diffusion of hydrogen or impurities from the substrate 311, the region where the transistor 300 is provided, or the like into the region where the transistor 500 is provided. Therefore, a material similar to that for the insulator 324 can be used.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

For the film having a barrier property against hydrogen used as the insulator 510 and the insulator 514, for example, a metal oxide such as aluminum oxide, hafnium oxide, or tantalum oxide is preferably used.

In particular, aluminum oxide has a high blocking effect that inhibits the passage of both oxygen and impurities such as hydrogen and moisture which are factors of a change in electrical characteristics of the transistor. Accordingly, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. When a material with a relatively low permittivity is used for an interlayer film, the parasitic capacitance between wirings can be reduced. Silicon oxide films, silicon oxynitride films, or the like can be used as the insulator 512 and the insulator 516, for example.

A conductor 518, a conductor included in the transistor 500 (a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; thus, the diffusion of hydrogen from the transistor 300 into the transistor 500 can be inhibited.

The transistor 500 is provided above the insulator 516.

As illustrated in FIG. 8A and FIG. 8B, the transistor 500 includes the conductor 503 positioned to be embedded in the insulator 512 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; a conductor 560 positioned in the opening; an insulator 550 positioned between the conductor 560 and the oxide 530b, the conductor 542a, the conductor 542b, and the insulator 580; and an oxide 530c positioned between the insulator 550 and the oxide 530b, the conductor 542a, the conductor 542b, and the insulator 580.

As illustrated in FIG. 8A and FIG. 8B, an insulator 544 is preferably positioned between the insulator 580 and the oxide 530a, the oxide 530b, the conductor 542a, and the conductor 542b. In addition, as illustrated in FIG. 8A and FIG. 8B, the conductor 560 preferably includes a conductor 560a provided inside the insulator 550 and a conductor 560b embedded inside the conductor 560a. Moreover, as illustrated in FIG. 8A and FIG. 8B, an insulator 574 is preferably positioned over the insulator 580, the conductor 560, and the insulator 550.

Hereinafter, the oxide 530a, the oxide 530b, and the oxide 530c may be collectively referred to as an oxide 530. The conductor 542a and the conductor 542b may be collectively referred to as a conductor 542.

The transistor 500 has a structure in which three layers of the oxide 530a, the oxide 530b, and the oxide 530c are stacked in the region where the channel is formed and its vicinity; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be provided. Although the conductor 560 is shown to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 7, FIG. 8A, and FIG. 8B is an example, and the structure is not limited thereto; an appropriate transistor can be used in accordance with a circuit configuration or a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the transistor 500 can have improved switching speed and excellent frequency characteristics.

The conductor 560 sometimes functions as a first gate (also referred to as top gate) electrode. The conductor 503 sometimes functions as a second gate (also referred to as back gate or bottom gate) electrode. In that case, Vth of the transistor 500 can be controlled by changing a potential applied to the conductor 503 independently of a potential applied to the conductor 560. In particular, Vth of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to be overlapped by the oxide 530 and the conductor 560. Thus, when potentials are applied to the conductor 560 and the conductor 503, an electric field generated from the conductor 560 and an electric field generated from the conductor 503 are connected, so that the channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

Furthermore, in this specification and the like, the S-channel structure has a feature in that the side surface and the vicinity of the oxide 530 in contact with the conductor 542a and the conductor 542b functioning as a source electrode and a drain electrode are of I-type like the channel formation region. The side surface and the vicinity of the oxide 530 in contact with the conductor 542a and the conductor 542b are in contact with the insulator 544 and thus can be of I-type like the channel formation region. Note that in this specification and the like, "I-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

The conductor 503 has a structure similar to that of the conductor 518; a conductor 503a is formed in contact with an inner wall of an opening in the insulator 514 and the insulator 516, and a conductor 503b is formed on the inner side.

The insulator 520, the insulator 522, the insulator 524, and the insulator 550 each have a function of a gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^{-3}$, preferably greater than or equal to $1.0\times10^{19}$ atoms/cm$^{-3}$, further preferably greater than or equal to $2.0\times10^{19}$ atoms/cm$^{-3}$ or greater than or equal to $3.0\times10^{20}$ atoms/cm$^{-3}$ in TDS (Thermal Desorption Spectroscopy) analysis. Note that the temperature of the film surface in the TDS analysis is preferably within the range of 100° C. to 700° C., or 100° C. to 400° C.

In the case where the insulator 524 includes an excess-oxygen region, it is preferred that the insulator 522 have a function of inhibiting diffusion of oxygen (e.g., an oxygen atom, an oxygen molecule, or the like) (the oxygen is less likely to pass).

When the insulator 522 has a function of inhibiting diffusion of oxygen or impurities, oxygen contained in the oxide 530 is not diffused to the insulator 520 side, which is preferable. Furthermore, the conductor 503 can be inhibited from reacting with oxygen contained in the insulator 524 or the oxide 530.

For example, the insulator 522 is preferably formed using a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba, Sr)TiO$_3$ (BST). With miniaturization and high integration of transistors, a problem such as leakage current may arise because of a thinner gate insulating film. When a high-k material is used for an insulator functioning as the gate insulating film, a gate potential during operation of the transistor can be reduced while the physical thickness is maintained.

It is particularly preferable to use an insulator containing an oxide of one or both of aluminum and hafnium, which is an insulating material having a function of inhibiting diffusion of impurities, oxygen, and the like (the oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride, which have thermal stability, are preferable. Furthermore, when an insulator which is a high-k material is combined with silicon oxide or silicon oxynitride, the insulator 520 having a stacked-layer structure that has thermal stability and a high relative permittivity can be obtained.

Note that the insulator 520, the insulator 522, and the insulator 524 may each have a stacked-layer structure of two or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 530, an In—Ga oxide or an In—Zn oxide may be used.

Furthermore, a metal oxide with a low carrier concentration is preferably used for the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics.

A defect in which hydrogen has entered an oxygen vacancy can function as a donor of the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^{-3}$, preferably lower than $1\times10^{19}$ atoms/cm$^{-3}$, further preferably lower than $5\times10^{18}$ atoms/cm$^{-3}$, still further preferably lower than $1\times10^{18}$ atoms/cm$^{-3}$. When a metal oxide with a sufficiently low concentration of impurities such as hydrogen is used for a channel formation region of a transistor, the transistor can have stable electrical characteristics.

When a metal oxide is used for the oxide 530, the carrier concentration of the metal oxide in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet still further preferably lower than $1\times10^{13}$ cm$^{-3}$, yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

When a metal oxide is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductor 542a and the conductor 542b), a layer is sometimes formed between the conductor 542a and the oxide 530b and between the conductor 542b and the oxide 530b. The layer contains more oxygen than the conductor 542 does, and thus presumably has an insulating property. In this case, a three-layer structure of the conductor 542, the layer, and the oxide 530b can be regarded as a three-layer structure of a metal, an insulator, and a semiconductor and is sometimes referred to as an MIS (Metal-Insulator-Semiconductor) structure or a diode junction structure having an MIS structure as its main part.

The above layer is not necessarily formed between the conductor 542 and the oxide 530b; for example, the layer is sometimes formed between the conductor 542 and the oxide 530c, or the layer is sometimes formed between the conductor 542 and the oxide 530b and between the conductor 542 and the oxide 530c.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic proportion of the element M in constituent elements in the metal oxide used for the oxide 530a is preferably greater than the atomic proportion of the element M in constituent elements in the metal oxide used for the oxide 530b. Moreover, the atomic ratio of the element M to In in the metal oxide used for the oxide 530a is preferably greater than the atomic ratio of the element M to In in the metal oxide used for the oxide 530b. Furthermore, the atomic ratio of In to the element M in the metal oxide used for the oxide 530b is preferably greater than the atomic ratio of In to the element M in the metal oxide used for the oxide 530a. A metal oxide that can be used for the oxide 530a or the oxide 530b can be used for the oxide 530c.

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at an interface between the oxide 530a and the oxide 530b and an interface between the oxide 530b and the oxide 530c is preferably made low.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542 (the conductor 542a and the conductor 542b) functioning as the source electrode and the drain electrode is provided over the oxide 530b. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As illustrated in FIG. 8A, a region 543 (a region 543a and a region 543b) is sometimes formed as a low-resistance region at and near the interface between the oxide 530 and the conductor 542. In that case, the region 543a functions as one of a source region and a drain region, and the region 543b functions as the other of the source region and the drain region. The channel formation region is formed in a region between the region 543a and the region 543b.

When the conductor 542 is provided in contact with the oxide 530, the oxygen concentration in the region 543 sometimes decreases. In addition, a metal compound layer that contains the metal contained in the conductor 542 and the component of the oxide 530 is sometimes formed in the region 543. In such a case, the carrier concentration of the region 543 increases, and the region 543 becomes a low-resistance region.

The insulator 544 is provided to cover the conductor 542 and inhibits oxidation of the conductor 542. At this time, the insulator 544 may be provided to cover a side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used as the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542 is an oxidation-resistant material or is a material that does not significantly lose its conductivity even after absorbing oxygen. Design is appropriately set in consideration of required transistor characteristics.

The insulator 550 functions as a gate insulating film. The insulator 550 is preferably positioned in contact with an inner side (a top surface and a side surface) of the oxide 530c. The insulator 550 is preferably formed using an insulator from which oxygen is released by heating. An oxide film in which the amount of released oxygen converted into oxygen atoms is greater than or equal to $1.0 \times 10^{18}$ atoms/cm$^{-3}$, preferably greater than or equal to $1.0 \times 10^{19}$ atoms/cm$^{-3}$, further preferably greater than or equal to $2.0 \times 10^{19}$ atoms/cm$^{-3}$ or greater than or equal to $3.0 \times 10^{20}$ atoms/cm$^{-3}$ in TDS analysis is used, for example. Note that the temperature of the film surface in the TDS analysis is preferably higher than or equal to 100° C. and lower than or equal to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator from which oxygen is released by heating is provided as the insulator 550 in contact with the top surface of the oxide 530c, oxygen can be efficiently supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidization of the conductor 560 due to excess oxygen can be inhibited. For the metal oxide, a material that can be used for the insulator 544 is used.

Although the conductor 560 functioning as the first gate electrode has a two-layer structure in FIG. 8A and FIG. 8B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting oxygen diffusion, it is possible to inhibit a reduction in conductivity of the conductor 560b due to oxidation caused by oxygen contained in the insulator 550. As a conductive material having a function of inhibiting oxygen diffusion, for example, tantalum, tantalum nitride, ruthenium, ruthenium oxide, or the like is preferably used.

The conductor 560b is preferably formed using a conductive material containing tungsten, copper, or aluminum as its main component. The conductor 560b also functions as a wiring and thus is preferably formed using a conductor having high conductivity. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542 with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide, in which an excess-oxygen region can be easily formed in a later step, are preferable.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. Note that the concentration of impurities such as water or hydrogen in the insulator 580 is preferably lowered.

The opening of the insulator 580 is formed to overlap with a region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; hence, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 or the like, the concentration of impurities such as water or hydrogen in the insulator 581 is preferably lowered.

A conductor 540a and a conductor 540b are positioned in openings formed in the insulator 581, the insulator 574, the insulator 580, and the insulator 544. The conductor 540a and the conductor 540b are provided to face each other with the conductor 560 therebetween. The conductor 540a and the conductor 540b have a structure similar to that of a conductor 546 and that of a conductor 548 described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has a high blocking effect that inhibits the passage of both oxygen and impurities such as hydrogen and moisture which are factors of a change in electrical characteristics of the transistor. Accordingly, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. When a material with a relatively low permittivity is used for an interlayer film, the parasitic capacitance between wirings can be reduced. For example, a silicon oxide film, a silicon oxynitride film, or the like can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using a material similar to those for the conductor 328 and the conductor 330.

In addition, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each of which has a single-layer structure are illustrated in FIG. 7, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. The conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be inhibited and reliability can be improved in a semiconductor device using a transistor including an oxide semiconductor. Alternatively, a transistor including an oxide semiconductor and having a high on-state current can be provided. Alternatively, a transistor including an oxide semiconductor and having a low off-state current can be provided. Alternatively, a semiconductor device with low power consumption can be provided. Alternatively, a semiconductor device using a transistor including an oxide semiconductor can be miniaturized or highly integrated.

<Transistor Structure Examples>

Note that the structure of the transistor 500 in the semiconductor device described in this embodiment is not limited to the above. Examples of structures that can be used for the transistor 500 are described below.

<Transistor Structure Example 1>

Figure 9A:
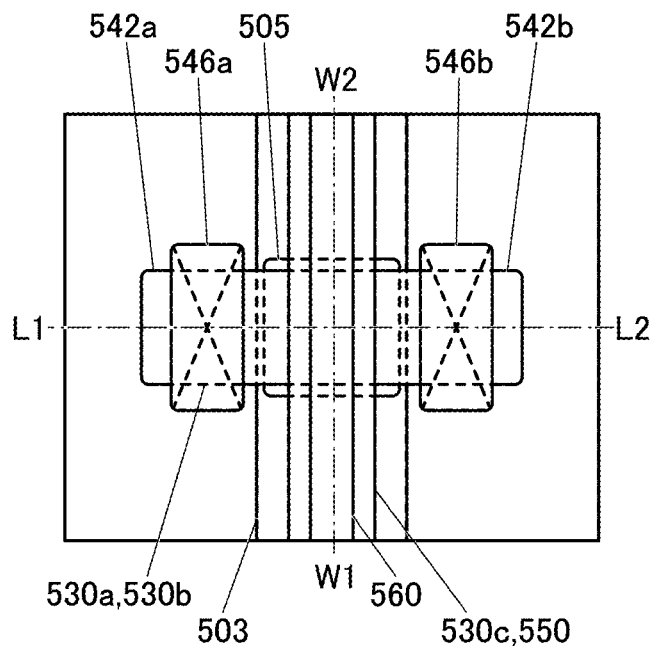
FIG. 9A is a top view illustrating a structure example of a transistor.
Figure 9C:
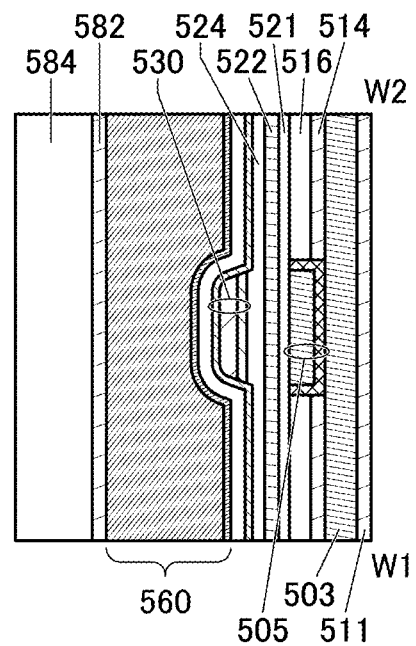
FIG. 9B and FIG. 9C are cross-sectional views illustrating the structure example of the transistor.
Figure 9B:
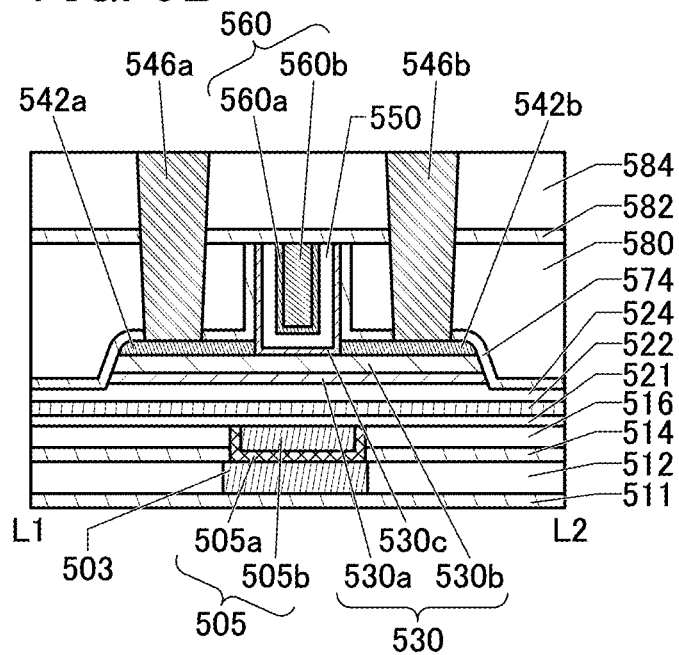

A structure example of a transistor 510A is described with reference to FIG. 9A, FIG. 9B, and FIG. 9C. FIG. 9A is a top view of the transistor 510A. FIG. 9B is a cross-sectional view of a portion indicated by a dashed-dotted line L1-L2 in FIG. 9A. FIG. 9C is a cross-sectional view of a portion indicated by a dashed-dotted line W1-W2 in FIG. 9A. Note that for clarification of the drawing, some components are not illustrated in the top view of FIG. 9A.

FIG. 9A, FIG. 9B, and FIG. 9C illustrate the transistor 510A and an insulator 511, the insulator 512, the insulator 514, the insulator 516, the insulator 580, the insulator 582, and an insulator 584 that function as interlayer films. In addition, the conductor 546 (a conductor 546a and a conductor 546b) that is electrically connected to the transistor 510A and functions as a contact plug, and the conductor 503 functioning as a wiring are illustrated. The conductor 546a and the conductor 546b may be collectively referred to as a conductor 546.

The transistor 510A includes the conductor 560 (the conductor 560a and the conductor 560b) functioning as a first gate electrode; a conductor 505 (a conductor 505a and a conductor 505b) functioning as a second gate electrode; the insulator 550 functioning as a first gate insulating film; an insulator 521, the insulator 522, and the insulator 524 that function as a second gate insulating film; the oxide 530 (the oxide 530a, the oxide 530b, and the oxide 530c) including a region where a channel is formed; the conductor 542a functioning as one of a source and a drain; the conductor 542b functioning as the other of the source and the drain; and the insulator 574.

In the transistor 510A illustrated in FIG. 9, the oxide 530c, the insulator 550, and the conductor 560 are positioned in an opening provided in the insulator 580 with the insulator 574 positioned therebetween. Moreover, the oxide 530c, the insulator 550, and the conductor 560 are positioned between the conductor 542a and the conductor 542b.

The insulator 511 and the insulator 512 function as interlayer films.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film that inhibits entry of impurities such as water or hydrogen into the transistor 510A from the substrate side. Accordingly, for the insulator 511, it is preferable to use an insulating material that has a function of inhibiting diffusion of impurities such as a hydrogen atom, a hydrogen molecule, a water molecule, and a copper atom (through which the above impurities do not easily pass). Alternatively, it is preferable to use an insulating material that has a function of inhibiting diffusion of oxygen (e.g., at least one of oxygen atoms, oxygen molecules, and the like) (through which the above oxygen does not easily pass). Moreover, aluminum oxide or silicon nitride, for example, may be used for the insulator 511. This structure can inhibit diffusion of impurities such as hydrogen and water to the transistor 510A side from the substrate side of the insulator 511.

For example, the permittivity of the insulator 512 is preferably lower than that of the insulator 511. When a material with a low permittivity is used for the interlayer film, the parasitic capacitance generated between wirings can be reduced.

The conductor 503 is formed to be embedded in the insulator 512. Here, the level of a top surface of the conductor 503 and the level of a top surface of the insulator 512 can be substantially the same. Note that although a structure in which the conductor 503 is a single layer is illustrated, the present invention is not limited thereto. For example, the conductor 503 may have a multilayer structure of two or more layers. Note that for the conductor 503, a conductive material that has high conductivity and contains tungsten, copper, or aluminum as its main component is preferably used.

In the transistor 510A, the conductor 560 sometimes functions as a first gate (also referred to as top gate) electrode. The conductor 505 sometimes functions as a second gate (also referred to as bottom gate) electrode. In that case, the threshold voltage of the transistor 510A can be controlled by changing a potential applied to the conductor 505 independently of a potential applied to the conductor 560. In particular, the threshold voltage of the transistor 510A can be higher than 0 V and the off-state current can be reduced by applying a negative potential to the conductor 505. Thus, drain current at the time when a potential applied to the conductor 560 is 0 V can be lower in the case where a negative potential is applied to the conductor 505 than in the case where a negative potential is not applied to the conductor 505.

For example, when the conductor 505 and the conductor 560 are provide to overlap with each other, in the case where a potential is applied to the conductor 560 and the conductor 505, an electric field generated from the conductor 560 and an electric field generated from the conductor 505 are connected and can cover a channel formation region formed in the oxide 530.

That is, the channel formation region can be electrically surrounded by the electric field of the conductor 560 having a function of the first gate electrode and the electric field of the conductor 505 having a function of the second gate electrode. In other words, the transistor has a surrounded channel (S-channel) structure, like the transistor 500 described above.

Like the insulator 511 or the insulator 512, the insulator 514 and the insulator 516 function as interlayer films. For example, the insulator 514 preferably functions as a barrier film that inhibits entry of impurities such as water or hydrogen into the transistor 510A from the substrate side. This structure can inhibit diffusion of impurities such as hydrogen and water to the transistor 510A side from the substrate side of the insulator 514. Moreover, for example, the insulator 516 preferably has a lower permittivity than the insulator 514. When a material with a low permittivity is used for the interlayer film, the parasitic capacitance generated between wirings can be reduced.

In the conductor 505 functioning as the second gate, the conductor 505a is formed in contact with an inner wall of an opening in the insulator 514 and the insulator 516, and the conductor 505b is formed further inside. Here, the top surfaces of the conductor 505a and the conductor 505b and the top surface of the insulator 516 can be substantially level with each other. Although the transistor 510A having a structure in which the conductor 505a and the conductor 505b are stacked is illustrated, the present invention is not limited thereto. For example, the conductor 505 may have a single-layer structure or a stacked-layer structure of three or more layers.

Here, for the conductor 505a, a conductive material that has a function of inhibiting diffusion of impurities such as a hydrogen atom, a hydrogen molecule, a water molecule, and a copper atom (through which the above impurities are less likely to pass) is preferably used. Alternatively, it is preferable to use a conductive material that has a function of inhibiting diffusion of oxygen (e.g., at least one of oxygen atoms, oxygen molecules, and the like) (through which the above oxygen does not easily pass). Note that in this specification and the like, a function of inhibiting diffusion of impurities or oxygen means a function of inhibiting diffusion of any one or all of the above impurities and the above oxygen.

For example, when the conductor 505a has a function of inhibiting diffusion of oxygen, a reduction in conductivity of the conductor 505b due to oxidation can be inhibited.

In the case where the conductor 505 doubles as a wiring, the conductor 505b is preferably formed using a conductive material that has high conductivity and contains tungsten, copper, or aluminum as its main component. In that case, the conductor 503 is not necessarily provided. Note that the conductor 505b is illustrated as a single layer but may have a stacked-layer structure, for example, a stack of any of the above conductive materials and titanium or titanium nitride.

The insulator 521, the insulator 522, and the insulator 524 each have a function of a second gate insulating film.

The insulator 522 preferably has a barrier property. The insulator 522 having a barrier property functions as a layer that inhibits entry of impurities such as hydrogen into the transistor 510A from the surroundings of the transistor 510A.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current may arise because of a thinner gate insulating film. When a high-k material is used for an insulator functioning as the gate insulating film, a gate potential during operation of the transistor can be reduced while the physical thickness is maintained.

It is preferable that the insulator 521 be thermally stable. For example, silicon oxide and silicon oxynitride, which have thermal stability, are preferable. Furthermore, when an insulator which is a high-k material is combined with silicon oxide or silicon oxynitride, the insulator 521 having a stacked-layer structure that has thermal stability and a high relative permittivity can be obtained.

Note that the second gate insulating film is shown to have a three-layer stacked structure in FIG. 9, but may have a single-layer structure or a stacked-layer structure of two or more layers. In that case, without limitation to a stacked-layer structure formed of the same material, a stacked-layer structure formed of different materials may be employed.

The oxide 530 including a region functioning as the channel formation region includes the oxide 530a, the oxide 530b over the oxide 530a, and the oxide 530c over the oxide

530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the above-described oxide semiconductor, which is one kind of metal oxide, can be used.

Note that the oxide 530c is preferably provided in the opening in the insulator 580 with the insulator 574 positioned therebetween. When the insulator 574 has a barrier property, diffusion of impurities from the insulator 580 into the oxide 530 can be inhibited.

One of the conductors 542 functions as a source electrode and the other functions as a drain electrode.

For the conductor 542a and the conductor 542b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and its oxidation resistance is high.

Although a single-layer structure is illustrated in FIG. 9, a stacked-layer structure of two or more layers may be employed. For example, a tantalum nitride film and a tungsten film may be stacked. Alternatively, a titanium film and an aluminum film may be stacked. Further alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

A three-layer structure consisting of a titanium film or a titanium nitride film, an aluminum film or a copper film stacked over the titanium film or the titanium nitride film, and a titanium film or a titanium nitride film formed thereover; a three-layer structure consisting of a molybdenum film or a molybdenum nitride film, an aluminum film or a copper film stacked over the molybdenum film or the molybdenum nitride film, and a molybdenum film or a molybdenum nitride film formed thereover; or the like may be employed. Note that a transparent conductive material containing indium oxide, tin oxide, or zinc oxide may be used.

A barrier layer may be provided over the conductor 542. The barrier layer is preferably formed using a material having a barrier property against oxygen or hydrogen. This structure can inhibit oxidation of the conductor 542 at the time of deposition of the insulator 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductor 542 can be expanded. For example, a material having a low oxidation resistance and high conductivity, such as tungsten or aluminum, can be used for the conductor 542. Moreover, for example, a conductor that can be easily deposited or processed can be used.

The insulator 550 functions as a first gate insulating film. The insulator 550 is preferably provided in the opening in the insulator 580 with the oxide 530c and the insulator 574 positioned therebetween.

As miniaturization and high integration of transistors progress, a problem such as leakage current may arise because of thinner gate insulating film. In that case, the insulator 550 may have a stacked-layer structure like the second gate insulating film. When the insulator functioning as the gate insulating film has a stacked-layer structure of a high-k material and a thermally stable material, a gate potential during operation of the transistor can be reduced while the physical thickness is maintained. Furthermore, the stacked-layer structure can be thermally stable and have a high relative permittivity.

The conductor 560 functioning as a first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

As a conductive material having a function of inhibiting diffusion of oxygen, for example, tantalum, tantalum nitride, ruthenium, or ruthenium oxide is preferably used. For the conductor 560a, the oxide semiconductor that can be used as the oxide 530 can be used. In that case, when the conductor 560b is deposited by a sputtering method, the conductor 560a can have a reduced electric resistance value to be a conductor. This can be referred to as an OC (Oxide Conductor) electrode.

The conductor 560b is preferably formed using a conductive material containing tungsten, copper, or aluminum as its main component. The conductor 560 functions as a wiring and thus is preferably formed using a conductor having high conductivity. For example, a conductive material containing tungsten, copper, or aluminum as its main component can be used. The conductor 560b may have a stacked-layer structure, for example, a stack of any of the above conductive materials and titanium or titanium nitride.

The insulator 574 is positioned between the insulator 580 and the transistor 510A. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit diffusion of impurities such as water and hydrogen contained in the insulator 580 into the oxide 530b through the oxide 530c and the insulator 550. Furthermore, oxidation of the conductor 560 due to excess oxygen contained in the insulator 580 can be inhibited.

The insulator 580, the insulator 582, and the insulator 584 function as interlayer films.

Like the insulator 514, the insulator 582 preferably functions as a barrier insulating film that inhibits entry of impurities such as water or hydrogen into the transistor 510A from the outside.

Like the insulator 516, the insulator 580 and the insulator 584 preferably have a lower permittivity than the insulator 582. When a material with a low permittivity is used for the interlayer films, the parasitic capacitance generated between wirings can be reduced.

The transistor 510A may be electrically connected to another component through a plug or a wiring such as the conductor 546 embedded in the insulator 580, the insulator 582, and the insulator 584.

As a material for the conductor 546, a conductive material such as a metal material, an alloy material, a metal nitride material, or a metal oxide material can be used as a single layer or stacked layers, as in the conductor 505. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductor 546 has a stacked-layer structure of tantalum nitride or the like, which is a conductor having a barrier property against hydrogen and oxygen, and tungsten, which has high conductivity, diffusion of impurities from the outside can be inhibited while the conductivity of a wiring is maintained.

With the above structure, a semiconductor device including a transistor that contains an oxide semiconductor and has a high on-state current can be provided. Alternatively, a semiconductor device using a transistor that contains an oxide semiconductor and has a low off-state current can be provided. Alternatively, a semiconductor device that has small variations in electrical characteristics, stable electrical characteristics, and high reliability can be provided.

<Transistor Structure Example 2>

Figure 10A:
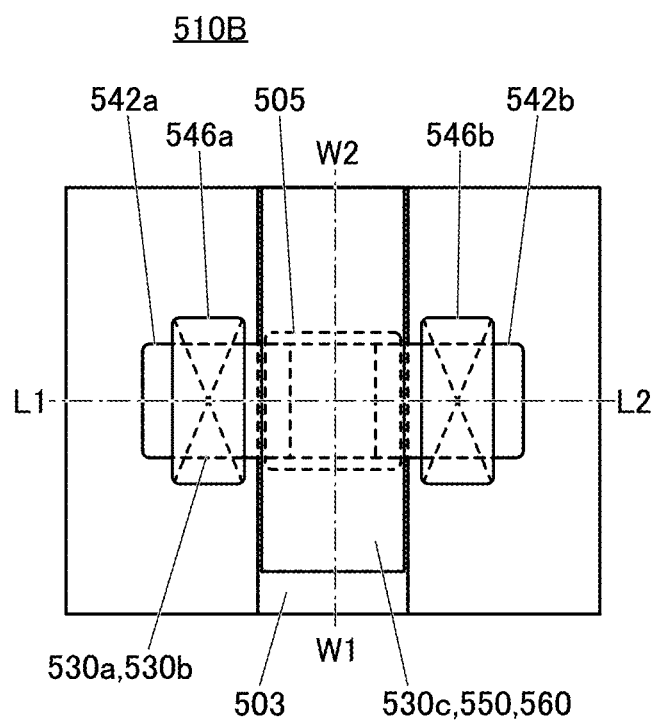
FIG. 10A is a top view illustrating a structure example of a transistor.
Figure 10C:
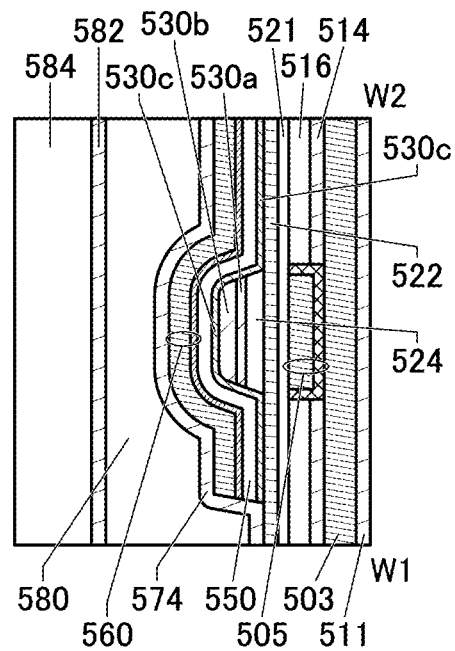
FIG. 10B and FIG. 10C are cross-sectional views illustrating the structure example of the transistor.
Figure 10B:
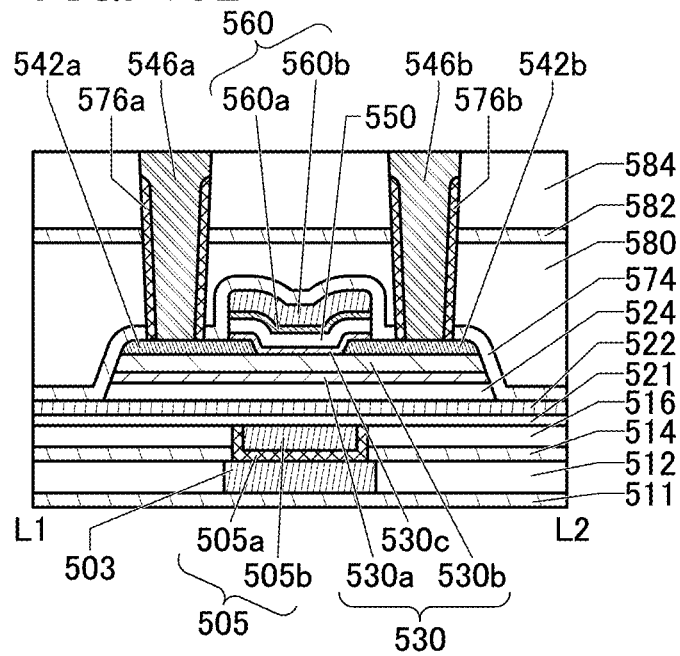

A structure example of a transistor 510B is described with reference to FIG. 10A, FIG. 10B, and FIG. 10C. FIG. 10A is a top view of the transistor 510B. FIG. 10B is a cross-sectional view of a portion indicated by a dashed-dotted line L1-L2 in FIG. 10A. FIG. 10C is a cross-sectional view of a portion indicated by a dashed-dotted line W1-W2 in FIG. 10A. Note that for clarification of the drawing, some components are not illustrated in the top view of FIG. 10A.

The transistor 510B is a variation example of the transistor 510A. Therefore, differences from the transistor 510A are mainly described to avoid repeated description.

The transistor 510B includes a region where the conductor 542 (the conductor 542a and the conductor 542b), the oxide 530c, the insulator 550, and the conductor 560 overlap with each other. With this structure, a transistor having a high on-state current can be provided. Moreover, a transistor having high controllability can be provided.

The conductor 560 functioning as a first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

The insulator 574 is preferably provided to cover the top surface and a side surface of the conductor 560, a side surface of the insulator 550, and the side surface of the oxide 530c. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit oxidation of the conductor 560. Moreover, the insulator 574 can inhibit diffusion of impurities such as water and hydrogen contained in the insulator 580 into the transistor 510B.

An insulator 576 (an insulator 576a and an insulator 576b) having a barrier property may be provided between the conductor 546 and the insulator 580. Providing the insulator 576 can inhibit oxygen in the insulator 580 from reacting with the conductor 546 and oxidizing the conductor 546.

Furthermore, with the insulator 576 having a barrier property, the range of choices for the material of the conductor used as the plug or the wiring can be expanded. The use of a metal material having an oxygen absorbing property and high conductivity for the conductor 546, for example, can provide a semiconductor device with low power consumption. Specifically, a material having a low oxidation resistance and high conductivity, such as tungsten or aluminum, can be used. Moreover, for example, a conductor that can be easily deposited or processed can be used.

<Transistor Structure Example 3>

Figure 11A:
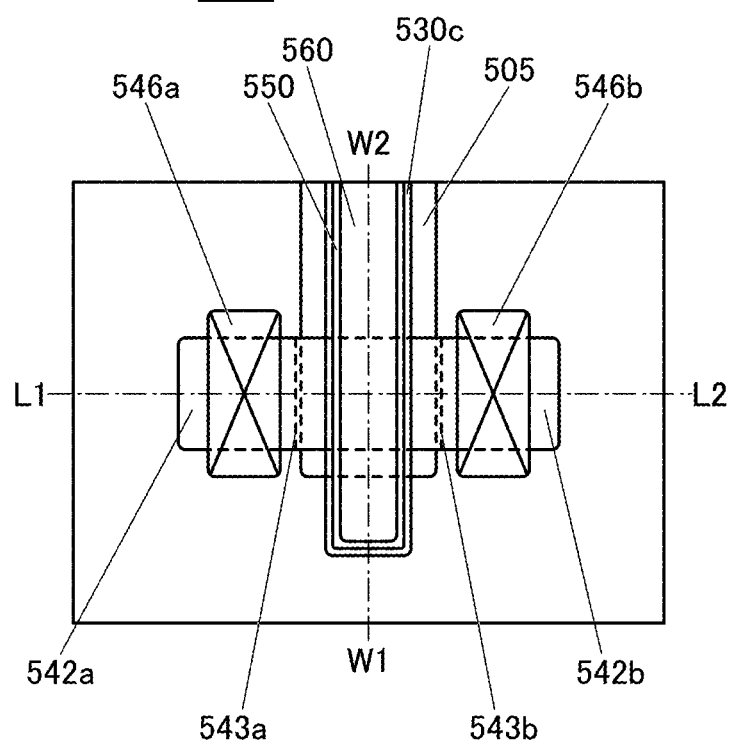
FIG. 11A is a top view illustrating a structure example of a transistor.
Figure 11C:
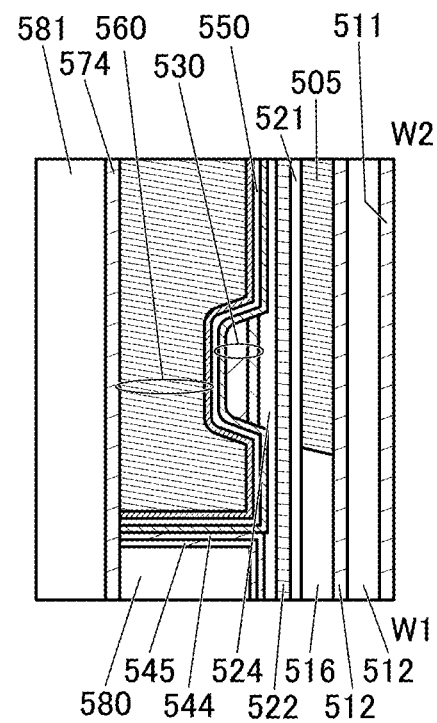
FIG. 11B and FIG. 11C are cross-sectional views illustrating the structure example of the transistor.
Figure 11B:
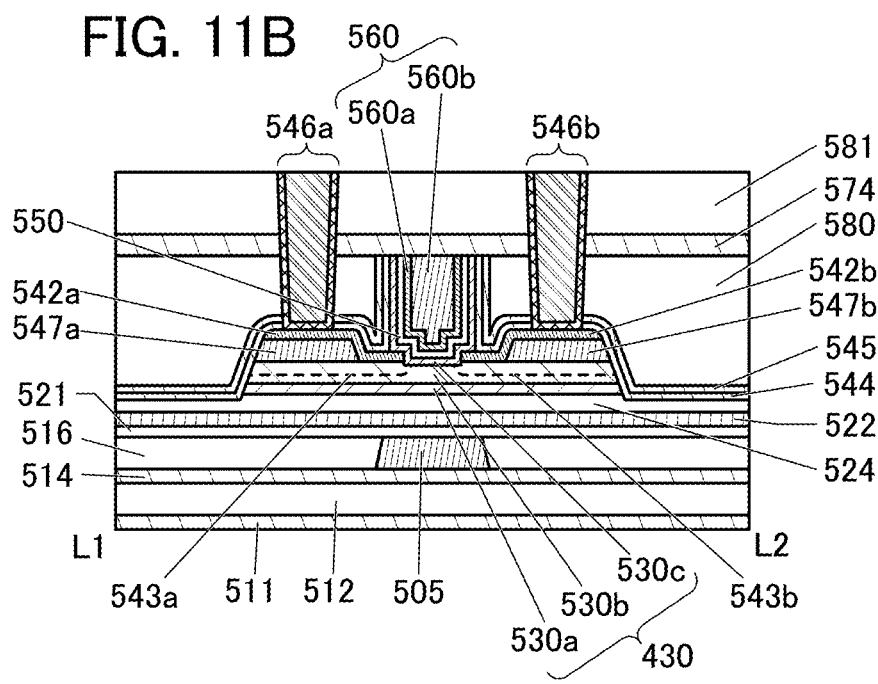

A structure example of a transistor 510C is described with reference to FIG. 11A, FIG. 11B, and FIG. 11C. FIG. 11A is a top view of the transistor 510C. FIG. 11B is a cross-sectional view of a portion indicated by a dashed-dotted line L1-L2 in FIG. 11A. FIG. 11C is a cross-sectional view of a portion indicated by a dashed-dotted line W1-W2 in FIG. 11A. Note that for clarification of the drawing, some components are not illustrated in the top view of FIG. 11A.

The transistor 510C is a variation example of the transistor 510A. Therefore, differences from the transistor 510A are mainly described to avoid repeated description.

In the transistor 510C illustrated in FIG. 11, a conductor 547a is positioned between the conductor 542a and the oxide 530b, and a conductor 547b is positioned between the conductor 542b and the oxide 530b. Here, the conductor 542a (the conductor 542b) has a region that extends beyond the top surface and its side surface on the conductor 560 side of the conductor 547a (the conductor 547b) and is in contact with a top surface of the oxide 530b. For the conductor 547, a conductor that can be used for the conductor 542 is used. It is preferred that the thickness of the conductor 547 be at least greater than that of the conductor 542. The conductor 547a and the conductor 547b may be collectively referred to as the conductor 547.

In the transistor 510C illustrated in FIG. 11, because of the above structure, the conductor 542 can be closer to the conductor 560 than in the transistor 510A. Alternatively, the conductor 560 and an end portion of the conductor 542a and an end portion of the conductor 542b can overlap with each other. Accordingly, the effective channel length of the transistor 510C can be shortened, and the on-state current and the frequency characteristics can be improved.

The conductor 547a (the conductor 547b) is preferably provided to be overlapped by the conductor 542a (the conductor 542b). With such a structure, the conductor 547a (the conductor 547b) can function as a stopper to prevent over-etching of the oxide 530b in etching for forming the opening in which the conductor 546a (the conductor 546b) is to be embedded.

The transistor 510C illustrated in FIG. 11 may have a structure in which an insulator 545 is positioned on and in contact with the insulator 544. The insulator 544 preferably functions as a barrier insulating film that inhibits entry of impurities such as water or hydrogen and excess oxygen into the transistor 510C from the insulator 580 side. The insulator 545 can be formed using an insulator that can be used for the insulator 544. In addition, the insulator 544 may be formed using a nitride insulator such as aluminum nitride, aluminum titanium nitride, titanium nitride, silicon nitride, or silicon nitride oxide, for example.

Unlike in the transistor 510A illustrated in FIG. 9, in the transistor 510C illustrated in FIG. 11, the conductor 505 may be provided to have a single-layer structure. In this case, an insulating film to be the insulator 516 is deposited over the patterned conductor 505, and an upper portion of the insulating film is removed by a CMP method or the like until the top surface of the conductor 505 is exposed. Preferably, the planarity of a top surface of the conductor 505 is made favorable. For example, the average surface roughness (Ra) of the top surface of the conductor 505 is less than or equal to 1 nm, preferably less than or equal to 0.5 nm, further preferably less than or equal to 0.3 nm. This allows the improvement in planarity of an insulating layer formed over the conductor 505 and the increase in crystallinity of the oxide 530b and the oxide 530c.

<Transistor Structure Example 4>

Figure 12A:
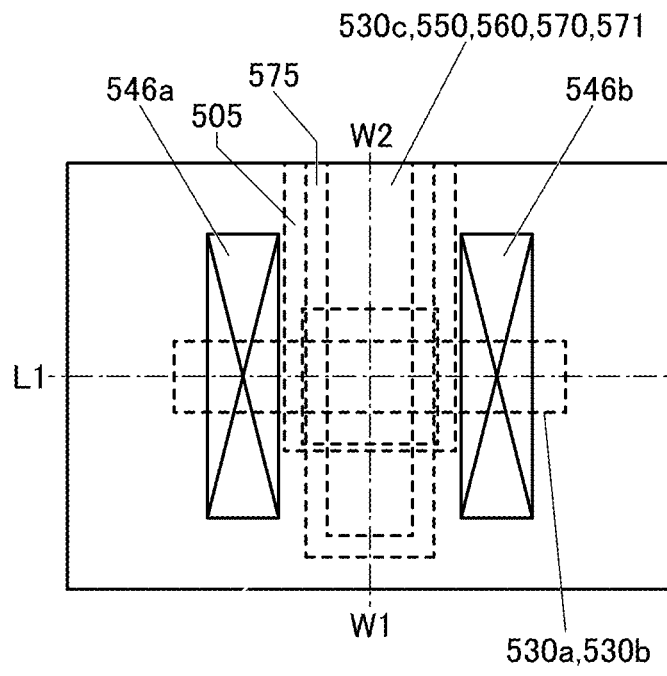
FIG. 12A is a top view illustrating a structure example of a transistor.
Figure 12C:
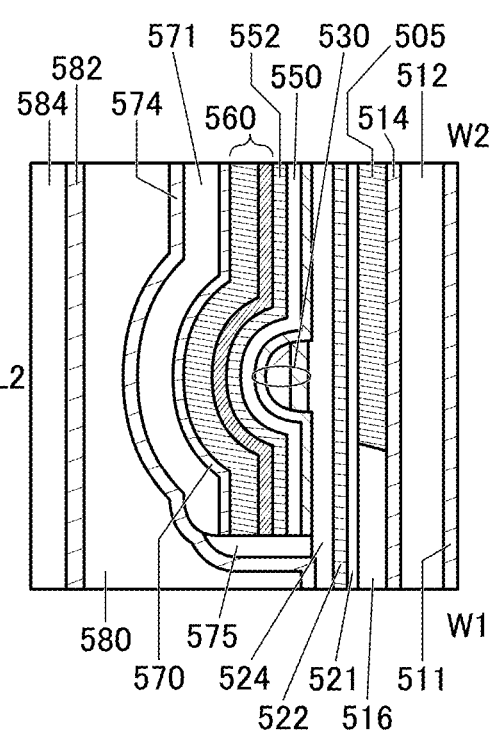
FIG. 12B and FIG. 12C are cross-sectional views illustrating the structure example of the transistor.
Figure 12B:
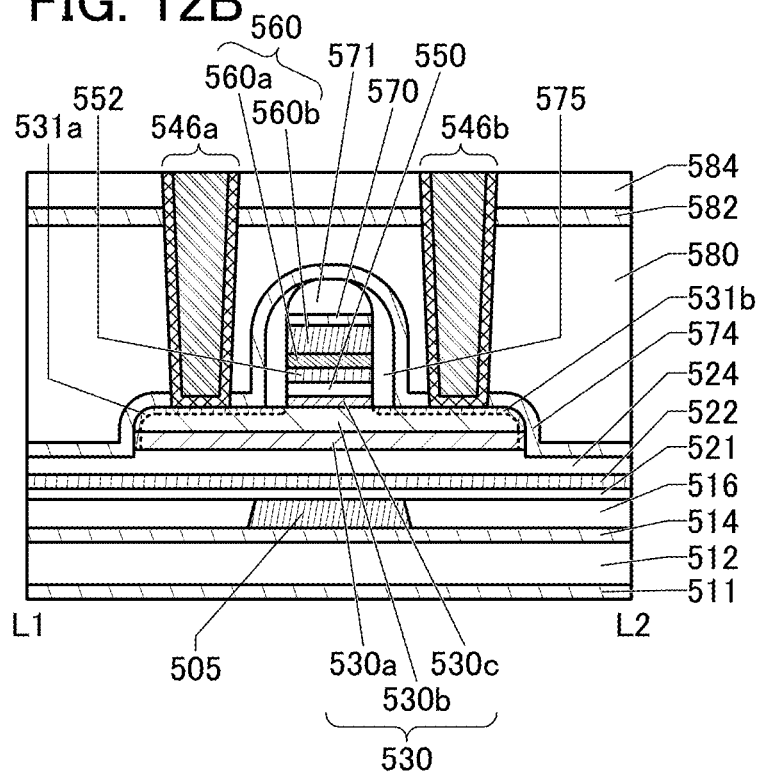

A structure example of a transistor 510D is described with reference to FIG. 12A, FIG. 12B, and FIG. 12C. FIG. 12A is a top view of the transistor 510D. FIG. 12B is a cross-sectional view of a portion indicated by a dashed-dotted line L1-L2 in FIG. 12A. FIG. 12C is a cross-sectional view of a portion indicated by a dashed-dotted line W1-W2 in FIG. 12A. Note that for clarification of the drawing, some components are not illustrated in the top view of FIG. 12A.

The transistor 510D is a variation example of the above transistors. Therefore, differences from the above transistors are mainly described to avoid repeated description.

In FIG. 12A to FIG. 12C, the conductor 503 is not provided and the conductor 505 that has a function of a second gate is made to function also as a wiring. Furthermore, the insulator 550 is provided over the oxide 530c and a metal oxide 552 is provided over the insulator 550. The conductor 560 is provided over the metal oxide 552 and an insulator 570 is provided over the conductor 560. An insulator 571 is provided over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidization of the conductor 560 due to oxygen can be inhibited.

Note that the metal oxide 552 may have a function of part of a first gate. For example, an oxide semiconductor that can be used for the oxide 530 can be used for the metal oxide 552. In this case, when the conductor 560 is deposited by a sputtering method, the metal oxide 552 can have a reduced electric resistance value to be a conductive layer. This can be called an OC (Oxide Conductor) electrode.

The metal oxide 552 may have a function of part of a gate insulating film. Thus, when silicon oxide, silicon oxynitride, or the like is used for the insulator 550, a metal oxide that is a high-k material with a high relative permittivity is preferably used for the metal oxide 552. Such a stacked-layer structure can be thermally stable and can have a high relative permittivity. Thus, a gate potential that is applied during operation of the transistor can be reduced while the physical thickness is maintained. In addition, the equivalent oxide thickness (EOT) of the insulating layer functioning as the gate insulating film can be reduced.

Although the metal oxide 552 in the transistor 510D is shown as a single layer, the metal oxide 552 may have a stacked-layer structure of two or more layers. For example, a metal oxide functioning as part of a gate electrode and a metal oxide functioning as part of the gate insulating film may be stacked.

With the metal oxide 552 functioning as a gate electrode, the on-state current of the transistor 510D can be increased without a reduction in the influence of the electric field from the conductor 560. With the metal oxide 552 functioning as the gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric field applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable since it is less likely to be crystallized by heat treatment in a later step. Note that the metal oxide 552 is not an essential structure. Design is appropriately set in consideration of required transistor characteristics.

For the insulator 570, an insulating material having a function of inhibiting the passage of oxygen and impurities such as water or hydrogen is preferably used. For example, aluminum oxide or hafnium oxide is preferably used. Thus, oxidization of the conductor 560 due to oxygen from above the insulator 570 can be inhibited. Moreover, entry of impurities such as water or hydrogen from above the insulator 570 into the oxide 530 through the conductor 560 and the insulator 550 can be inhibited.

The insulator 571 functions as a hard mask. By providing the insulator 571, the conductor 560 can be processed to have a side surface that is substantially vertical; specifically, an angle formed by the side surface of the conductor 560 and a surface of the substrate can be greater than or equal to 75° and less than or equal to 100°, preferably greater than or equal to 80° and less than or equal to 95°.

An insulating material having a function of inhibiting the passage of oxygen and impurities such as water or hydrogen may be used for the insulator 571 so that the insulator 571 also functions as a barrier layer. In that case, the insulator 570 does not have to be provided.

Parts of the insulator 570, the conductor 560, the metal oxide 552, the insulator 550, and the oxide 530c are selected and removed using the insulator 571 as a hard mask, whereby their side surfaces can be substantially aligned with each other and a surface of the oxide 530b can be partly exposed.

The transistor 510D includes a region 531a and a region 531b on part of the exposed surface of the oxide 530b. One of the region 531a and the region 531b functions as a source region, and the other functions as a drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an "impurity element" refers to an element other than main constituent elements.

Alternatively, the region 531a and the region 531b can be formed in such manner that, after part of the surface of the oxide 530b is exposed, a metal film is deposited and then heat treatment is performed so that the element contained in the metal film is diffused into the oxide 530b.

The electrical resistivity of regions of the oxide 530b to which the impurity element is added decreases. For that reason, the region 531a and the region 531b are sometimes referred to as "impurity regions" or "low-resistance regions".

The region 531a and the region 531b can be formed in a self-aligned manner by using the insulator 571 and/or the conductor 560 as a mask. Accordingly, the conductor 560 does not overlap with the region 531a and/or the region 531b, so that the parasitic capacitance can be reduced. Moreover, an offset region is not formed between a channel formation region and the source/drain region (the region 531a or the region 531b). The formation of the region 531a and the region 531b in a self-aligned manner achieves an increase in on-state current, a reduction in threshold voltage, and an improvement in operating frequency, for example.

Note that an offset region may be provided between the channel formation region and the source/drain region in order to further reduce the off-state current. The offset region is a region where the electrical resistivity is high and a region where the above-described addition of the impurity element is not performed. The offset region can be formed by the above-described addition of the impurity element after the formation of an insulator 575. In this case, the insulator 575 serves as a mask like the insulator 571 or the like. Thus, the impurity element is not added to a region of the oxide 530b overlapped by the insulator 575, so that the electrical resistivity of the region can be kept high.

The transistor 510D includes the insulator 575 on the side surfaces of the insulator 570, the conductor 560, the metal oxide 552, the insulator 550, and the oxide 530c. The insulator 575 is preferably an insulator having a low relative permittivity. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 510D also includes the insulator 574 over the insulator 575 and the oxide 530. The insulator 574 is preferably deposited by a sputtering method. When a sputtering method is used, an insulator containing few impurities such as water or hydrogen can be deposited. For example, aluminum oxide is preferably used for the insulator 574.

Note that an oxide film obtained by a sputtering method may extract hydrogen from the structure body over which the oxide film is deposited. Thus, the hydrogen concentration in the oxide 530 and the insulator 575 can be reduced when the insulator 574 absorbs hydrogen and water from the oxide 530 and the insulator 575.

<Transistor Structure Example 5>

Figure 13A:
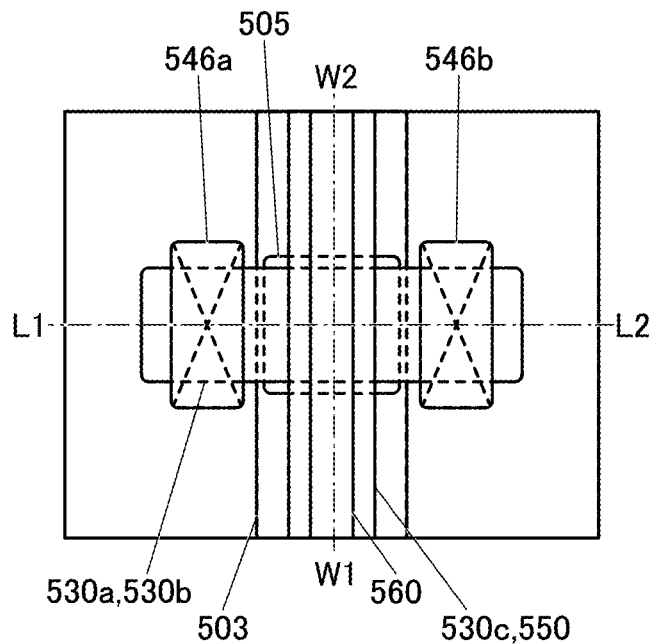
FIG. 13A is a top view illustrating a structure example of a transistor.
Figure 13C:
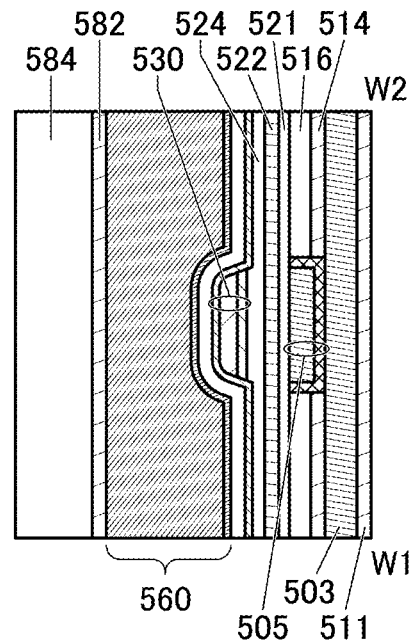
FIG. 13B and FIG. 13C are cross-sectional views illustrating the structure example of the transistor.
Figure 13B:
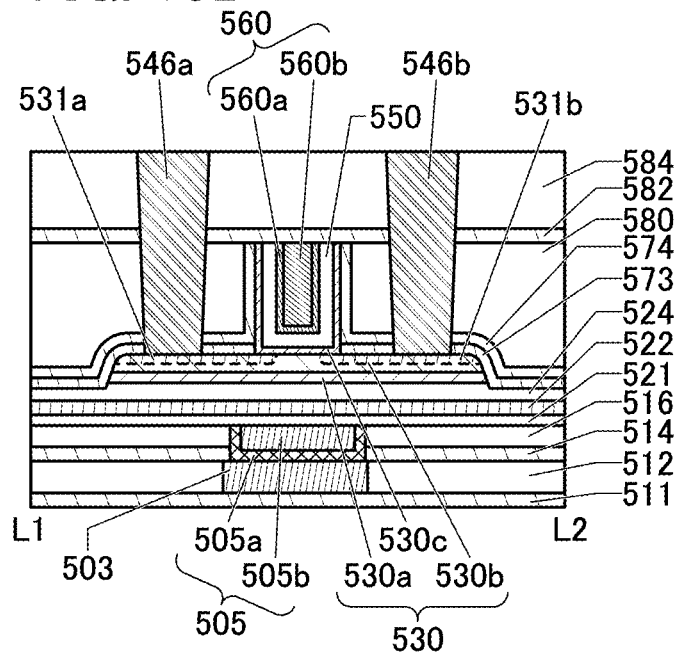

A structure example of a transistor 510E is described with reference to FIG. 13A to FIG. 13C. FIG. 13A is a top view of the transistor 510E. FIG. 13B is a cross-sectional view of a portion indicated by a dashed-dotted line L1-L2 in FIG. 13A. FIG. 13C is a cross-sectional view of a portion indicated by a dashed-dotted line W1-W2 in FIG. 13A. Note that for clarification of the drawing, some components are not illustrated in the top view of FIG. 13A.

The transistor 510E is a variation example of the above transistors. Therefore, differences from the above transistors are mainly described to avoid repeated description.

In FIG. 13A to FIG. 13C, the conductor 542 is not provided, and part of the exposed surface of the oxide 530b includes the region 531a and the region 531b. One of the region 531a and the region 531b functions as a source region, and the other functions as a drain region. Moreover, an insulator 573 is included between the oxide 530b and the insulator 574.

The regions 531 (the region 531a and the region 531b) illustrated in FIG. 13 are regions where an element to be described below is added to the oxide 530b. The regions 531 can be formed with the use of a dummy gate, for example.

Specifically, a dummy gate is provided over the oxide 530b, and the above element that reduces the resistance of the oxide 530b is added using the dummy gate as a mask. That is, the element is added to regions of the oxide 530 that are not overlapped by the dummy gate, whereby the regions 531 are formed. As a method of adding the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Moreover, hydrogen, carbon, nitrogen, fluorine, sulfur, chlorine, titanium, a rare gas, or the like may be used. Typical examples of the rare gas include helium, neon, argon, krypton, and xenon. The concentration of the element is measured by secondary ion mass spectrometry (SIMS) or the like.

In particular, boron and phosphorus are preferable because an apparatus used in a manufacturing line for amorphous silicon or low-temperature polysilicon can be used. Since the existing facility can be used, capital investment can be reduced.

Next, an insulating film to be the insulator 573 and an insulating film to be the insulator 574 may be deposited over the oxide 530b and the dummy gate. Stacking the insulating film to be the insulator 573 and the insulating film to be the insulator 574 can provide a region where the region 531, the oxide 530c, and the insulator 550 overlap with each other.

Specifically, after an insulating film to be the insulator 580 is provided over the insulating film to be the insulator 574, the insulating film to be the insulator 580 is subjected to CMP (Chemical Mechanical Polishing) treatment, whereby part of the insulating film to be the insulator 580 is removed and the dummy gate is exposed. Then, when the dummy gate is removed, part of the insulator 573 in contact with the dummy gate is preferably also removed. Thus, the insulator 574 and the insulator 573 are exposed at a side surface of an opening provided in the insulator 580, and the region 531 provided in the oxide 530b is partly exposed at the bottom surface of the opening. Next, an oxide film to be the oxide 530c, an insulating film to be the insulator 550, and a conductive film to be the conductor 560 are deposited in this order in the opening, and then an oxide film to be the oxide 530c, an insulating film to be the insulator 550, and a conductive film to be the conductor 560 are partly removed by CMP treatment or the like until the insulator 580 is exposed; thus, the transistor illustrated in FIG. 13 can be formed.

Note that the insulator 573 and the insulator 574 are not essential components. Design is appropriately set in consideration of required transistor characteristics.

The cost of the transistor illustrated in FIG. 13 can be reduced because an existing apparatus can be used and the conductor 542 is not provided.

<Transistor Structure Example 6>

Figure 14A:
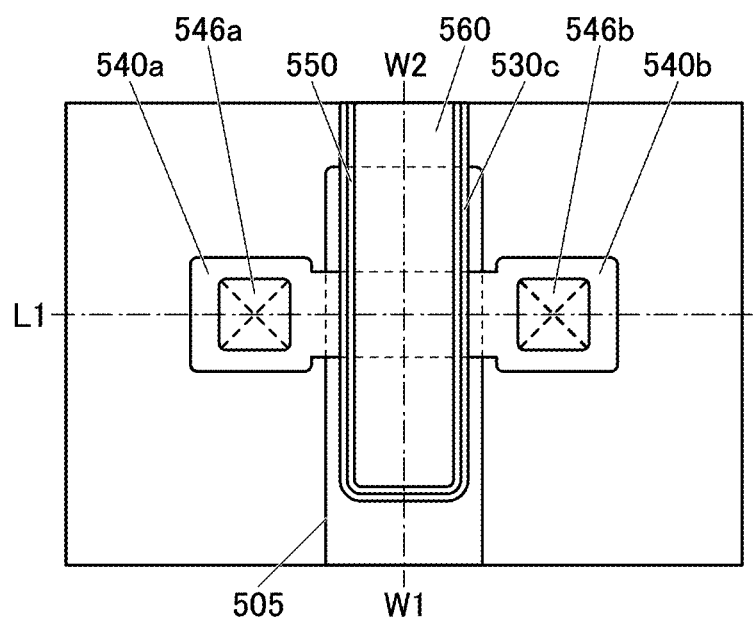
FIG. 14A is a top view illustrating a structure example of a transistor.
Figure 14C:
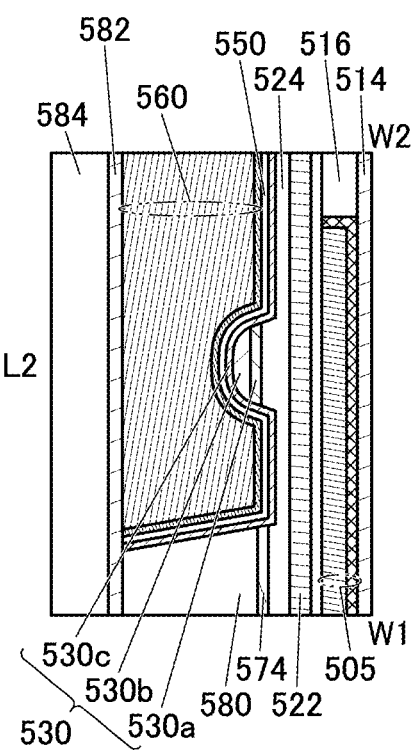
FIG. 14B and FIG. 14C are cross-sectional views illustrating the structure example of the transistor.
Figure 14B:
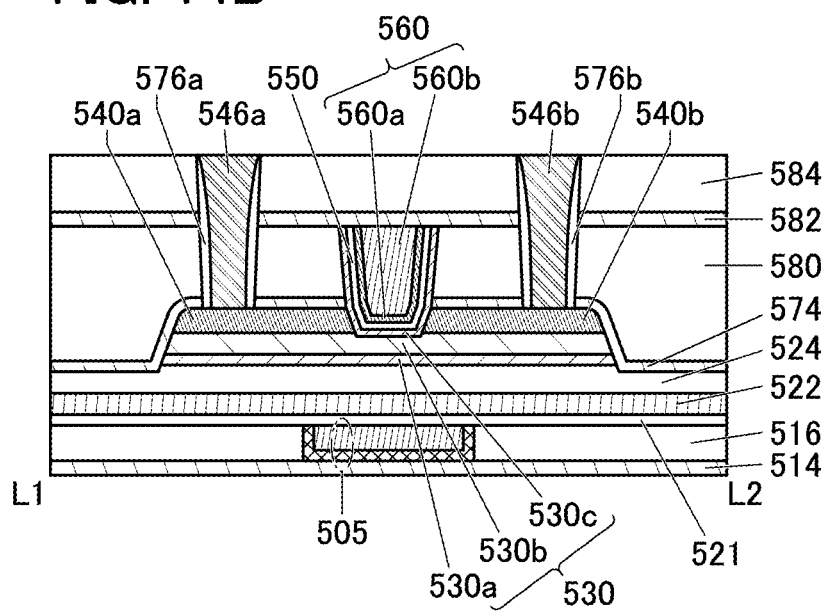

A structure example of a transistor 510F is described with reference to FIG. 14A to FIG. 14C. FIG. 14A is a top view of the transistor 510F. FIG. 14B is a cross-sectional view of a portion indicated by a dashed-dotted line L1-L2 in FIG. 14A. FIG. 14C is a cross-sectional view of a portion indicated by a dashed-dotted line W1-W2 in FIG. 14A. Note that for clarification of the drawing, some components are not illustrated in the top view of FIG. 14A.

The transistor 510F is a variation example of the transistor 510A. Therefore, differences from the above transistors are mainly described to avoid repeated description.

In the transistor 510A, part of the insulator 574 is provided in the opening provided in the insulator 580 to cover a side surface of the conductor 560. Meanwhile, in the transistor 510F, an opening is formed by partly removing the insulator 580 and the insulator 574.

An insulator 576 (an insulator 576a and an insulator 576b) having a barrier property may be provided between the conductor 546 and the insulator 580. Providing the insulator 576 can inhibit oxygen in the insulator 580 from reacting with the conductor 546 and oxidizing the conductor 546.

Note that when an oxide semiconductor is used as the oxide 530, the oxide 530 preferably has a stacked-layer structure of a plurality of oxide layers that differ in the atomic ratio of metal atoms. Specifically, the atomic proportion of the element M in constituent elements in the metal oxide used for the oxide 530a is preferably greater than the atomic proportion of the element M in constituent elements in the metal oxide used for the oxide 530b. Moreover, the atomic ratio of the element M to In in the metal oxide used for the oxide 530a is preferably greater than the atomic ratio of the element M to In in the metal oxide used for the oxide 530b. Furthermore, the atomic ratio of In to the element M in the metal oxide used for the oxide 530b is preferably greater than the atomic ratio of In to the element M in the metal oxide used for the oxide 530a. A metal oxide that can be used for the oxide 530a or the oxide 530b can be used for the oxide 530c.

The oxide 530a, the oxide 530b, and the oxide 530c preferably have crystallinity, and in particular, it is preferable to use a CAAC-OS. An oxide having crystallinity, such as a CAAC-OS, has a dense structure with small amounts of impurities and defects (e.g., oxygen vacancies) and high crystallinity. This can inhibit extraction of oxygen from the oxide 530b by the source electrode or the drain electrode. This can reduce extraction of oxygen from the oxide 530b even when heat treatment is performed; hence, the transistor 510F is stable against high temperatures in the manufacturing process (what is called thermal budget).

Note that one or both of the oxide 530a and the oxide 530c may be omitted. The oxide 530 may be a single layer of the oxide 530b. In the case where the oxide 530 is a stack of the oxide 530a, the oxide 530b, and the oxide 530c, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b. In that case, for the oxide 530c, a metal oxide that can be used for the oxide 530a is preferably used. Specifically, the atomic ratio of the element M to the constituent elements in the metal oxide used as the oxide 530c is preferably greater than the atomic ratio of the element M to the constituent elements in the metal oxide used as the oxide 530b. Moreover, the atomic ratio of the element M to In in the metal oxide used as the oxide 530c is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530c.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at an interface between the oxide 530a and the oxide 530b and an interface between the oxide 530b and the oxide 530c is preferably made low.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a and the oxide 530c. In addition, the oxide 530c may have a stacked-layer structure. For example, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, a stacked-layer structure of an In—Ga—Zn oxide and an oxide that does not contain In may be employed as the oxide 530c.

Specifically, as the oxide 530a, a metal oxide having In:Ga:Zn=1:3:4 [atomic ratio] or a composition in the vicinity thereof, or 1:1:0.5 [atomic ratio] or a composition in the vicinity thereof is used. As the oxide 530b, a metal oxide having In:Ga:Zn=1:1:1 [atomic ratio] or a composition in the vicinity thereof, In:Ga:Zn=4:2:3 [atomic ratio] or a composition in the vicinity thereof, In:Ga:Zn=5:1:3 [atomic ratio] or a composition in the vicinity thereof, or 10:1:3 [atomic ratio] or a composition in the vicinity thereof or an In—Zn oxide is used. A metal oxide that can be used as the oxide 530a or the oxide 530b may be used. Note that a composition in the vicinity includes ±30% of an intended atomic ratio.

The oxide 530c may have a stacked-layer structure of two or more layers. As a specific example of the case where the oxide 530c has a stacked-layer structure, a metal oxide having In:Ga:Zn=5:1:3 [atomic ratio] or a composition in the vicinity thereof, or 10:1:3 [atomic ratio] or a composition in the vicinity thereof or an In—Zn oxide is used as a lower layer of the oxide 530c, and a metal oxide having In:Ga:Zn=1:3:4 [atomic ratio] or a composition in the vicinity thereof, Ga:Zn=2:1 [atomic ratio] or a composition in the vicinity thereof, or Ga:Zn=2:5 [atomic ratio] or a composition in the vicinity thereof or gallium oxide is used as an upper layer of the oxide 530c.

When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 510F can have a high on-state current and high frequency characteristics. Note that in the case where the oxide 530c has a stacked-layer structure, in addition to the effect of reducing the density of defect states at the interface between the oxide 530b and the oxide 530c, the effect of inhibiting diffusion of the constituent element of the oxide 530c to the insulator 550 side is expected. More specifically, the oxide 530c has a stacked-layer structure and the oxide that does not contain In is positioned at the upper part of the stacked-layer structure, whereby In can be inhibited from being diffused into the insulator 550 side. Since the insulator 550 functions as the gate insulator, the transistor has defects in characteristics when In diffuses. Thus, when the oxide 530c has a stacked-layer structure, a highly reliable display device can be provided.

A metal oxide functioning as an oxide semiconductor is preferably used as the oxide 530. For example, as the metal oxide to be the channel formation region in the oxide 530, a metal oxide having a bandgap of 2 eV or more, preferably 2.5 eV or more is preferably used. With the use of a metal oxide having such a wide bandgap, the off-state current of the transistor can be reduced. With the use of such a transistor, a semiconductor device with low power consumption can be provided.

<Structure Example 2 of Semiconductor Device>

Figure 15:
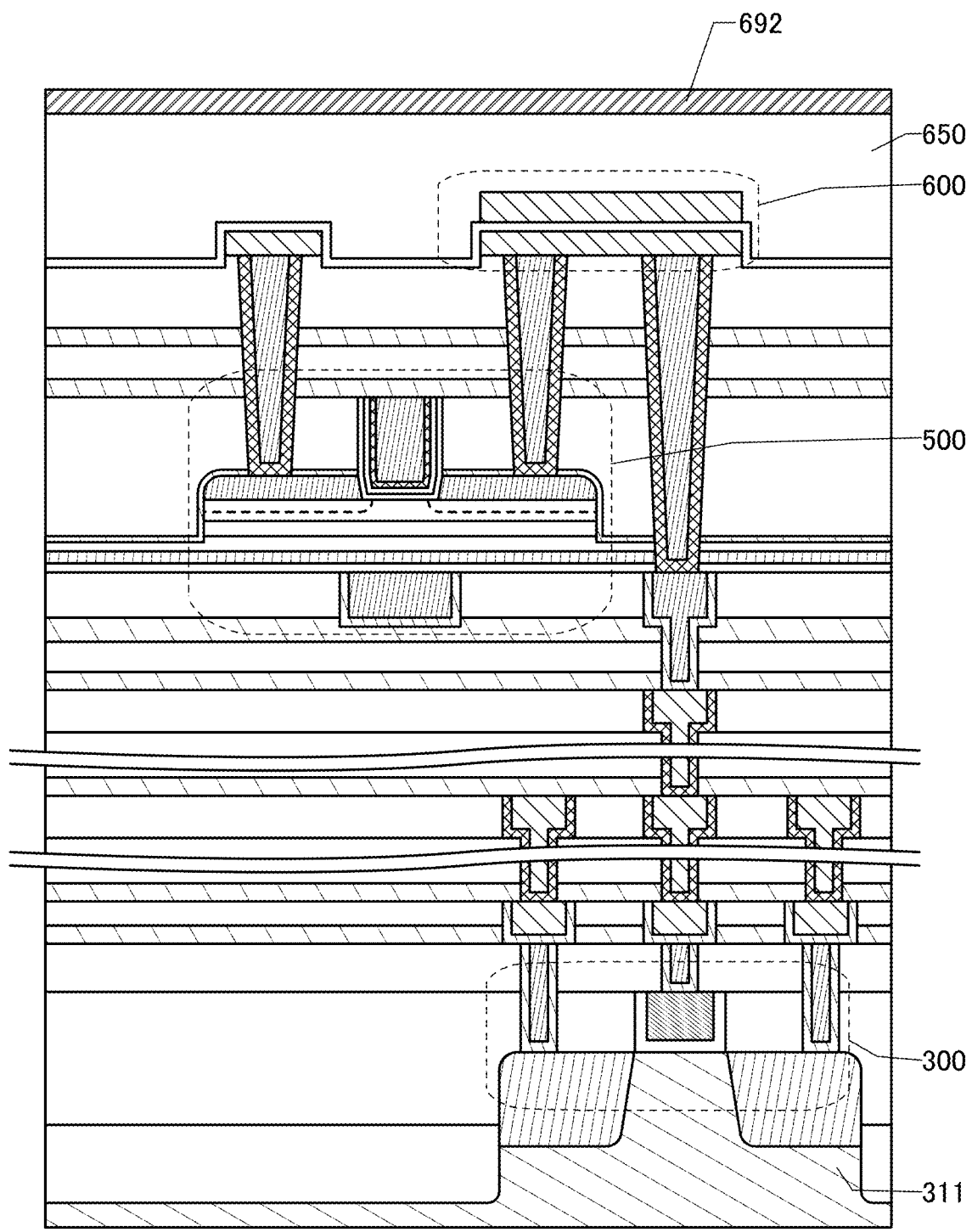
FIG. 15 is a cross-sectional view illustrating a structure example of a semiconductor device.

FIG. 15 illustrates an example in which the semiconductor device illustrated in FIG. 7 includes a conductor 692 over the insulator 650. The conductor 692 is formed to cover one surface of the semiconductor device. Although not illustrated in FIG. 15, the conductor 692 may have an opening. A conductor electrically connected to a conductor in a lower layer than the insulator 650 may be provided in the opening.

For the conductor 692, a metal can be used. A metal nitride or a metal oxide that has conductivity may be used. For the conductor 692, for example, titanium, titanium nitride, titanium oxide, or the like can be used. The conductor 692 has a function of cutting off or weakening an electromagnetic wave from the outside of the semiconductor device. Furthermore, the conductor 692 has a function of diffusing and releasing static electricity or preventing localization of electric charge. Providing the conductor 692 enables more stable operation of the semiconductor device.

Figure 16:
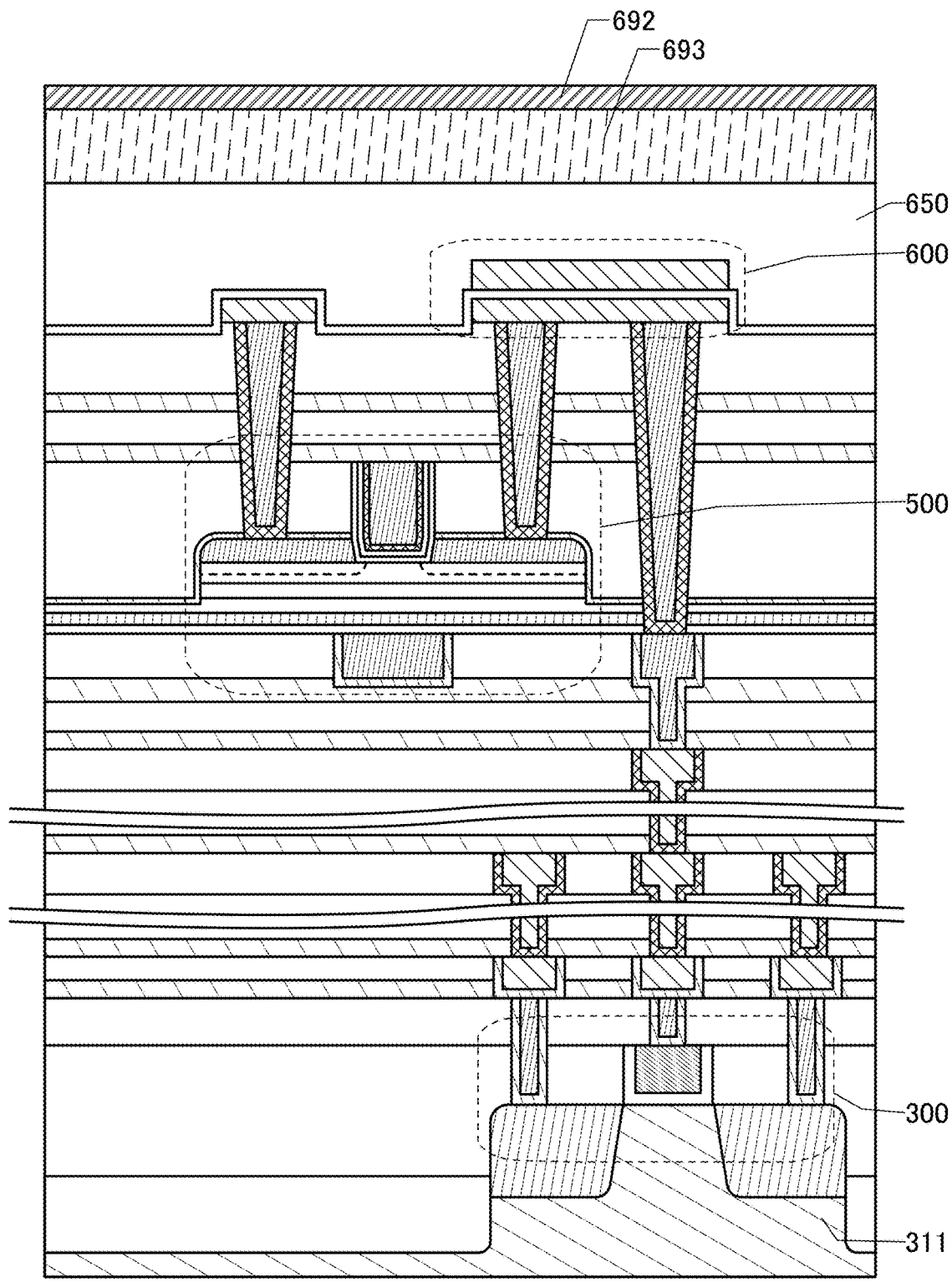
FIG. 16 is a cross-sectional view illustrating a structure example of a semiconductor device.

FIG. 16 illustrates an example in which an insulator 693 is included between the insulator 650 and the conductor 692. For the insulator 693, a structural body in which a fibrous body is impregnated with an organic resin can be used, for example. A glass fiber may be used as the fibrous body, for example. A brominated epoxy resin may be used as the organic resin, for example.

The transistor 140 and the transistor 150 described in Embodiment 1 are sometimes referred to as power MOSFETs.

The transistor 300 is preferably used as power MOSFETs such as the transistor 140 and the transistor 150 described in Embodiment 1, and it is particularly preferable to use the transistor 300 illustrated in each of FIG. 20, FIG. 21A, FIG. 21B, and FIG. 21C as the transistor 140 and the transistor 150. The transistor 300 illustrated in each of FIG. 20, FIG. 21A, FIG. 21B, and FIG. 21C is referred to as a D-MOS (Double Diffusion Metal Oxide Semiconductor) FET.

Figure 20:
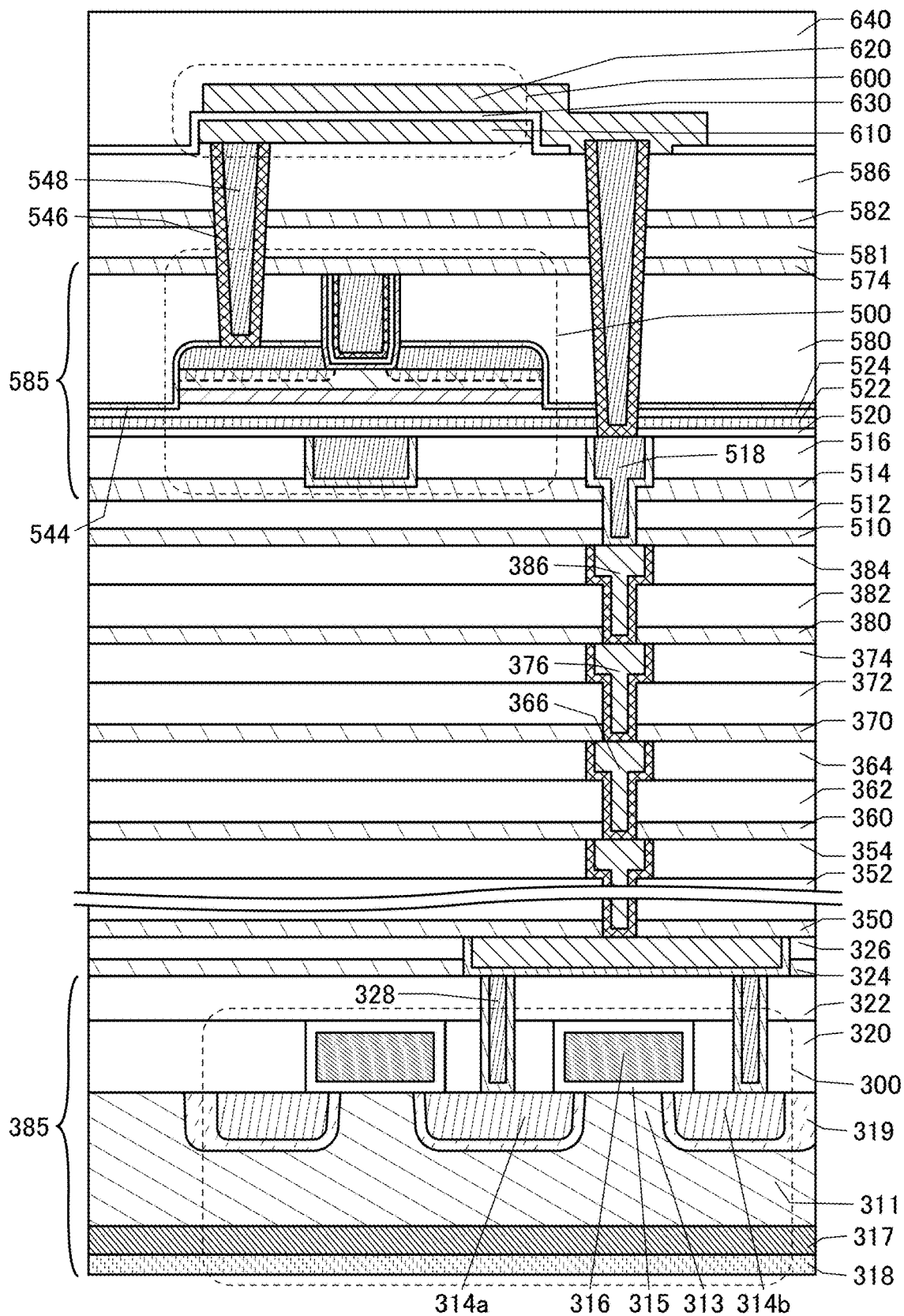
FIG. 20 is a cross-sectional view illustrating a structure example of a semiconductor device.

As illustrated in FIG. 20, a layer 385 is a layer including the transistor 300, and a layer 585 is a layer including the transistor 500. The layer 385 includes the substrate 311 on which the transistor 300 is provided, the conductor 316 functioning as a gate electrode of the transistor 300, and the like. The layer 585 includes the oxide 530 in which a channel formation region of the transistor 500 is formed, the conductor 560 functioning as a gate electrode of the transistor 500, and the like.

The transistor 300 illustrated in FIG. 20 is a planar transistor. The transistor 300 can be operated as a MOSFET by using the low-resistance region 314a and the low-resistance region 314b as a source region and a drain region; here, the transistor 300 can function as a D-MOSFET by making both the low-resistance region 314a and the low-resistance region 314b function as a source, forming a region 319 outside the low-resistance region 314a and the low-resistance region 314b, providing a low-resistance region 317 in a region below the semiconductor region 313 of the silicon substrate in the cross section of FIG. 20, and providing a rear electrode 318 functioning as a drain electrode below the low-resistance region 317. Alternatively, both the low-resistance region 314a and the low-resistance region 314b may function as a drain, and the rear electrode 318 may function as a source electrode. The region 319 preferably has a conductivity type opposite to that of the low-resistance region 314a and the low-resistance region 314b. For example, in the case where the low-resistance region 314a and the low-resistance region 314b are n-type regions, the region 319 is preferably a p-type region. Alternatively, the region 319 may be a high-resistance region. The region 319 is an intrinsic region in some cases.

Note that in FIG. 20, the low-resistance region 314a and the low-resistance region 314b are in contact with the region 319 having the opposite conductivity type, whereby a pn junction is formed. Such a pn junction region is referred to as a parasitic diode in this specifications and the like. The parasitic diode has functions of backflow prevention, rectification, and the like. The parasitic diode also has a function of protecting a transistor. The parasitic diode is formed between the drain (e.g., the low-resistance region 314a and the low-resistance region 314b) and the source (e.g., the rear electrode 318), whereby electric field concentration at the time of applying a high voltage between the source and the drain is reduced, for example, and breakage or deterioration of the transistor can be inhibited.

Figure 21A:
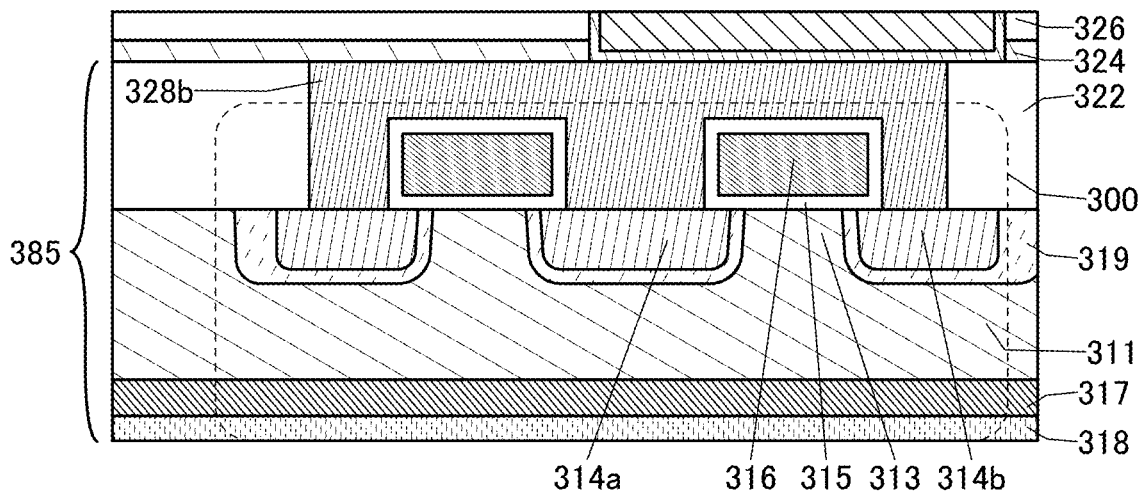
FIG. 21A, FIG. 21B, and FIG. 21C are cross-sectional views each illustrating a structure example of a semiconductor device.

FIG. 20 illustrates an example where respective plugs such as the conductors 328 are electrically connected to the low-resistance region 314a and the low-resistance region 314b; FIG. 21A illustrates an example where a conductor 328b is electrically connected to a plurality of low-resistance regions. The conductor 32b preferably has a shape covering at least part of each of the plurality of low-resistance regions. Furthermore, the conductor 32b preferably overlaps with at least part of each of the plurality of low-resistance regions.

Figure 21B:
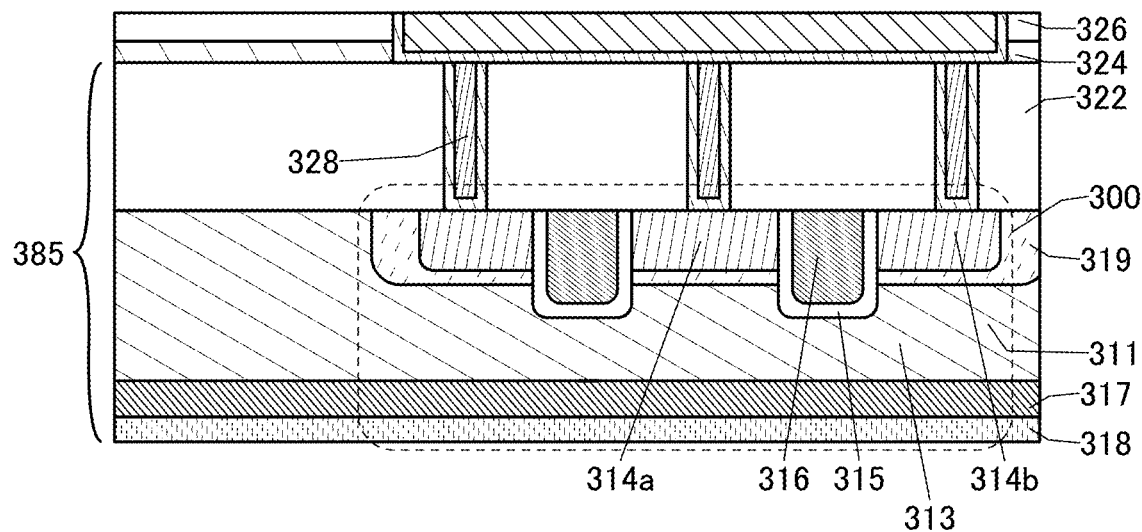

FIG. 20 illustrates an example where the transistor 300 is a D-MOSFET with a planar structure; FIG. 21B illustrates an example where the transistor 300 is a D-MOSFET with a trench structure. In FIG. 21A, the conductor 316 functioning as a gate is formed in a trench provided between the low-resistance region 314a and the low-resistance region 314b. The insulator 315 functioning as a gate insulator is formed between the low-resistance region 314a and the low-resistance region 314b and the conductor 316.

Figure 21C:
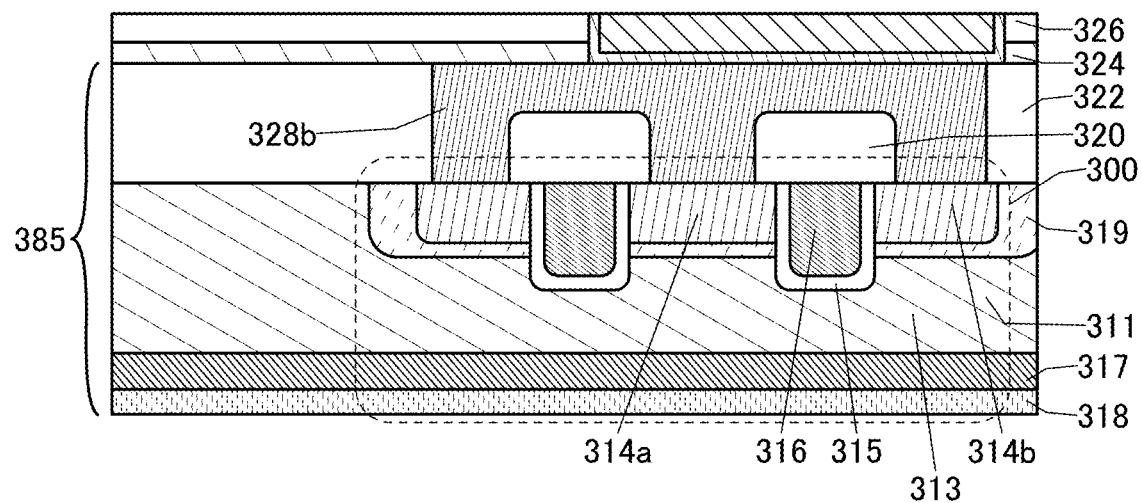

FIG. 21B illustrates an example where respective plugs such as the conductors 328 are electrically connected to the low-resistance region 314a and the low-resistance region 314b; FIG. 21C illustrates an example where the conductor 328b is electrically connected to a plurality of low-resistance regions. The conductor 328b preferably has a shape covering at least part of each of the plurality of low-resistance regions. Furthermore, the conductor 328b preferably overlaps with at least part of each of the plurality of low-resistance regions.

With the trench structure, the area of an integrated circuit is reduced preferably to 0.5 times or less, further preferably to 0.4 times or less, compared to the case of employing the planar structure.

Figure 22A:
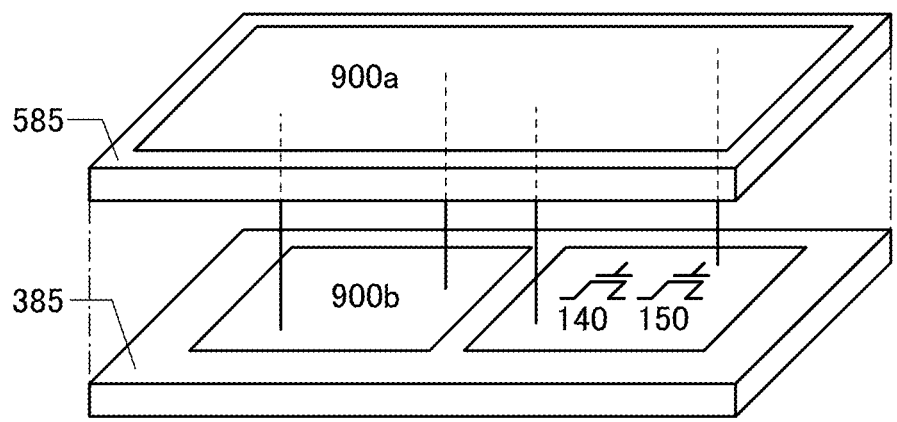
FIG. 22A and FIG. 22B are diagrams each illustrating a structure example of one embodiment of the present invention.
Figure 22B:
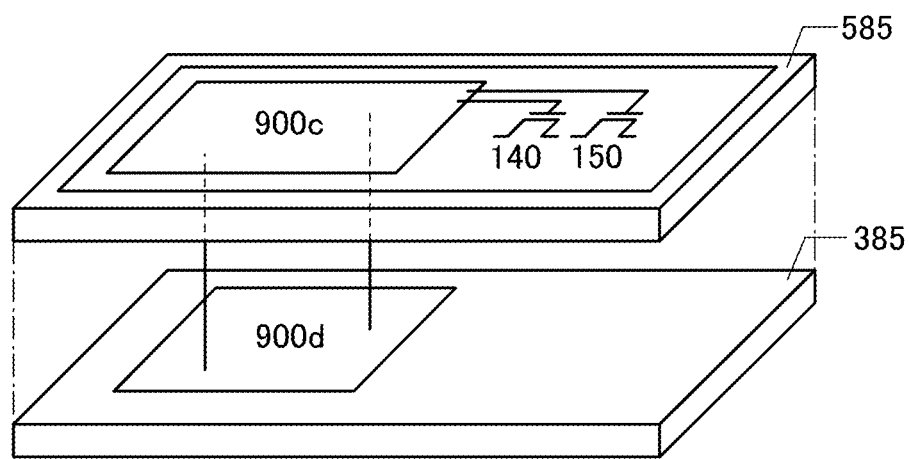

FIG. 22A and FIG. 22B are perspective views illustrating structure examples of the semiconductor device of one embodiment of the present invention. FIG. 22A and FIG. 22B each illustrate an example where circuits included in the semiconductor device of one embodiment of the present invention are provided in the layer 385 and the layer 585. As the layer 385, for example, a layer including Si transistors in the semiconductor device of one embodiment of the present invention can be used. The layer 585 is, for example, a layer including OS transistors in the semiconductor device of one embodiment of the present invention. Note that the expression "each circuit is provided in the layer 385 or the layer 585" means, for example, that transistors among elements constituting each circuit are formed in the layer 385 or the layer 585. A capacitor and a resistor included in each circuit may be provided between these layers or over the layer 585, for example.

The semiconductor device 70 described in the foregoing embodiment can be provided in the layer 385 and the layer 585 as illustrated in FIG. 22A and FIG. 22B.

FIG. 22A illustrates an example where a transistor including silicon in its channel formation region is provided in the layer 385 as the transistor 140 and the transistor 150, for example. Each of the memory element 114, the amplifier circuit 80, and the control circuit 99 that are included in the semiconductor device 70 may be provided in either a region 900b of the layer 385 or a region 900a of the layer 585. The memory element 114 and the amplifier circuit 80 are preferably provided in the region 900a of the layer 585, for example.

FIG. 22B illustrates an example where a transistor including an oxide semiconductor in its channel formation region is provided in the layer 585 as the transistor 140 and the transistor 150, for example. Each of the memory element 114, the amplifier circuit 80, and the control circuit 99 that are included in the semiconductor device 70 may be provided in either a region 900d of the layer 385 or a region 900c of the layer 585. The memory element 114 and the amplifier circuit 80 are preferably provided in the region 900c of the layer 585, for example.

Note that this embodiment can be implemented in appropriate combination with the other embodiments described in this specification.

Embodiment 3

In this embodiment, the composition of a metal oxide that can be used in the OS transistor described in the above embodiment is described.

<<Metal Oxide>>

As the oxide 530, a metal oxide functioning as an oxide semiconductor is preferably used. A metal oxide that can be used as the oxide 530 according to the present invention is described below.

The metal oxide preferably contains at least indium or zinc. In particular, indium and zinc are preferably contained. In addition, gallium, yttrium, tin, or the like is preferably contained. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide that contains indium, an element M, and zinc is considered. The element M is aluminum, gallium, yttrium, or tin. Other elements that can be used as the element M include boron, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also referred to as a metal oxide in some cases. Moreover, a metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that it is difficult to observe a clear crystal grain boundary (also referred to as grain boundary) even in the vicinity of distortion in the CAAC-OS. That is, a lattice arrangement is distorted and thus formation of a crystal grain boundary is inhibited. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter, an In layer) and a layer containing the element M, zinc, and oxygen (hereinafter, an (M, Zn) layer) are stacked. Note that indium and the element M can be replaced with each other, and when the element M of the (M, Zn) layer is replaced with indium, the layer can be referred to as an (In, M, Zn) layer. When indium of the In layer is replaced with the element M, the layer can be referred to as an (In, M) layer.

The CAAC-OS is a metal oxide with high crystallinity. By contrast, in the CAAC-OS, a reduction in electron mobility due to a crystal grain boundary is less likely to occur because it is difficult to observe a clear crystal grain boundary. Entry of impurities, formation of defects, or the like might decrease the crystallinity of a metal oxide. This means that the CAAC-OS is a metal oxide having small amounts of impurities and defects (e.g., oxygen vacancies). Thus, a metal oxide including the CAAC-OS is physically stable. Accordingly, the metal oxide including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method.

Note that an In—Ga—Zn oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure might be obtained when IGZO is formed of smaller crystals (e.g., the above-described nanocrystals) rather than larger crystals (here, crystals with a size of several millimeters or several centimeters).

The a-like OS is a metal oxide having a structure between those of the nc-OS and the amorphous oxide semiconductor. The a-like OS has a void or a low-density region. That is, the a-like OS has low crystallinity as compared with the nc-OS and the CAAC-OS.

An oxide semiconductor (metal oxide) can have any of various structures that show various different properties. Two or more kinds among the amorphous oxide semiconductor, the polycrystalline oxide semiconductor, the a-like OS, the nc-OS, and the CAAC-OS may be included in an oxide semiconductor of one embodiment of the present invention.

[Impurities]

Here, the influence of impurities in the metal oxide is described.

Entry of impurities into the oxide semiconductor forms defect states or oxygen vacancies in some cases. Thus, when impurities enter a channel formation region of the oxide semiconductor, the electrical characteristics of a transistor using the oxide semiconductor tend to vary and its reliability is low in some cases. Moreover, if the channel formation region includes oxygen vacancies, the transistor tends to have normally-on characteristics.

The above-described defect states may include a trap state. Charge trapped by a trap state in the metal oxide takes a long time to disappear and may behave like fixed charge. Thus, a transistor including the metal oxide having a high density of trap states in the channel formation region has unstable electrical characteristics in some cases.

If impurities exist in the channel formation region of the oxide semiconductor, the crystallinity of the channel formation region may decrease, and the crystallinity of an oxide in contact with the channel formation region may decrease. Low crystallinity of the channel formation region tends to decrease stability or reliability of the transistor. Moreover, if the crystallinity of the oxide in contact with the channel formation region is low, an interface state may be formed and the stability or reliability of the transistor may deteriorate.

Therefore, the reduction in concentration of impurities in and around the channel formation region of the oxide semiconductor is effective in improving the stability or reliability of the transistor. Examples of impurities include hydrogen, nitrogen, alkali metal, alkaline earth metal, iron, nickel, and silicon.

Specifically, the concentration of the above impurities obtained by SIMS is lower than or equal to $1 \times 10^{18}$ atoms/$cm^{-3}$, preferably lower than or equal to $2 \times 10^{16}$ atoms/$cm^{-3}$ in and around the channel formation region of the oxide semiconductor. Alternatively, the concentration of the above impurities obtained by element analysis using EDX is lower than or equal to 1.0 atomic % in and around the channel formation region of the oxide semiconductor. When an oxide containing the element M is used as the oxide semiconductor, the concentration ratio of the impurities to the element M is lower than 0.10, preferably lower than 0.05 in and around the channel formation region of the oxide semiconductor. Here, the concentration of the element M used in the calculation of the concentration ratio may be a concentration in a region that is the same as the region whose concertation of the impurities is calculated or may be a concentration in the oxide semiconductor.

A metal oxide with a low impurity concentration has a low density of defect states and thus has a low density of trap states in some cases.

In the case where hydrogen enters an oxygen vacancy in the metal oxide, the oxygen vacancy and the hydrogen are bonded to each other to form VoH in some cases. The VoH serves as a donor and an electron that is a carrier is generated in some cases. In other cases, bonding of part of hydrogen to oxygen bonded to a metal atom generates an electron serving as a carrier.

Thus, a transistor including an oxide semiconductor with a high hydrogen content is likely to be normally on. Hydrogen in the oxide semiconductor is easily transferred by a stress such as heat or an electric field; thus, a high hydrogen content in the oxide semiconductor might reduce the reliability of the transistor.

Accordingly, the amount of VoH in the metal oxide is preferably reduced as much as possible so that the oxide semiconductor becomes a highly purified intrinsic or substantially highly purified intrinsic oxide semiconductor. In order to obtain such an oxide semiconductor with a sufficiently small amount of VoH, it is important to remove impurities such as moisture and hydrogen in the oxide semiconductor (this treatment is sometimes referred to as dehydration or dehydrogenation treatment) and supply oxygen to the oxide semiconductor to fill oxygen vacancies (this treatment is sometimes referred to as oxygen adding treatment). When an oxide semiconductor with sufficiently small amounts of impurities such as VoH is used for a channel formation region of a transistor, the transistor can have stable electrical characteristics.

An oxide semiconductor with a low carrier concentration is preferably used for the transistor. In order to reduce the carrier concentration of the oxide semiconductor, the concentration of impurities in the oxide semiconductor is reduced so that the density of defect states can be reduced. In this specification and the like, a state with a low concentration of impurities and a low density of defect states is referred to as a highly purified intrinsic or substantially highly purified intrinsic state. Examples of impurities contained in the oxide semiconductor include hydrogen, nitrogen, alkali metal, alkaline earth metal, iron, nickel, and silicon.

Specifically, hydrogen contained in an oxide semiconductor reacts with oxygen bonded to a metal atom to be water, and thus forms oxygen vacancies in the oxide semiconductor in some cases. If the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor including an oxide semiconductor that contains a large amount of hydrogen is likely to have normally-on characteristics.

A defect that is an oxygen vacancy into which hydrogen enters (VoH) serves as donors of the oxide semiconductor in some cases. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is measured by secondary ion mass spectrometry (SIMS), is lower than $1 \times 10^{20}$ atoms/cm$^{-3}$, preferably lower than $1 \times 10^{19}$ atoms/cm$^{-3}$, further preferably lower than $5 \times 10^{18}$ atoms/cm$^{-3}$, still further preferably lower than $1 \times 10^{18}$ atoms/cm$^{-3}$. When an oxide semiconductor with a sufficiently low concentration of impurities such as hydrogen is used for a channel formation region of a transistor, the transistor can have stable electrical characteristics.

The carrier concentration of the oxide semiconductor in the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet still further preferably lower than $1 \times 10^{13}$ cm$^{-3}$, yet still further preferably lower than $1 \times 10^{12}$ cm$^{-3}$. Note that the lower limit of the carrier concentration of the oxide semiconductor in the channel formation region is not particularly limited and can be, for example, $1 \times 10^{-9}$ cm$^{-3}$.

One embodiment of the present invention can provide a highly reliable semiconductor device. One embodiment of the present invention can provide a semiconductor device with favorable electrical characteristics. One embodiment of the present invention can provide a semiconductor device with a high on-state current. One embodiment of the present invention can provide a miniaturized or highly integrated semiconductor device. One object of one embodiment of the present invention is to provide a semiconductor device with low power consumption.

<<Other Semiconductor Materials>>

A semiconductor material that can be used for the oxide 530 is not limited to the above metal oxides. A semiconductor material having a band gap (a semiconductor material that is not a zero-gap semiconductor) may be used for the oxide 530. For example, a single element semiconductor such as silicon, a compound semiconductor such as gallium arsenide, or a layered material functioning as a semiconductor (also referred to as an atomic layer material, a two-dimensional material, or the like) is preferably used as the semiconductor material. The layered material functioning as a semiconductor is particularly suitable as the semiconductor material.

Here, in this specification and the like, the layered material generally refers to a group of materials having a layered crystal structure. The layered crystal structure refers to a structure in which layers formed by a covalent bond or an ionic bond are stacked with a bond that is weaker than the covalent bond or the ionic bond, such as a Van der Waals force. The layered material has high electrical conductivity in a monolayer, that is, high two-dimensional electrical conductivity. With the use of a material functioning as a semiconductor and having high two-dimensional electrical conductivity in a channel formation region, a transistor with a high on-state current can be provided.

Examples of the layered material include graphene, silicene, and chalcogenide. Chalcogenide is a compound containing chalcogen. Chalcogen is a general term of Group 16 elements such as oxygen, sulfur, selenium, tellurium, polonium, and livermorium. Examples of chalcogenide include chalcogenide of transition metals and chalcogenide of Group 13 elements.

Chalcogenide of transition metals that functions as a semiconductor is preferably used as the oxide 530, for example. Specific examples of chalcogenide of transition metals that can be used as the oxide 530 include molybdenum sulfide (typically, $MoS_2$), molybdenum selenide (typically, $MoSe_2$), molybdenum telluride (typically, $MoTe_2$), tungsten sulfide (typically, $WS_2$), tungsten selenide (typically, $WSe_2$), tungsten telluride (typically, $WTe_2$), hafnium sulfide (typically, $HfS_2$), hafnium selenide (typically, $HfSe_2$), zirconium sulfide (typically, $ZrS_2$), and zirconium selenide (typically, $ZrSe_2$).

Note that this embodiment can be implemented in appropriate combination with the other embodiments described in this specification.

Embodiment 4

In this embodiment, an example in which the battery control circuit described in the above embodiment is made into an electronic component is described with reference to FIG. 23.

Figure 23A:
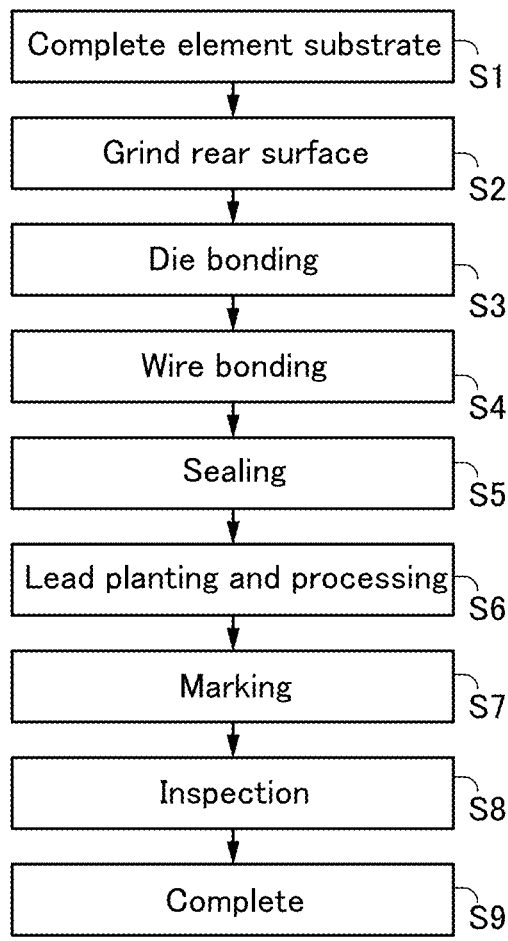
FIG. 23A and FIG. 23B are diagrams each illustrating a structure example of one embodiment of the present invention.

FIG. 23A shows an example in which the battery control circuit described in the above embodiment is made into an electronic component. Note that the electronic component is also referred to as a semiconductor package or an IC package. For the electronic component, there are a plurality of standards and names corresponding to a terminal extraction direction and a terminal shape. Thus, an example thereof is described in this embodiment.

A circuit portion including an OS transistor or a Si transistor is completed by integrating a plurality of detachable components on a printed circuit board through an assembly process (a post-process).

The post-process can be completed through steps shown in FIG. 23A. Specifically, after an element substrate obtained in a pre-process is completed (Step S1), a rear surface of the substrate is ground (Step S2). The substrate is thinned down at this stage, so that warpage or the like of the substrate in the pre-process is reduced and the size of the component is reduced.

The rear surface of the substrate is ground, and a dicing step is performed to divide the substrate into a plurality of chips. Then, a die bonding step of individually picking up the divided chips to be mounted on and bonded to a lead frame is performed (Step S3). To bond the chip and the lead frame in this die bonding step, a method such as bonding with a resin or bonding with a tape is selected as appropriate depending on products. Note that in the die bonding step, chips may be mounted on and bonded to an interposer.

Next, wire bonding in which a lead of the lead frame and an electrode on the chip are electrically connected with a metal fine line (wire) is performed (Step S4). A silver line or a gold line can be used as the metal fine line. Furthermore, ball bonding or wedge bonding can be used as the wire bonding.

The wire-bonded chip is subjected to sealing with an epoxy resin or the like in a molding step (Step S5). With the molding step, the inside of the electronic component is filled with a resin, so that damage to the incorporated circuit portion and wire due to external mechanical force can be reduced, and degradation in characteristics due to moisture or dust can be reduced.

Next, the lead of the lead frame is subjected to plating treatment. Then, the lead is cut and processed (Step S6). This plating treatment prevents corrosion of the lead and enables more reliable soldering at the time of mounting the electronic component on a printed circuit board in a later step.

Next, printing treatment (marking) is performed on a surface of the package (Step S7). Then, through a final inspection step (Step S8), an electronic component that includes a circuit portion including a PLD is completed (Step S9).

Figure 23B:
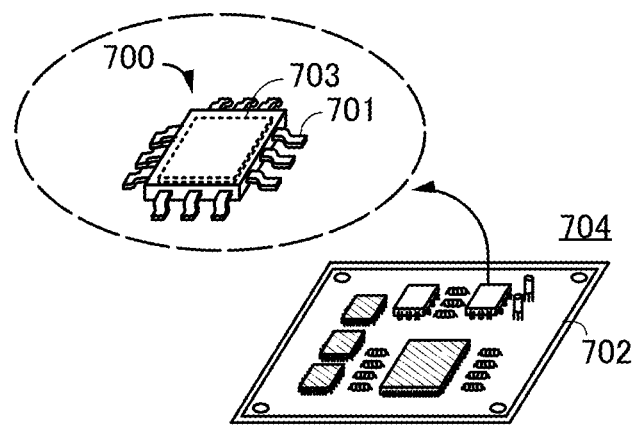

FIG. 23B is a schematic perspective view of the completed electronic component. FIG. 23B shows a schematic perspective view of a QFP (Quad Flat Package) as an example of the electronic component. A lead 701 and a circuit portion 703 of an electronic component 700 are shown in FIG. 23B. The electronic component 700 shown in FIG. 23B is mounted on a printed circuit board 702, for example. A plurality of electronic components 700 that are combined and electrically connected to each other over the printed circuit board 702 can be mounted inside an electric device. A completed circuit board 704 is provided in an electric device or the like.

An example of one of the plurality of electronic components mounted on the printed circuit board 702 is an electronic component including the battery control circuit described in the foregoing embodiment. Other examples of the electronic components include a chip coil and a chip inductor. When a chip coil, a chip inductor, or the like is formed by a sputtering method, an evaporation method, or the like in the layer 385 or the layer 585, each of which is described in the foregoing embodiment, or a layer stacked over the layer 585, the area of the circuit board can be reduced in some cases.

This embodiment can be combined with any of the other embodiments as appropriate.

Embodiment 5

This embodiment describes structures of a power storage device and a power storage system to which the electronic component including the battery control circuit described in the above embodiment can be applied.

[Cylindrical Secondary Battery]

Figure 25A:
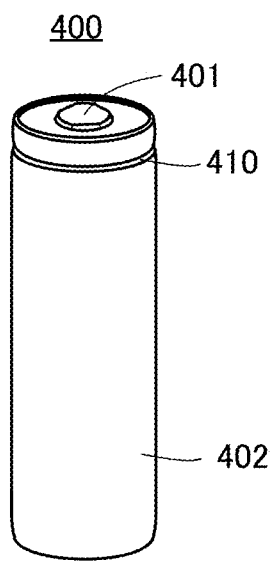
FIG. 25A is a diagram illustrating an electric device of one embodiment of the present invention.

An example of a cylindrical secondary battery is described with reference to FIG. 25A. A cylindrical secondary battery 400 includes, as illustrated in FIG. 25A, a positive electrode cap (battery lid) 401 on a top surface and a battery can (outer can) 402 on a side surface and a bottom surface. The positive electrode cap 401 and the battery can (outer can) 402 are insulated from each other by a gasket (insulating packing) 410.

Figure 25B:
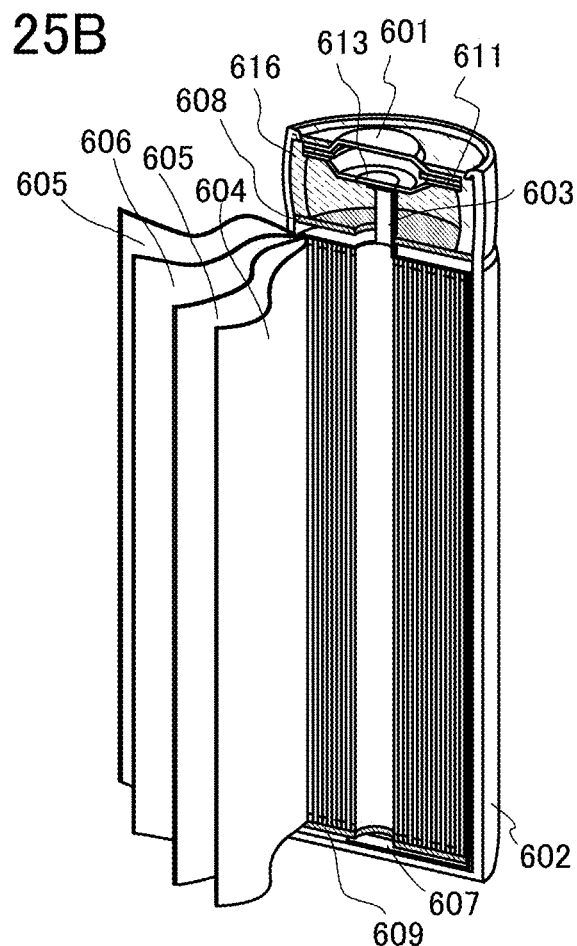
FIG. 25B is a diagram illustrating an electric device of one embodiment of the present invention.

FIG. 25B is a schematic cross-sectional view of a cylindrical secondary battery. The cylindrical secondary battery illustrated in FIG. 25B includes a positive electrode cap (battery lid) 601 on a top surface and a battery can (outer can) 602 on a side surface and a bottom surface. The positive electrode cap and the battery can (outer can) 602 are insulated from each other by a gasket (insulating gasket) 616.

Inside the battery can 602 having a hollow cylindrical shape, a battery element in which a strip-like positive electrode 604 and a strip-like negative electrode 606 are wound with a separator 605 located therebetween is provided. Although not illustrated, the battery element is wound around a center pin. One end of the battery can 602 is closed and the other end thereof is opened. For the battery can 602, a metal having corrosion resistance to an electrolyte solution, such as nickel, aluminum, or titanium, an alloy of such a metal, or an alloy of such a metal and another metal (e.g., stainless steel) can be used. The battery can 602 is preferably covered with nickel, aluminum, or the like in order to prevent corrosion due to the electrolyte solution. Inside the battery can 602, the battery element in which the positive electrode, the negative electrode, and the separator are wound is provided between a pair of insulating plates 608 and 609 that face each other. Furthermore, a nonaqueous electrolyte solution (not illustrated) is injected inside the battery can 602 provided with the battery element. As the nonaqueous electrolyte, a nonaqueous electrolyte that is similar to that for a coin-type secondary battery can be used.

Since a positive electrode and a negative electrode that are used for a cylindrical storage battery are wound, active materials are preferably formed on both surfaces of a current collector. A positive electrode terminal (positive electrode current collecting lead) 603 is connected to the positive electrode 604, and a negative electrode terminal (negative electrode current collecting lead) 607 is connected to the negative electrode 606. Both the positive electrode terminal 603 and the negative electrode terminal 607 can be formed using a metal material such as aluminum. The positive electrode terminal 603 and the negative electrode terminal 607 are resistance-welded to a safety valve mechanism 613 and the bottom of the battery can 602, respectively. The safety valve mechanism 613 is electrically connected to the positive electrode cap 601 through a PTC element (Positive Temperature Coefficient) 611. The safety valve mechanism 613 cuts off electrical connection between the positive electrode cap 601 and the positive electrode 604 when the internal pressure of the battery exceeds a predetermined threshold. In addition, the PTC element 611 is a thermally sensitive resistor whose resistance increases as temperature rises, and limits the amount of current by increasing the resistance to prevent abnormal heat generation. Barium titanate ($BaTiO_3$)-based semiconductor ceramics or the like can be used for the PTC element.

Figure 25C:
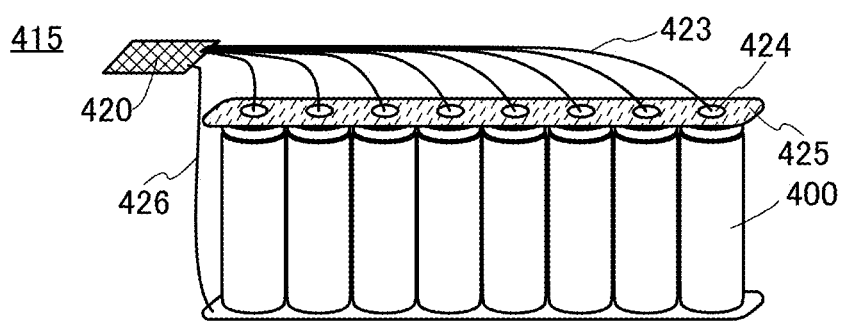
FIG. 25C is a diagram illustrating an electric device of one embodiment of the present invention.

FIG. 25C illustrates an example of a power storage system 415. The power storage system 415 includes a plurality of secondary batteries 400. Positive electrodes of the secondary batteries are in contact with and electrically connected to conductors 424 isolated by an insulator 425. The conductor 424 is electrically connected to a control circuit 420 through a wiring 423. Negative electrodes of the secondary batteries are electrically connected to the control circuit 420 through a wiring 426. As the control circuit 420, the battery control circuit described in the above embodiment can be used.

Figure 25D:
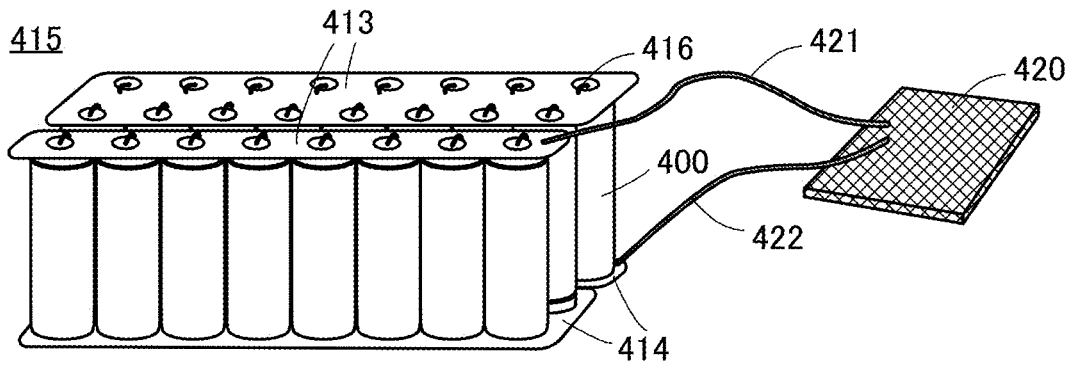
FIG. 25D is a diagram illustrating an electric device of one embodiment of the present invention.

FIG. 25D illustrates an example of the power storage system 415. The power storage system 415 includes a plurality of secondary batteries 400, and the plurality of secondary batteries 400 are sandwiched between a conductive plate 413 and a conductive plate 414. The plurality of secondary batteries 400 are electrically connected to the conductive plate 413 and the conductive plate 414 through a wiring 416. The plurality of secondary batteries 400 may be connected in parallel, connected in series, or connected in series after being connected in parallel. With the power storage system 415 including the plurality of secondary batteries 400, large electric power can be extracted.

The case where the plurality of secondary batteries 400 are connected in parallel and then further connected in series is considered. In such a case, in the battery control circuit described in the above embodiment, for example, the secondary battery 121 corresponds to the plurality of secondary batteries connected in parallel. In addition, a control circuit such as one cell balancing circuit may be electrically connected to the plurality of secondary batteries connected in parallel.

A temperature control device may be provided between the plurality of secondary batteries 400. When the secondary batteries 400 are heated excessively, the temperature control device can cool them, and when the secondary batteries 400 get too cold, the temperature control device can heat them. Thus, the performance of the power storage system 415 is not easily influenced by the outside temperature.

In FIG. 25D, the power storage system 415 is electrically connected to the control circuit 420 through a wiring 421 and a wiring 422. As the control circuit 420, the battery control circuit described in the above embodiment can be used. The wiring 421 is electrically connected to the positive electrodes of the plurality of secondary batteries 400 through the conductive plate 413. The wiring 422 is electrically connected to the negative electrodes of the plurality of secondary batteries 400 through the conductive plate 414.

[Secondary Battery Pack]

Next, examples of a power storage system of one embodiment of the present invention is described with reference to FIG. 26.

Figure 26A:
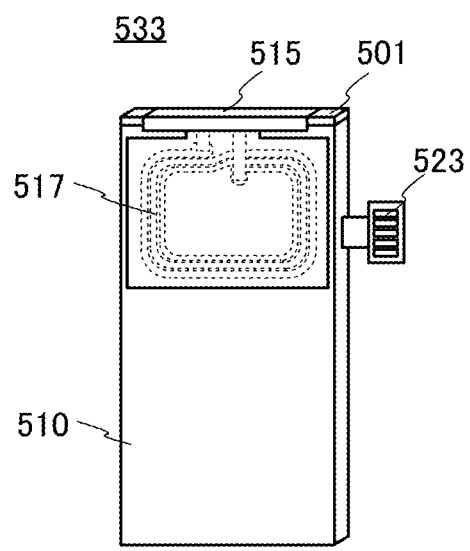
FIG. 26A is a diagram illustrating an electric device of one embodiment of the present invention.
Figure 26B:
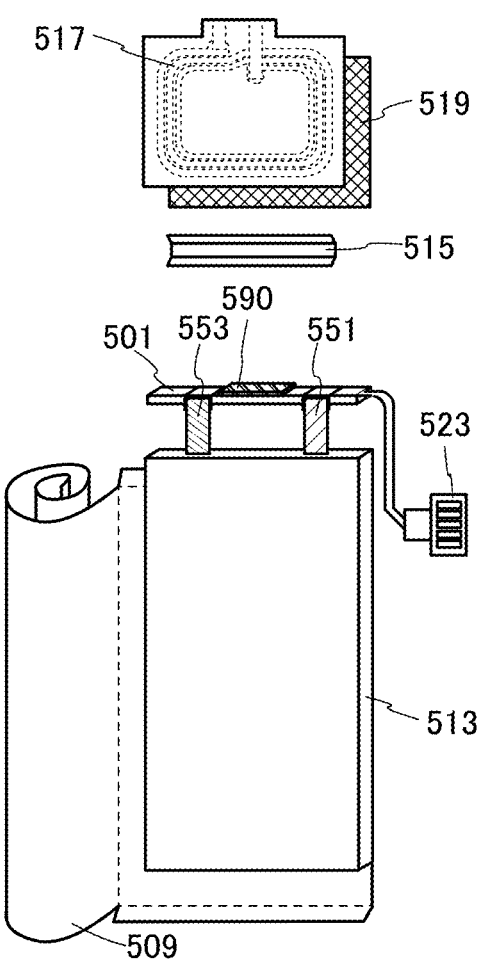
FIG. 26B is a diagram illustrating the electric device of one embodiment of the present invention.

FIG. 26A is an external view of a secondary battery pack 533. FIG. 26B illustrates a structure of the secondary battery pack 533. The secondary battery pack 533 includes a circuit board 501 and a secondary battery 513. A label 509 is attached onto the secondary battery 513. The circuit board 501 is fixed by a sealant 515. The secondary battery pack 533 also includes an antenna 517.

The circuit board 501 includes a control circuit 590. As the control circuit 590, the battery control circuit described in the above embodiment can be used. For example, as illustrated in FIG. 26B, the control circuit 590 is provided over the circuit board 501. The circuit board 501 is electrically connected to a terminal 523. The circuit board 501 is electrically connected to the antenna 517, one 551 of a positive electrode lead and a negative electrode lead of the secondary battery 513, and the other 553 of the positive electrode lead and the negative electrode lead.

Figure 26C:
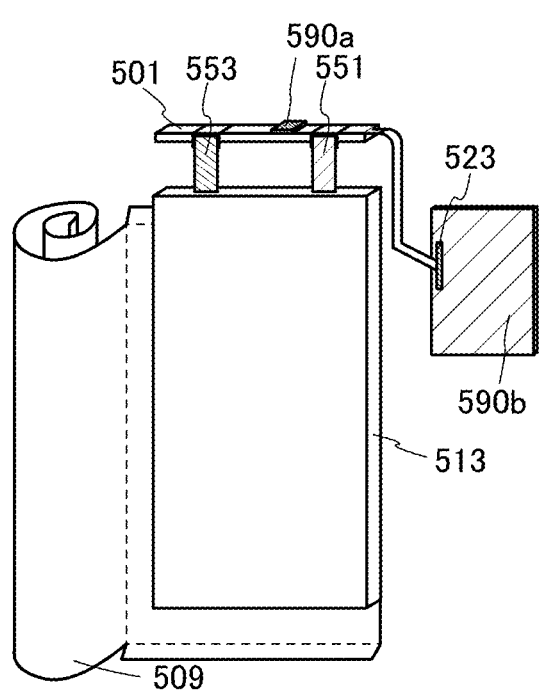
FIG. 26C is a diagram illustrating an electric device of one embodiment of the present invention.

Alternatively, as illustrated in FIG. 26C, a circuit system 590a provided over the circuit board 501 and a circuit system 590b electrically connected to the circuit board 501 through the terminal 523 may be included. For example, a part of the control circuit of one embodiment of the present invention is provided in the circuit system 590a, and another part thereof is provided in the circuit system 590b.

The shape of the antenna 517 is not limited to a coil shape and may be a linear shape or a plate shape. An antenna such as a planar antenna, an aperture antenna, a traveling-wave antenna, an EH antenna, a magnetic-field antenna, or a dielectric antenna may be used. Alternatively, the antenna 914 may be a flat-plate conductor. This flat-plate conductor can serve as one of conductors for electric field coupling. That is, the antenna 914 may serve as one of two conductors of a capacitor. Thus, electric power can be transmitted and received not only by an electromagnetic field or a magnetic field but also by an electric field.

The secondary battery pack 533 includes a layer 519 between the antenna 517 and the secondary battery 513. The layer 519 has a function of blocking an electromagnetic field from the secondary battery 513, for example. For the layer 519, a magnetic material can be used, for instance.

The secondary battery 513 is obtained, for example, by winding a sheet of a stack in which the negative electrode and the positive electrode overlap each other with the separator positioned therebetween.

This embodiment can be combined with any of the other embodiments as appropriate.

Embodiment 6

This embodiment describes examples in which the power storage system of one embodiment of the present invention is mounted on a vehicle. Examples of vehicles include automobiles, motorcycles, and bicycles.

The use of power storage systems in vehicles enables production of next-generation clean energy vehicles such as hybrid electric vehicles (HEVs), electric vehicles (EVs), and plug-in hybrid electric vehicles (PHEVs).

Figure 27A:
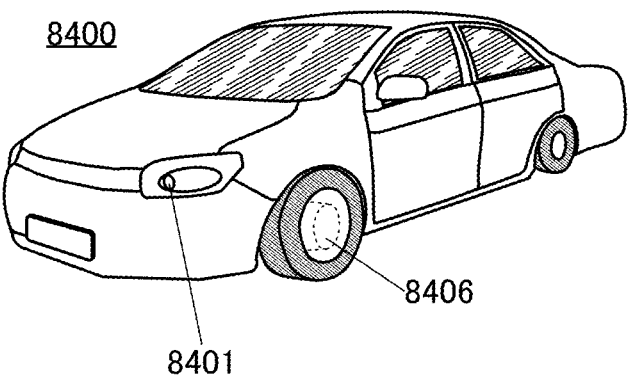
FIG. 27A is a diagram illustrating an electric device of one embodiment of the present invention.

FIG. 27 illustrates examples of vehicles using the power storage system of one embodiment of the present invention. An automobile 8400 illustrated in FIG. 27A is an electric vehicle that runs on the power of an electric motor as a power source. Alternatively, the automobile 8400 is a hybrid electric vehicle capable of driving appropriately using either an electric motor or an engine as a power source. The use of one embodiment of the present invention can achieve a high-mileage vehicle. The automobile 8400 includes a power storage system. The power storage system is used not only for driving an electric motor 8406, but also for supplying electric power to a light-emitting device such as a headlight 8401 or a room light (not illustrated).

The power storage system can also supply electric power to a display device of a speedometer, a tachometer, or the like included in the automobile 8400. Furthermore, the power storage system can supply electric power to a navigation system or the like included in the automobile 8400.

Figure 27B:
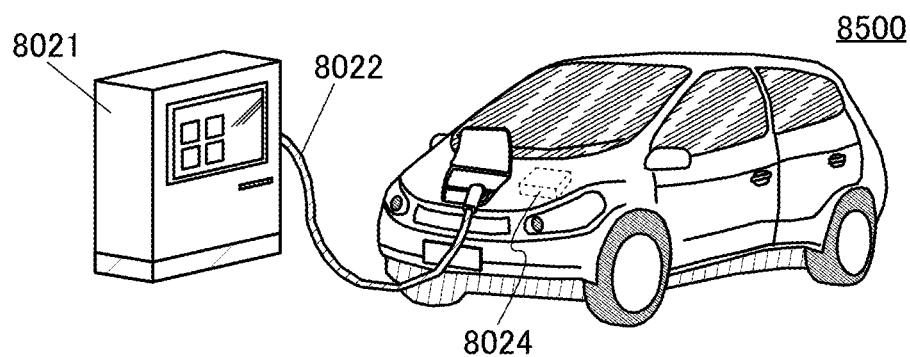
FIG. 27B is a diagram illustrating an electric device of one embodiment of the present invention.

An automobile 8500 illustrated in FIG. 27B can be charged when a power storage system 8024 included in the automobile 8500 is supplied with electric power from external charging equipment by a plug-in system, a contactless power feeding system, or the like. FIG. 27B illustrates the state in which the power storage system 8024 included in the automobile 8500 is charged with a ground-based charging device 8021 through a cable 8022. For charging, a given method such as CHAdeMO (registered trademark) or Combined Charging System is employed as a charge method, the standard of a connector, or the like as appropriate. The charging device 8021 may be a charging station provided in a commerce facility or a household power source. With the use of a plug-in technique, the power storage system 8024 included in the automobile 8500 can be charged by being supplied with electric power from the outside, for example. Charging can be performed by converting AC electric power into DC electric power through a converter such as an AC-DC converter.

Furthermore, although not illustrated, the vehicle may include a power receiving device so that it can be charged by being supplied with electric power from an above-ground power transmitting device in a contactless manner. In the case of the contactless power feeding system, by fitting a power transmitting device in a road or an exterior wall, charging can be performed not only when the vehicle is stopped but also when driven. The contactless power feeding system may be utilized to perform transmission and reception of electric power between vehicles. Furthermore, a solar cell may be provided in the exterior of the vehicle to charge the power storage system when the vehicle stops or moves. To supply electric power in such a contactless manner, an electromagnetic induction method or a magnetic resonance method can be used.

Figure 27C:
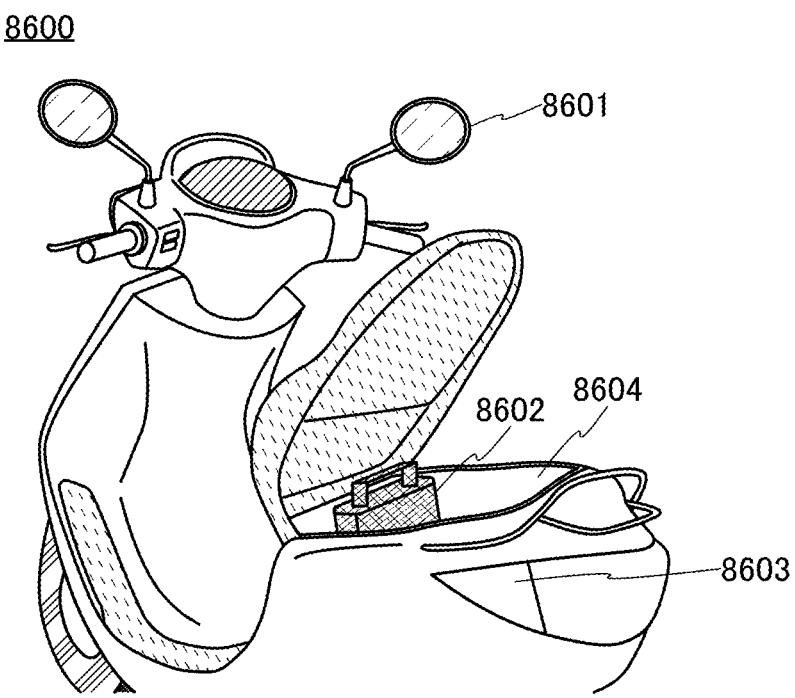
FIG. 27C is a diagram illustrating an electric device of one embodiment of the present invention.

FIG. 27C shows an example of a motorcycle using the power storage system of one embodiment of the present invention. A motor scooter 8600 illustrated in FIG. 27C includes a power storage system 8602, side mirrors 8601, and indicator lights 8603. The power storage system 8602 can supply electricity to the indicator lights 8603.

In the motor scooter 8600 illustrated in FIG. 27C, the power storage system 8602 can be stored in an under-seat storage unit 8604. The power storage system 8602 can be stored in the under-seat storage unit 8604 even with a small size.

Figure 28A:
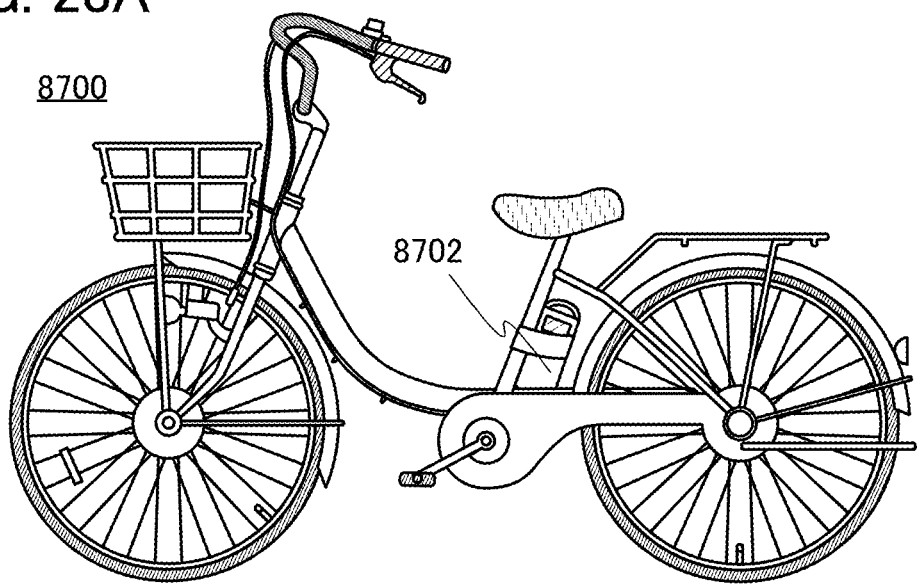
FIG. 28A is a diagram illustrating an electric device of one embodiment of the present invention.

FIG. 28A shows an example of an electric bicycle using the power storage system of one embodiment of the present invention. The power storage system of one embodiment of the present invention can be used for an electric bicycle 8700 illustrated in FIG. 28A. The power storage system of one embodiment of the present invention includes a plurality of storage batteries, a protection circuit, and a neural network, for example.

Figure 28B:
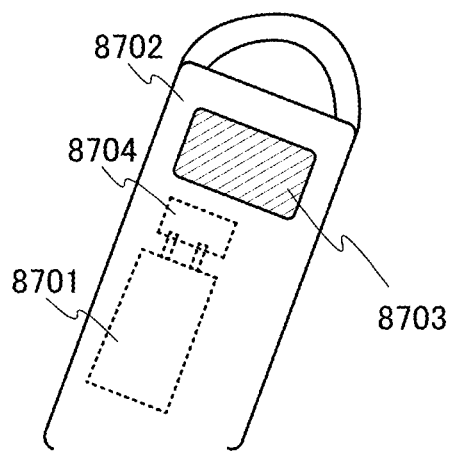
FIG. 28B is a diagram illustrating the electric device of one embodiment of the present invention.

The electric bicycle 8700 includes a power storage system 8702. The power storage system 8702 can supply electricity to a motor that assists a rider. The power storage system 8702 is portable, and FIG. 28B illustrates the state where the power storage system 8702 is detached from the bicycle. A plurality of storage batteries 8701 included in the power storage system of one embodiment of the present invention are incorporated in the power storage system 8702, and the remaining battery capacity and the like can be displayed on a display portion 8703. The power storage system 8702 also includes a control circuit 8704 of one embodiment of the present invention. The control circuit 8704 is electrically connected to a positive electrode and a negative electrode of the storage battery 8701. The battery control circuit described in the above embodiment can be used as the control circuit 8704.

This embodiment can be combined with any of the other embodiments as appropriate.

Embodiment 7

This embodiment describes an example of a system including the battery control circuit of one embodiment of the present invention.

Figure 29A:
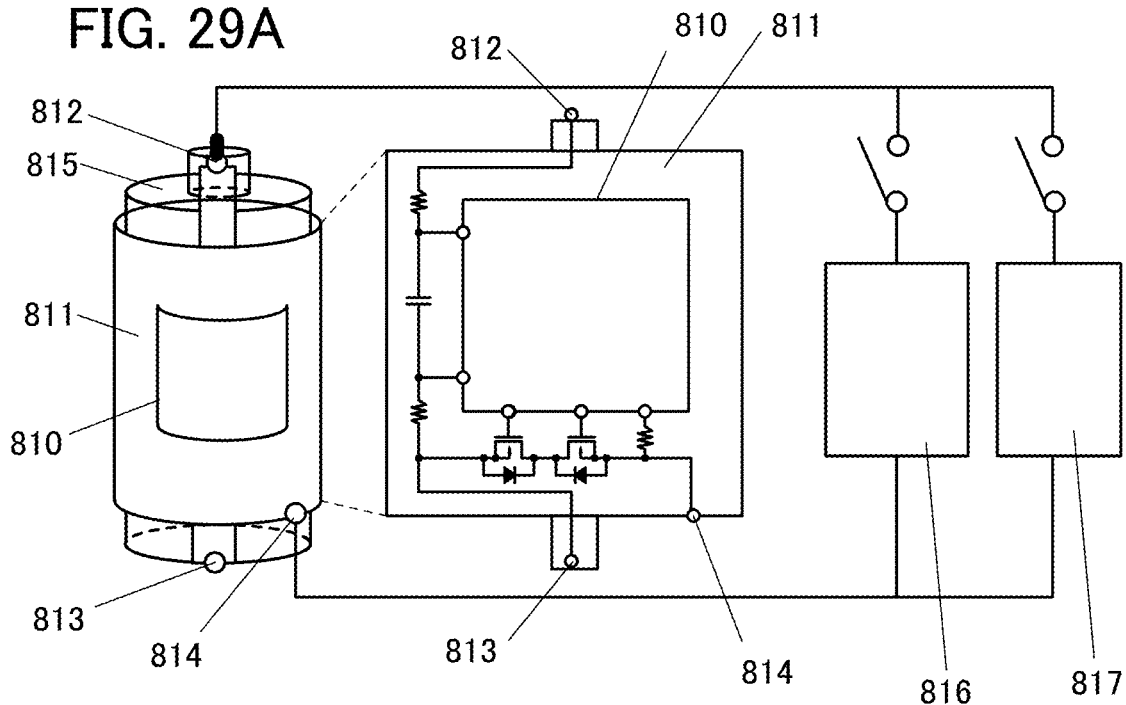
FIG. 29A is an example of a system of one embodiment of the present invention.

FIG. 29A is a conceptual diagram of a battery control system in which a semiconductor device 810 formed over a flexible substrate 811 that is a flexible film is mounted on a cylindrical secondary battery 815.

As the semiconductor device 810, the semiconductor device described in the foregoing embodiment can be used, for example. Alternatively, the semiconductor device 810 may include some components of the semiconductor device described in the foregoing embodiment, for example, the components provided in the layer 585.

The battery control system of one embodiment of the present invention includes at least the cylindrical secondary battery 815, the semiconductor device 810, and a switch.

The cylindrical secondary battery 815 includes a first terminal 812 on the top surface and a second terminal 813 on the bottom surface. A first transmission path which is connected to the first terminal 812 of the cylindrical secondary battery and through which electric power output from the cylindrical secondary battery 815 is transmitted is electrically connected to a terminal of the charge control circuit through an electrode 818. A second transmission path connected to the second terminal 813 of the cylindrical secondary battery is connected through an electrode 819 to a switch that interrupts the second transmission path.

In FIG. 29A, two switches for interrupting the second transmission path (also referred to as interrupter switches) are provided, diodes are connected to the respective switches, and they function as a protection circuit for preventing overdischarge, overcharge, or overcurrent. The switch controls conducting and interrupting operations and can also be referred to as a switching means that switches between supply and interrupt. A third terminal 814 that is the other terminal of the second transmission path and formed over the flexible substrate 811 is connected to a charger 816 and a mobile device 817.

As a manufacturing method for forming the semiconductor device 810 over the flexible substrate 811, a method in which the semiconductor device is formed on a semiconductor substrate, and then separated by a separation method and fixed onto the flexible substrate 811 is employed. A known technique can be used in the separation method. Alternatively, a method in which the semiconductor device is formed on a semiconductor substrate, a rear surface is polished, and then the semiconductor device is fixed onto the flexible substrate 811 may be employed. Alternatively, a method in which the semiconductor device is subjected to what is called laser cutting, by which the semiconductor device is partly cut with laser light, and then is fixed onto the flexible substrate 811 may be employed. Alternatively, a method in which the semiconductor device 810 is directly formed over the flexible substrate 811 may be employed. Alternatively, a method in which the semiconductor device 810 formed over a glass substrate is separated by a separation method and then fixed onto the flexible substrate 811 is used.

Although this embodiment shows the example where these diodes and switches are also formed over or mounted on the flexible substrate 811, the structure is not particularly limited thereto.

In the case where the semiconductor device 810 detects an abnormality such as a micro-short circuit, the second transmission path can be interrupted by input of a signal to a gate of the switch for interrupting the second transmission path. By interrupting the second transmission path, the supply of a current from the charger 816 or the supply of a current to the mobile device 817 can be stopped. Furthermore, when a signal voltage applied to the gate of the switch for interrupting the second transmission path is held in a memory circuit (including a transistor using an oxide semiconductor), interrupt can be maintained for a long time. Thus, a highly safe charge control system can be achieved.

Figure 29B:
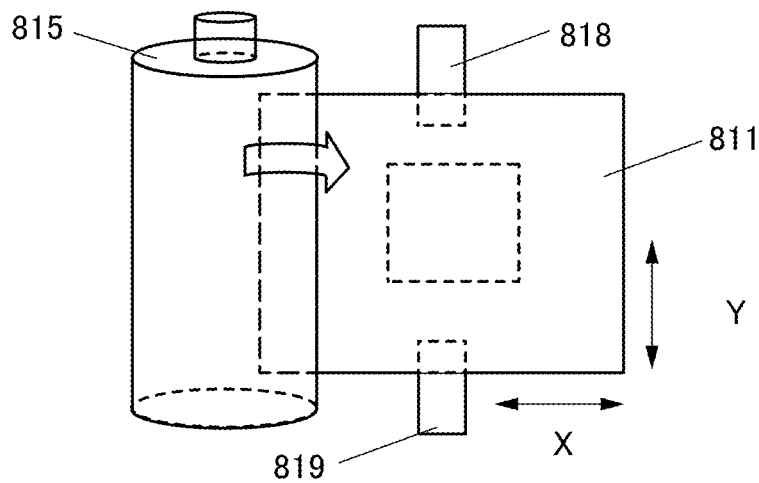
FIG. 29B and FIG. 29C are diagrams illustrating a secondary battery and a substrate.
Figure 29C:
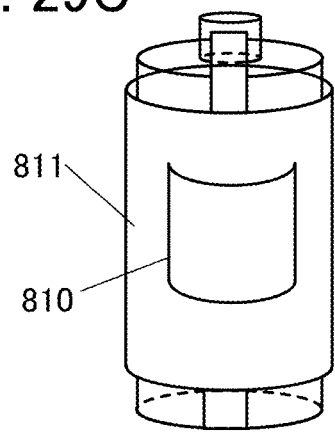

FIG. 29B is a diagram illustrating a step right before bonding of the cylindrical secondary battery 815 and the flexible substrate 811 and illustrates the contact surface side of the flexible substrate 811. As illustrated in FIG. 29B, the body of the cylindrical secondary battery 815 is put and rolled on the contact surface of the flexible substrate 811, so that the flexible substrate 811 winds around and attaches to the body in the circumference direction. The electrode 818 and the electrode 819 are disposed in the Y direction over the flexible substrate 811; however, without particular limitation, one of them may be displaced in the X direction. Note that FIG. 29C is a diagram illustrating the state after rolling.

An exterior film is equipped to cover an outer peripheral surface of the body of the cylindrical secondary battery 815. This exterior film is used to protect a metal can that seals the internal structure of the secondary battery and keep the insulation from the metal can.

In the case where an exterior film is not used and the outer surface (excluding the terminal portion) of the cylindrical secondary battery 815 is a metal surface, it is preferable to provide an insulating sheet between the metal surface and each of the electrode 818 and the electrode 819. The electrode 818 or the electrode 819 is conductive metal foil, a conductive tape formed of a conductive material, or a lead wire and is connected to the terminals of the cylindrical secondary battery 815 by a known method such as soldering or a wire bonding method. Furthermore, the electrode 818 or the electrode 819 is connected to the terminals of the charge control circuit by soldering or a wire bonding method.

In the case where electric power is supplied from the cylindrical secondary battery 815 to the mobile device 817 as illustrated in FIG. 29A, the cylindrical secondary battery 815 enters a discharging state. The semiconductor device 810 monitors the behavior of a voltage, a current, and the like of the first terminal 812 and the second terminal 813 and, when detecting an abnormality, interrupts the second transmission path to stop discharging.

The mobile device 817 refers to the structure except the secondary battery, and the power source for the mobile device 817 is the cylindrical secondary battery 815. Note that the mobile device 817 is a portable electronic device that can be carried around.

In the case where the cylindrical secondary battery 815 is charged with electric power supplied from the charger 816, the cylindrical secondary battery 815 enters a charging state. The semiconductor device 810 monitors the behavior of a voltage, a current, and the like of the first terminal 812 and the second terminal 813 and, when detecting an abnormality, interrupts the second transmission path to stop charging.

The charger 816 refers to a device including an adaptor connected to an external power source and a device that performs power transmission using a wireless signal. Note that the charger 816 is sometimes incorporated into the mobile device 817.

FIG. 29 illustrates the example of a cylindrical secondary battery; as a different example, FIG. 30 illustrates an example where a semiconductor device 964 formed over a flexible substrate 910 that is a flexible film is mounted on a flat secondary battery 963.

The semiconductor device 964 is formed over or fixed to the flexible substrate 910. The semiconductor device 964 detects an abnormality such as a micro-short circuit. Furthermore, the semiconductor device 964 may have a function of a protection circuit for protecting the secondary battery 963 from overcharge, overdischarge, and overcurrent.

As the semiconductor device 964, the semiconductor device described in the foregoing embodiment can be used, for example. Alternatively, the semiconductor device 810 may include some components of the semiconductor device described in the foregoing embodiment, for example, the components provided in the layer 585.

An antenna, a receiver circuit, and a rectifier circuit may be provided in addition to the semiconductor device 964. Contactless charging of the secondary battery 963 can also be performed using the antenna. The shape of the antenna is not limited to a coil shape and may be a linear shape or a plate shape, for example. An antenna such as a planar antenna, an aperture antenna, a traveling-wave antenna, an EH antenna, a magnetic-field antenna, or a dielectric antenna may be used. The antenna has a function of communicating data with an external device, for example. As a system for communication using the antenna between a battery pack and another device, a response method that can be used between the battery pack and another device, such as NFC, can be employed.

Figure 30A:
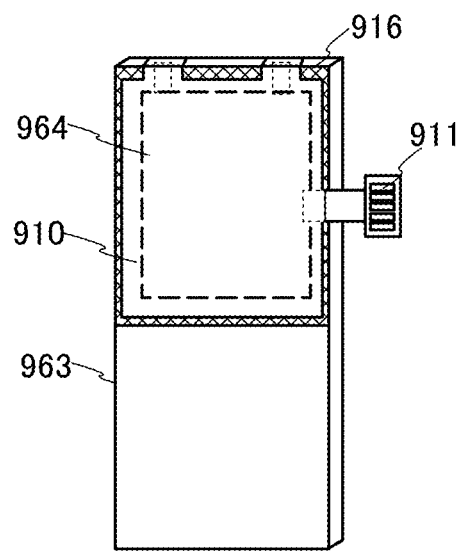
FIG. 30A and FIG. 30B are a mounting example of a semiconductor device of embodiments of the present invention.
Figure 30B:
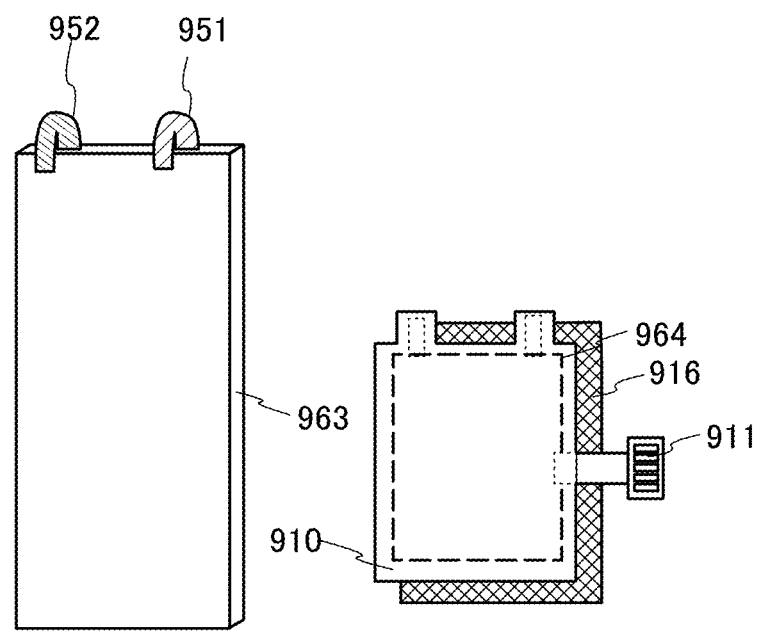

As illustrated in FIG. 30B, a connection terminal 911 is electrically connected to a terminal 951 and a terminal 952 of the secondary battery 963 through the semiconductor device 964. Note that a plurality of connection terminals 911 serving as a control signal input terminal, a power supply terminal, and the like may be provided.

The battery pack includes an insulating sheet layer 916 between the semiconductor device 964 and the secondary battery 963. The insulating sheet layer 916 has a function of preventing a short circuit due to the secondary battery 963, for example. As the insulating sheet layer 916, an organic resin film or an adhesive sheet can be used, for example.

FIG. 30A illustrates an example in which the insulating sheet layer 916 is provided on a surface of a housing and the flexible substrate is fixed with a surface provided with the semiconductor device 964 positioned on the inner side; however, without particular limitation, the surface provided with the charge control circuit may be positioned on the outer side and be connected to the terminal 951 and the terminal 952. However, the connection portion is exposed in such a case, and thus assembly should be performed carefully in consideration of a risk of electrostatic breakdown or a short circuit.

The example of providing the semiconductor device 964 over the flexible substrate is described above; however, without particular limitation, a protection circuit, an interrupter switch, an antenna, a sensor, and the like may be provided over the same substrate. The semiconductor device 964 is formed over the flexible substrate, is bendable, and can detect an abnormality such as a micro-short circuit of a secondary battery. Moreover, the semiconductor device of one embodiment of the present invention can be provided on a side surface of a secondary battery, and thus can achieve space saving and a reduction in the number of components.

Figure 31:
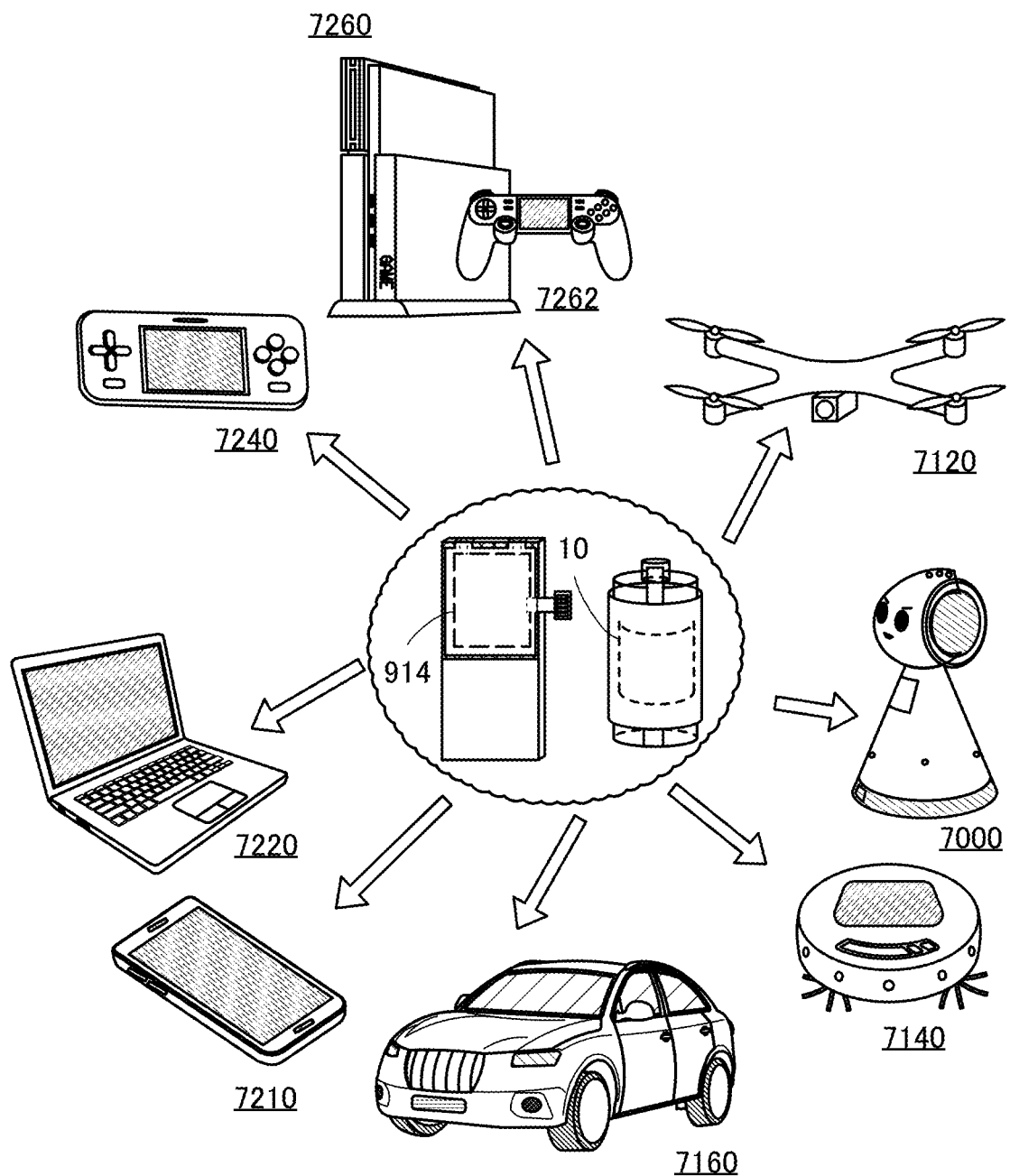
FIG. 31 is examples of electronic devices of one embodiment of the present inventions.

Examples of electronic devices each including the battery control circuit of one embodiment of the present invention is described with reference to FIG. 31.

A cleaning robot 7000 includes a secondary battery, a display provided on the top surface, a plurality of cameras provided on the side surface, a brush, an operation button, various kinds of sensors, and the like. Although not illustrated, the cleaning robot 7000 is provided with a tire, an inlet, and the like. The cleaning robot 7000 can run autonomously, detect dust, and vacuum the dust through the inlet provided on the bottom surface. The use of the semiconductor device including the battery control circuit of one embodiment of the present invention, which is electrically connected to a secondary battery of the cleaning robot 7000, allows a reduction in the number of components and detection of an abnormality, such as a micro-short circuit, of the secondary battery.

The cleaning robot 7000 includes a secondary battery, an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The semiconductor device including the battery control circuit of one embodiment of the present invention is used for the secondary battery of the cleaning robot 7000; thus, control, protection, and the like of the secondary battery are possible.

The microphone has a function of detecting acoustic signals of a speaking voice of a user, an environmental sound, and the like. The speaker has a function of outputting audio signals such as a voice and a warning beep. The cleaning robot 7000 can analyze an audio signal input via the microphone and output a necessary audio signal from the speaker. The cleaning robot 7000 can communicate with the user with the use of the microphone and the speaker.

The camera has a function of taking images of the surroundings of the cleaning robot 7000. The cleaning robot 7000 has a function of moving with use of the moving mechanism. The cleaning robot 7000 can take images of the surroundings with use of the camera and analyze the images to sense whether there is an obstacle in the way of the movement.

A flying object 7120 includes propellers, a camera, a secondary battery, and the like and has a function of flying autonomously.

The semiconductor device including the battery control circuit of one embodiment of the present invention is used for the secondary battery of the flying object 7120; thus, control, protection, and the like of the secondary battery as well as a reduction in weight are possible.

An electric vehicle 7160 is shown as an example of a moving object. The electric vehicle 7160 includes a secondary battery, tires, a brake, a steering gear, a camera, and the like. The use of the semiconductor device including the battery control circuit of one embodiment of the present invention, which is connected to the secondary battery of the electric vehicle 7160, allows a reduction in the number of components and detection of an abnormality, such as a micro-short circuit, of the secondary battery.

Note that although an electric vehicle is described above as an example of a moving object, the moving object is not limited to an electric vehicle. Examples of the moving object include a train, a monorail train, a ship, and a flying object (a helicopter, an unmanned aircraft (a drone), an airplane, and a rocket). The use of the semiconductor device including the battery control circuit of one embodiment of the present invention, which is electrically connected to secondary batteries of these moving objects, allows a reduction in the number of components and detection of an abnormality, such as a micro-short circuit, of the secondary batteries.

A cylindrical secondary battery provided with the semiconductor device 810 and/or a battery pack provided with the semiconductor device 964 can be incorporated in a smartphone 7210, a PC 7220 (personal computer), a game machine 7240, and the like. Note that the semiconductor device 810 attached to a cylindrical secondary battery corresponds to the semiconductor device 810 illustrated in FIG. 29. The semiconductor device 964 attached to a battery pack corresponds to the semiconductor device 964 illustrated in FIG. 30.

The smartphone 7210 is an example of a portable information terminal. The smartphone 7210 includes a microphone, a camera, a speaker, various kinds of sensors, and a display portion. These peripheral devices are controlled by the semiconductor device including the battery control circuit. The use of the semiconductor device including the battery control circuit of one embodiment of the present invention, which is electrically connected to the secondary battery of the smartphone 7210, can reduce the number of components, control and protect the secondary battery, and increase the safety.

The PC 7220 is an example of a laptop PC. The use of the semiconductor device including the battery control circuit of one embodiment of the present invention, which is electrically connected to the secondary battery of the laptop PC, can reduce the number of components, control and protect the secondary battery, and increase the safety.

The game machine 7240 is an example of a portable game machine. A game machine 7260 is an example of a home-use stationary game machine. To the game machine 7260, a controller 7262 is connected with or without a wire. The use of the semiconductor device including the battery control circuit of one embodiment of the present invention in the controller 7262 can reduce the number of components, control and protect the secondary battery, and increase the safety.

This embodiment can be implemented in an appropriate combination with the structures described in the other embodiments and the like.

Embodiment 8

Embodiment 7 describes the example where a semiconductor device formed over a flexible substrate that is a flexible film is mounted on a cylindrical secondary battery; as another example, this embodiment describes an example where a semiconductor device and a battery layer are stacked inside an exterior body. Note that in FIG. 32, the components that are the same as those in FIG. 26 are described using the same reference numerals.

Figure 32:
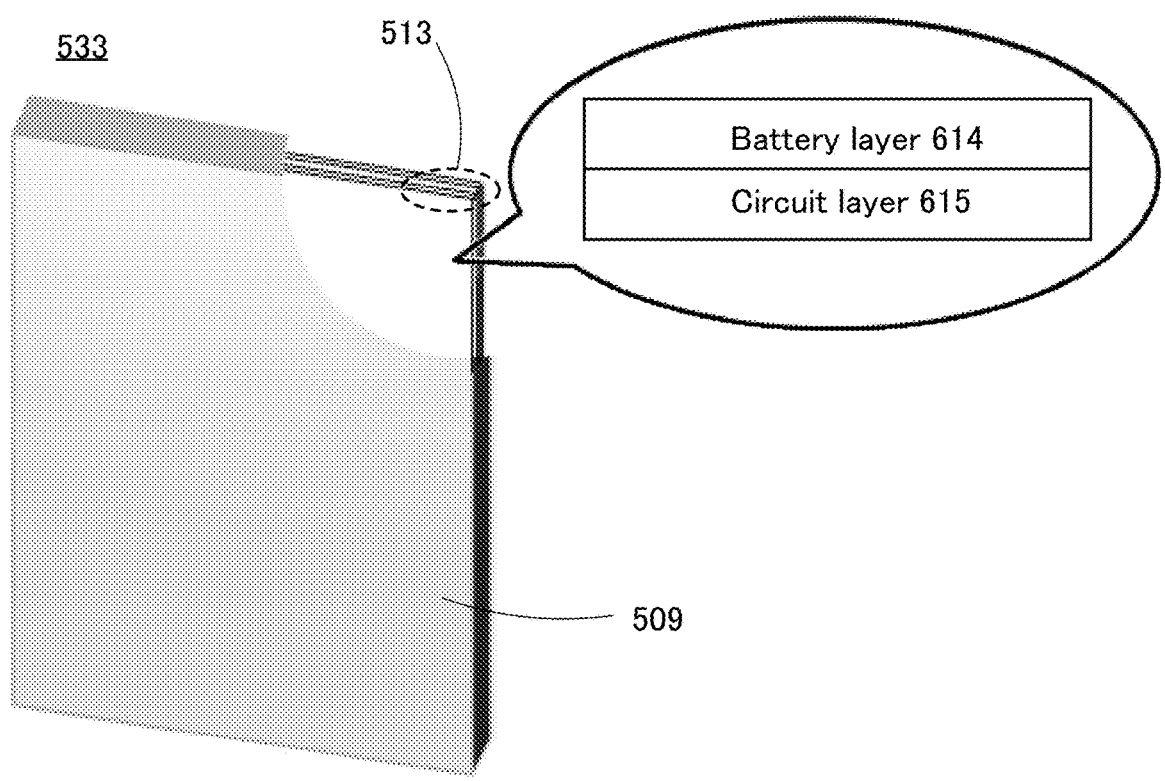
FIG. 32 is a perspective view illustrating one embodiment of the present invention.

As illustrated in FIG. 32, the secondary battery 513 is sealed in the secondary battery pack 533 using a rectangular exterior body. The label 509 is attached to the rectangular exterior body.

A plurality of battery layers 614 are stacked, one of the battery layers 614 is stacked with a circuit layer 615, and they are collectively sealed in the exterior body. An electrolyte solution may be sealed in the rectangular exterior body, or a polymer gel electrolyte may be used.

The circuit layer 615 includes a battery control circuit, a battery protection circuit, and the like, and these circuits are configured with OS transistors and the like and have a small thickness; hence, the circuit layer 615 can be stacked with the battery layer 614. For example, when the circuit layer 615 detects an abnormality of the battery layer 614, supply of current to each layer can be separately interrupted. Consequently, even if an abnormality (e.g., a short circuit) is caused in one layer, only the one layer can be disconnected and the other layers can be continuously used.

The battery layer 614 refers to a stack including at least one or more selected from a positive electrode, a separator, a solid electrolyte, and a negative electrode. Note that a positive electrode or a negative electrode is a component made by forming an active material on a current collector.

When a solid electrolyte is used in the battery layer 614, a separator and a spacer do not need to be provided. Furthermore, the battery can be entirely solidified; therefore, there is no possibility of liquid leakage and thus the safety of the battery is dramatically increased.

The secondary battery pack 533 illustrated in FIG. 32 incorporates an OS transistor battery control circuit with a low off-state current, a battery protection circuit, and the like and thus enables anomaly detection such as micro-short circuit detection. The circuit layer 615 includes the battery control circuit, the battery protection circuit, and the like, and these circuits are configured with OS transistors and the like and have a small thickness and a light weight; hence, the design quality of the battery unit can be improved and the size of the peripheral circuits can be reduced.

Since the secondary battery pack 533 illustrated in FIG. 32 incorporates the protection circuit and the like, the need for a printed circuit board for the protection circuit can be eliminated.

This embodiment can be freely combined with the other embodiments.

Example 1

In this example, characteristics of the amplifier circuit of one embodiment of the present invention were evaluated.

Fabricated were 24 amplifier circuits each employing the configuration of the amplifier circuit 80 illustrated in FIG. 3 and their characteristics were evaluated. As a transistor included in the amplifier circuit, a transistor including an oxide containing indium, gallium, and zinc in a channel formation region and having a channel length of approximately 360 nm was used. The configuration of the amplifier circuit 11 illustrated in FIG. 2A was used for each of the amplifier circuits 11a, 11b, and 11c included in the amplifier circuit 80.

In the evaluation of the characteristics, 1.25 V was applied to the terminal VREF1 and the terminal VREF2, 2.5 V was applied to the terminal VBCS, −1 V was applied to the terminal VBG, 2.5 V was applied to the terminal VDD, and 0 V was applied to the terminal VSS. A voltage at which the bias current value of the transistor 34 becomes 100 nA was applied to the terminal BIAS1. High potential signals and low potential signals applied to the terminal SET1, the terminal SET2, and the terminal SETB2 were set to 4.5 V and 0.0 V, respectively.

As an input to the amplifier circuit 80, 1 V was applied to the terminal INP1. A voltage swept in the range of 0.0 V to 2.0 V was applied to the terminal INM1, and the voltage of the terminal INM1 when the terminal 53 reached a reference voltage of 1.5 V was examined in each of the 24 amplifier circuits.

As for the voltage of the terminal INM1 when the terminal 53 reached 1.5 V while the voltage applied to the terminal INM1 was swept from 0 V to 2.0 V, an average value was 1.501 V, a standard deviation was 0.000449 V, and a difference between the maximum value and the minimum value was 0.00807 V.

As for the voltage of the terminal INM1 when the terminal 53 reached 1.5 V while the voltage applied to the terminal INM1 was swept from 2.0 V to 0 V, an average value was 1.500 V, a standard deviation was 0.000418 V, and a difference between the maximum value and the minimum value was 0.00901 V.

In the amplifier circuit 80 illustrated in FIG. 3, an initialization potential is applied via the terminal VREF1 or the terminal VREF2. Next, an amplifier circuit having a configuration in which an initialization potential is not applied was evaluated. Specifically, 25 amplifier circuits each employing the configuration of the amplifier circuit 80z illustrated in FIG. 17A were fabricated and their characteristics were evaluated. In this example, evaluation was performed using a configuration in which 14 stages of the amplifier circuits 11x were connected and then the amplifier circuit 11y was connected thereto.

A voltage at which the bias current value of the amplifier circuit 11x becomes 100 nA was applied to the terminal BIAS1. In addition, 3.3 V was applied to the terminal VDD, 1 V was applied to the terminal VBG, 0 V was applied to the terminal VSS, and 0 V was applied to the terminal EN.

As an input to the amplifier circuit 80z, 1.5 V was applied to the terminal INPz, a voltage swept in the range of 0.0 V to 3.0 V was applied to the terminal INMz, and the voltage of the terminal INMz when the potential of the output terminal 53z reached a reference voltage of 1.5 V was examined in each of the 25 amplifier circuits.

As for the voltage of the terminal INMz when the terminal 53z reached 1.5 V while the voltage applied to the terminal INMz was swept from 0 V to 3.0 V, an average value was 1.513 V, a standard deviation was 0.004976 V, and a difference between the maximum value and the minimum value was 0.15304 V.

As for the voltage of the terminal INMz when the terminal 53z reached 1.5 V while the voltage applied to the terminal INMz was swept from 3.0 V to 0 V, an average value was 1.512 V, a standard deviation was 0.004994 V, and a difference between the maximum value and the minimum value was 0.154 V.

The application of an initialization potential was able to reduce variations in the output value of the amplifier circuit.

REFERENCE NUMERALS

BIAS1: terminal, C11: capacitor, IN2: terminal, INM1: terminal, INP1: terminal, M1: transistor, M2: transistor, M3: transistor, N11: node, N12: node, N13: node, ND1: node, ND2: node, ND3: node, ND4: node, ND5: node, ND6: node, ND7: node, ND8: node, R1: pull-up resistor, SET1: terminal, SET2: terminal, SETB1: terminal, SETB2: terminal, VB1_IN: wiring, VB2_IN: wiring, VC1: terminal, VREF1: terminal, VREF2: terminal, X1: inverter, 11: amplifier circuit, 11a: amplifier circuit, 11b: amplifier circuit, 11c: amplifier circuit, 11x: amplifier circuit, 11y: amplifier circuit, 12: disconnecting switch, 13: charging detection circuit, 15: circuit, 21: terminal, 21a: terminal, 21b: terminal, 21c: terminal, 21z: input terminal, 22: terminal, 22a: terminal, 22b: terminal, 22c: terminal, 22z: input terminal, 23a: transistor, 23b: transistor, 23c: transistor, 24a: transistor, 24b: transistor, 24c: transistor, 30a: circuit, 30b: circuit, 30c: circuit, 31: transistor, 31_1: transistor, 312: transistor, 32: transistor, 32_1: transistor, 322: transistor, 32b: conductor, 34: transistor, 34_1: transistor, 34_2: transistor, 41: capacitor, 42: capacitor, 45: transistor, 51: terminal, 51a: terminal, 51b: terminal, 51c: terminal, 51w: input terminal, 51z: output terminal, 52: terminal, 52a: terminal, 52b: terminal, 52c: terminal, 52w: input terminal, 52z: output terminal, 53: terminal, 53z: output terminal, 61: capacitor, 65a: capacitor, 65b: capacitor, 66a: capacitor, 66b: capacitor, 68: circuit, 69: circuit, 70: semiconductor device, 71: amplifier circuit, 72: transistor, 73: transistor, 74: transistor, 75: transistor, 76a: transistor, 76b: transistor, 76c: transistor, 76d: transistor, 77: transistor, 78: transistor, 79: transistor, 80: amplifier circuit, 80z: amplifier circuit, 81: transistor, 82: transistor, 83: transistor, 83a: transistor, 83a1: transistor, 83a_2: transistor, 83b: transistor, 83b1: transistor, 83b_2: transistor, 84: transistor, 84a: transistor, 84b: transistor, 87a: capacitor, 87b: capacitor, 89: resistor, 90: selection circuit, 91: transistor, 92: transistor, 93: transistor, 94: transistor, 99: control circuit, 100: power storage system, 114: memory element, 121: secondary battery, 140: transistor, 150: transistor, 161: capacitor, 162: transistor, 211: transistor, 212: transistor, 213: transistor, 214: transistor, 215: transistor, 250: comparator, 300: transistor, 311: substrate, 313: semiconductor region, 314a: low-resistance region, 314b: low-resistance region, 315: insulator, 316: conductor, 317: low-resistance region, 318: rear electrode, 319: region, 320: insulator, 322: insulator, 324: insulator, 326: insulator, 328: conductor, 328b: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 385: layer, 386: conductor, 400: secondary battery, 401: positive electrode cap, 402: battery can, 413: conductive plate, 414: conductive plate, 415: power storage system, 416: wiring, 420: control circuit, 421: wiring, 422: wiring, 423: wiring, 424: conductor, 425: insulator, 426: wiring, 500: transistor, 501: circuit board, 503: conductor, 503a: conductor, 503b: conductor, 505: conductor, 505a: conductor, 505b: conductor, 509: label, 510: insulator, 510A: transistor, 510B: transistor, 510C: transistor, 510D: transistor, 510E: transistor, 510F: transistor, 511: insulator, 512: insulator, 513: secondary battery, 514: insulator, 515: sealant, 516: insulator, 517: antenna, 518: conductor, 519: layer, 520: insulator, 521: insulator, 522: insulator, 523: terminal, 524: insulator, 530: oxide, 530a: oxide, 530b: oxide, 530c: oxide, 531: region, 531a: region, 531b: region, 533: secondary battery pack, 540a: conductor, 540b: conductor, 542: conductor, 542a: conductor, 542b: conductor, 543: region, 543a: region, 543b: region, 544: insulator, 545: insulator, 546: conductor, 546a: conductor, 546b: conductor, 547: conductor, 547a: conductor, 547b: conductor, 548: conductor, 550: insulator, 551: one of positive electrode lead and negative electrode lead, 552: metal oxide, 553: other of positive electrode lead and negative electrode lead, 560: conductor, 560a: conductor, 560b: conductor, 570: insulator, 571: insulator, 573: insulator, 574: insulator, 575: insulator, 576: insulator, 576a: insulator, 576b: insulator, 580: insulator, 581: insulator, 582: insulator, 584: insulator, 585: layer, 586: insulator, 590: control circuit, 590a: circuit system, 590b: circuit system, 600: capacitor, 601: positive electrode cap, 602: battery can, 603: positive electrode terminal, 604: positive electrode, 605: separator, 606: negative electrode, 607: negative electrode terminal, 608: insulating plate, 609: insulating plate, 610: conductor, 611: PTC element, 612: conductor, 613: safety valve mechanism, 614: battery layer, 615: circuit layer, 616: gasket, 620: conductor, 630: insulator, 650: insulator, 692: conductor, 693: insulator, 700: electronic component, 701: lead, 702: printed circuit board, 703: circuit portion, 704: circuit board, 810: semiconductor device, 811: flexible substrate, 812: terminal, 813: terminal, 814: terminal, 815: cylindrical secondary battery, 816: charger, 817: mobile device, 818: electrode, 819: electrode, 900a: region, 900b: region, 900c: region, 900d: region, 910: flexible substrate, 911: connection terminal, 914: antenna, 916: insulating sheet layer, 951: terminal, 952: terminal, 963: secondary battery, 964: semiconductor device, 7000: cleaning robot, 7120: flying object, 7160: electric vehicle, 7210: smartphone, 7220: PC, 7240: game machine, 7260: game machine, 7262: controller, 8021: charging device, 8022: cable, 8024: power storage system, 8400: automobile, 8401: headlight, 8406: electric motor, 8500: automobile, 8600: scooter, 8601: side mirror, 8602: power storage system, 8603: indicator light, 8604: under-seat storage unit, 8700: electric bicycle, 8701: storage battery, 8702: power storage system, 8703: display portion, 8704: control circuit

The invention claimed is:

1. A method for operating a semiconductor device comprising a first output terminal, a second output terminal, a first transistor, a second transistor, a third transistor, a fourth transistor, a fifth transistor, and a capacitor,
    wherein the first transistor comprises a back gate,
    wherein one of a source and a drain of the first transistor is electrically connected to one of a source and a drain of the second transistor and one of a source and a drain of the third transistor,
    wherein the other of the source and the drain of the third transistor is electrically connected to the first output terminal, and
    wherein the other of the source and the drain of the second transistor is electrically connected to the second output terminal,
    wherein one of a source and a drain of the fourth transistor is electrically connected to the first output terminal,
    wherein one of a source and a drain of the fifth transistor is electrically connected to a gate of the fourth transistor,
    wherein one electrode of the capacitor is electrically connected to the gate of the fourth transistor, and the other electrode is electrically connected to the first output terminal, and
    wherein the semiconductor device is configured to output a comparison result of a signal supplied to a gate of the second transistor and a signal supplied to a gate of the third transistor, from the first output terminal and the second output terminal,
    the operating method comprising:
        a first step of applying a first potential to the back gate; and
        a second step of applying a second potential to the back gate,
    wherein the potential output from the first output terminal in the first step is lower than the potential output from the first output terminal in the second step, and
    wherein the fifth transistor is in an off state in the first step and the second step.

2. The method for operating a semiconductor device, according to claim 1,
    wherein the first transistor comprises an oxide semiconductor in a channel formation region.

3. The method for operating a semiconductor device, according to claim 1,
    wherein a current flowing between the source and the drain of the first transistor is lower in the second step than in the first step.

4. The method for operating a semiconductor device, according to claim 1,
    wherein a low potential signal is supplied to the other of the source and the drain of the first transistor, and
    wherein high potential signals are supplied to the other of the source and the drain of the fourth transistor and the other of the source and the drain of the fifth transistor.

5. A semiconductor device comprising a first input terminal, a second input terminal, a first output terminal, a second output terminal, a first transistor, a second transistor, a third transistor, a fourth transistor, a fifth transistor, a capacitor, and a selection circuit,
    wherein the first transistor comprises a back gate,
    wherein the selection circuit is configured to select one potential from two or more potentials and apply the potential to the back gate, wherein a gate of the second transistor is electrically connected to the first input terminal, wherein a gate of the third transistor is electrically connected to the second input terminal, wherein one of a source and a drain of the first transistor is electrically connected to one of a source and a drain of the second transistor and one of a source and a drain of the third transistor, wherein one of a source and a drain of the fourth transistor is electrically connected to the first output terminal, wherein one of a source and a drain of the fifth transistor is electrically connected to a gate of the fourth transistor, and wherein one electrode of the capacitor is electrically connected to the gate of the fourth transistor, and the other electrode is electrically connected to the first output terminal, wherein the other of the source and the drain of the third transistor is electrically connected to the first output terminal, wherein the other of the source and the drain of the second transistor is electrically connected to the second output terminal, wherein the first transistor comprises an oxide semiconductor in a channel formation region, wherein the semiconductor device is configured to output a comparison result of a signal supplied to the first input terminal and a signal supplied to the second input terminal, from the first output terminal and the second output terminal; and wherein the semiconductor device is configured to lower the potential output from the first output terminal by lowering a potential applied from the selection circuit to the back gate.

* * * * *